(12) United States Patent
Ishikawa et al.

(10) Patent No.: US 7,388,926 B2
(45) Date of Patent: Jun. 17, 2008

(54) QUADRATURE MODULATION SYSTEM

(75) Inventors: Hiroyoshi Ishikawa, Kawasaki (JP);
Kazuo Nagatani, Kawasaki (JP);
Nobukazu Fudaba, Kawasaki (JP);
Hajime Hamada, Kawasaki (JP);
Tokuro Kubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 668 days.

(21) Appl. No.: 10/945,316

(22) Filed: Sep. 20, 2004

(65) Prior Publication Data

US 2005/0238114 A1 Oct. 27, 2005

(30) Foreign Application Priority Data

Apr. 21, 2004 (JP) ............... 2004-125849

(51) Int. Cl.
*H04B 15/00* (2006.01)
*H04L 25/49* (2006.01)
(52) U.S. Cl. ..................... 375/285; 375/296
(58) Field of Classification Search ........... 375/295, 375/296, 316, 354, 358, 298, 259–261, 300, 375/302, 268, 271
See application file for complete search history.

(56) References Cited

U.S. PATENT DOCUMENTS

| | | | |
|---|---|---|---|
| 4,717,894 A * | 1/1988 | Edwards et al. ............. | 332/144 |
| 5,293,406 A * | 3/1994 | Suzuki ....................... | 375/295 |
| 6,286,994 B1 * | 9/2001 | Boesel et al. ............... | 374/146 |
| 6,313,703 B1 * | 11/2001 | Wright et al. ............... | 330/149 |
| 2002/0015450 A1 * | 2/2002 | Ratto ........................ | 375/261 |
| 2002/0048326 A1 * | 4/2002 | Sahlman .................... | 375/297 |
| 2004/0082300 A1 * | 4/2004 | Scheck ...................... | 455/126 |

FOREIGN PATENT DOCUMENTS

| | | |
|---|---|---|
| JP | 05-207080 | 8/1993 |
| JP | 06-350658 | 12/1994 |
| JP | 07-123123 | 5/1995 |
| JP | 07-177188 | 7/1995 |
| JP | 08-097873 | 4/1996 |
| JP | 08-116343 | 5/1996 |
| JP | 2000-270037 | 9/2000 |
| JP | 2001-339452 | 12/2001 |
| JP | 2002-027007 | 1/2002 |
| JP | 2002-077285 | 3/2002 |

* cited by examiner

*Primary Examiner*—Mohammad Ghayour
*Assistant Examiner*—Vineeta S Panwalkar
(74) *Attorney, Agent, or Firm*—Katten Muchin Rosenman LLP

(57) ABSTRACT

A disclosed quadrature modulation system inputs an inphase signal component and an orthogonal signal component, and outputs an output signal that is quadrature modulated by a quadrature modulator. The quadrature modulation system calculates a first cumulative total based on the inphase signal component input into the quadrature modulator and an inphase signal component of a feedback signal obtained from the output signal. The quadrature modulation system calculates a second cumulative total based on the orthogonal signal component input into the quadrature modulator and an orthogonal signal component of the feedback signal. Based on the first and the second cumulative totals, a time difference between the inphase signal component and the orthogonal signal component is determined. The inphase signal component and the orthogonal signal component to be provided to the quadrature modulator are adjusted based on the time difference such that the time difference is compensated for.

22 Claims, 36 Drawing Sheets

OUTPUT SPECTRUM

WHEN DELAYING BY 1/8 SYMBOL

WHEN DELAYING BY 5/8 SYMBOL

FIG.14

(A) ALL AVERAGE AMPLITUDE VECTORS IN QUADRANTS ARE EQUAL LENGTH AND ORTHOGONAL

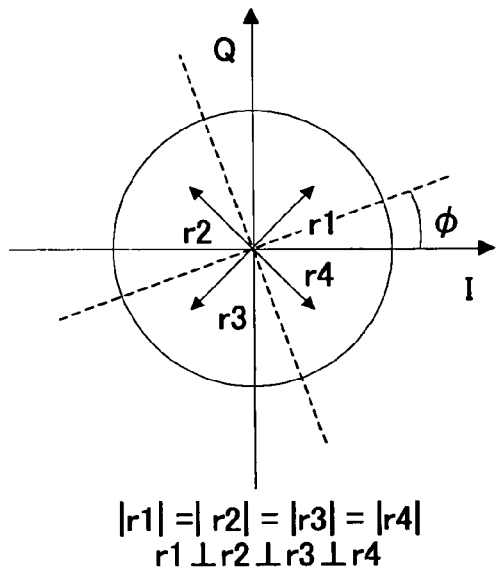

$|r1| = |r2| = |r3| = |r4|$
$r1 \perp r2 \perp r3 \perp r4$

(B) ALL AVERAGE AMPLITUDE VECTORS IN 4 QUADRANTS ARE NOT EQUAL LENGTH NOR ORTHOGONAL

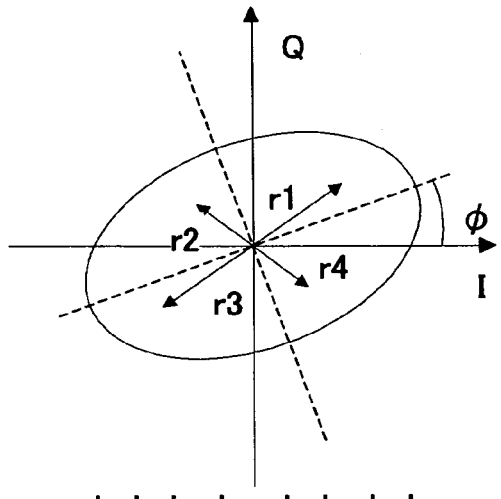

$|r1| = |r3| \neq |r2| = |r4|$

(C) ALL AVERAGE AMPLITUDE VECTORS IN 4 QUADRANTS ARE ORTHOGONAL BUT NOT EQUAL LENGTH

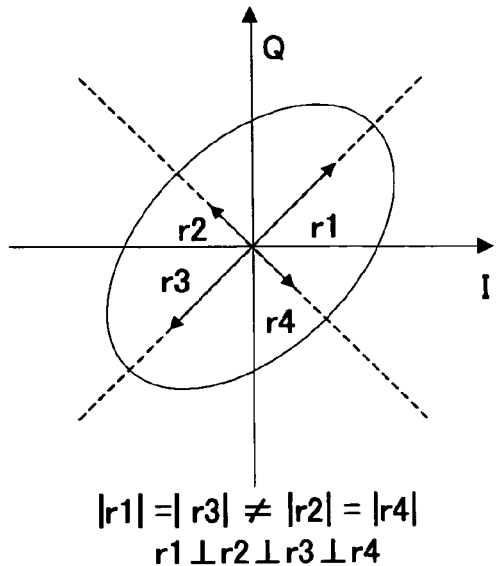

$|r1| = |r3| \neq |r2| = |r4|$
$r1 \perp r2 \perp r3 \perp r4$

(D) ALL AVERAGE AMPLITUDE VECTORS IN 4 QUADRANTS ARE EQUAL LENGTH BUT NOT ORTHOGONAL

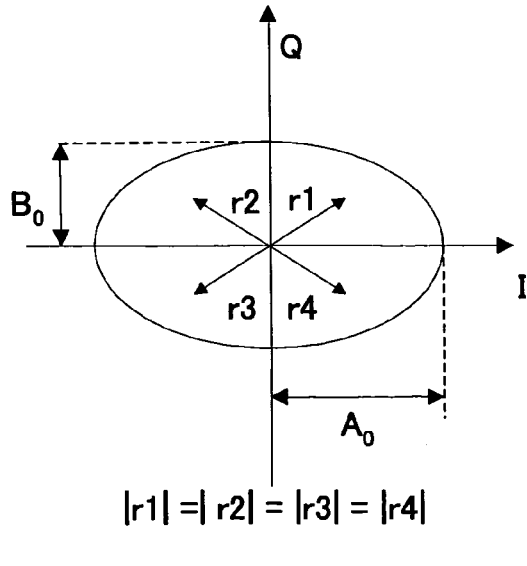

$|r1| = |r2| = |r3| = |r4|$

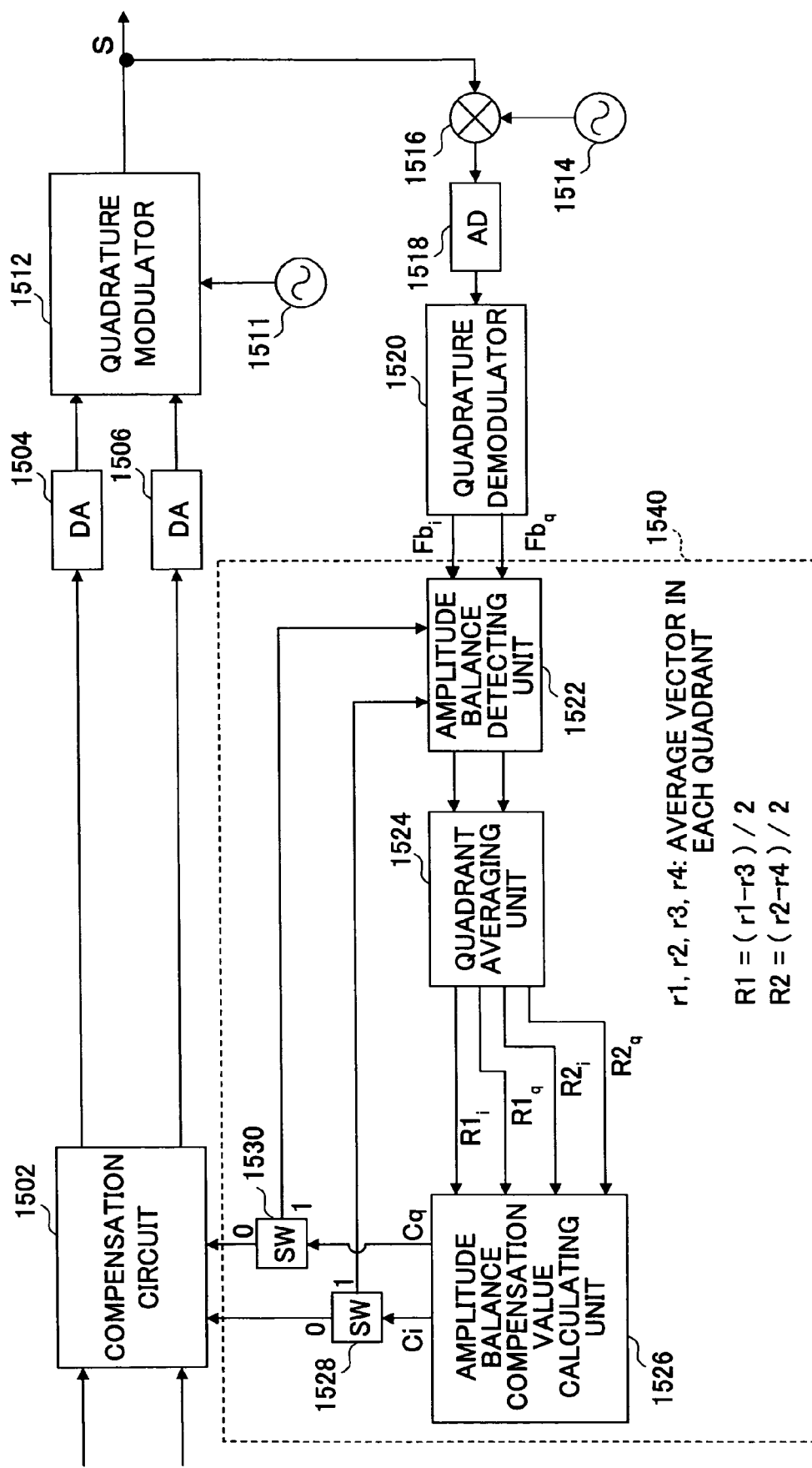

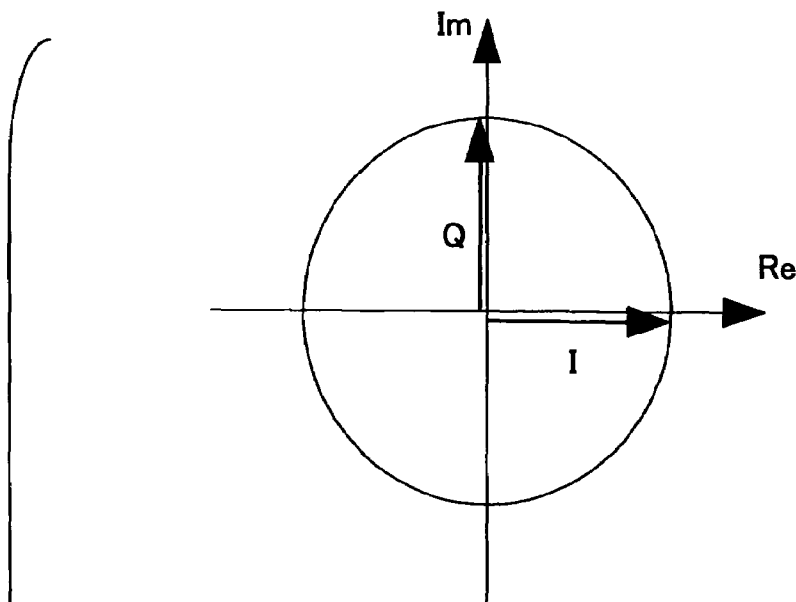
(A) IDEAL QUADRATURE MODULATION OUTPUT
FIG.22
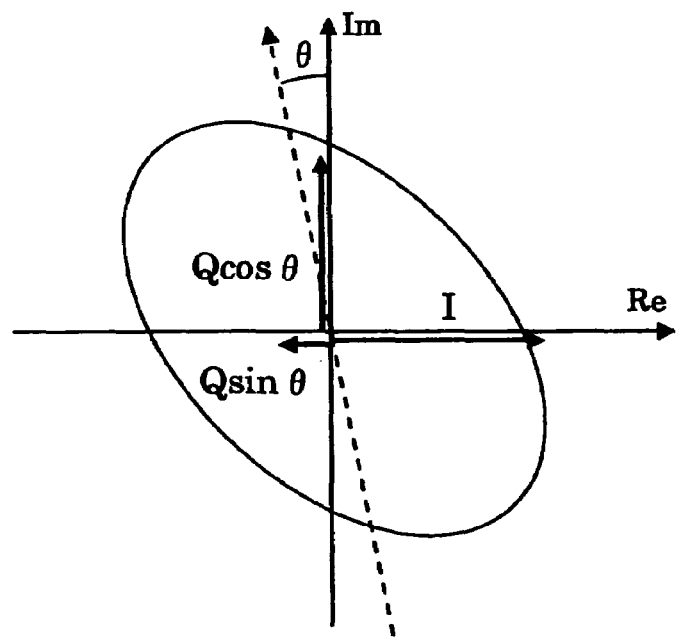
(B) QUADRATURE MODULATION OUTPUT CONTAINING ORTHOGONAL DEFLECTIONS $\theta$ (A) ACCUMULATED VALUE OF IQ PRODUCTS (B) ABSOLUTE VALUE OF ACCUMULATED VALUE OF IQ PRODUCTS

QUADRATURE MODULATION SYSTEM

BACKGROUND OF THE INVENTION

1. Field of the Invention

The present invention generally relates to a technical field of digital radio communications, and especially relates to a quadrature modulation system, and a transmitter equipped with the quadrature modulation system.

2. Description of the Related Art

Radio signals are transmitted using a wide band in a radio communications system like IMT 2000, and the bandwidth will be made even greater in the next-generation mobile communications systems. In order to transmit such signals, it is commonly practiced that a compound baseband signal is converted into a signal of an intermediate-frequency (IF) band, and then converted into a signal of a radio frequency (RF) band. However, in order to sufficiently reduce unwanted RF components originated by the frequency conversion stages, parts such as a band pass filter are required to provide steep and flat properties such that only a desired signal is allowed to pass. As the band is further widened in the future, high-performance parts are required, which tends to increase equipment size and product cost. For this reason, a direct RF modulation technique for directly converting a baseband signal into an RF band attracts attention. Conventional modulation techniques as described above are disclosed by Patent References 1 through 10, for example.

[Patent reference 1] JPA 6-350658
[Patent reference 2] JPA 7-123123
[Patent reference 3] JPA 7-177188
[Patent reference 4] JPA 8-116343
[Patent reference 5] JPA 2000-270037
[Patent reference 6] JPA 2001-339452
[Patent reference 7] JPA 2002-27007
[Patent reference 8] JPA 5-207080
[Patent reference 9] JPA 2002-77285
[Patent reference 10] JPA 8-97873

[Problem(s) to be solved by the Invention]

However, when the direct RF modulation technique is adopted, characteristic differences from part to part, secular change, and the like of analog parts tend to cause errors to arise between an inphase signal component and its orthogonal signal component. Accordingly, when the signal components are input to a quadrature modulator, there is a possibility that an image signal (unnecessary signal) will be generated and output in addition to a desired signal (refer to FIG. 1), causing degradation of the quality of the signal.

SUMMARY OF THE INVENTION

It is a general object of the present invention to provide a quadrature modulation system that substantially obviates one or more of the problems caused by the limitations and disadvantages of the related art.

Features and advantages of the present invention are set forth in the description that follows, and in part will become apparent from the description and the accompanying drawings, or may be learned by practice of the invention according to the teachings provided in the description. Objects as well as other features and advantages of the present invention will be realized and attained by a quadrature modulation system particularly pointed out in the specification in such full, clear, concise, and exact terms as to enable a person having ordinary skill in the art to practice the invention.

[Description of the Invention]

Specifically, the present invention aims at offering a quadrature modulation system that is capable of generating a quadrature modulated analog signal wherein the amount of the image signal component (unnecessary signal component) is reduced as compared with conventional technologies, and a transmitter equipped with the quadrature modulation system.

To achieve these and other advantages and in accordance with the purpose of the invention, as embodied and broadly described herein, the invention provides as follows.

[Means for Solving the Problem]

According to an aspect of the present invention, the quadrature modulation system inputs an inphase signal component and an orthogonal signal component, which are provided to a quadrature modulator for outputting a quadrature modulated signal, a part of the quadrature modulated signal serving as a feedback signal, including:

time difference calculating means for calculating a first cumulative total of calculated results about an inphase signal component of the feedback signal, for calculating a second cumulative total of calculated results about an orthogonal signal component of the feedback signal, and for acquiring a time difference between the inphase signal component and the orthogonal signal component based on the first and the second cumulative totals; and delay adjustment means for adjusting the inphase signal component and the orthogonal signal component that are provided to the quadrature modulator such that the time difference is compensated for.

[Effect of the Invention]

According to the present invention, the amount of the image signal component mixed in the analog signal generated by the quadrature modulation method is reduced.

BRIEF DESCRIPTION OF THE DRAWINGS

FIG. 14 graphs relations between orthogonality of the inphase signal component and the orthogonal signal component, and an average amplitude vector for every quadrant;

FIG. 15 is a block diagram of the quadrature modulation system according to an embodiment of the present invention;

FIG. 22 graphs relations between the inphase signal component and the orthogonal signal component in signal point arrangement plans;

DESCRIPTION OF THE PREFERRED EMBODIMENTS

In the following, embodiments of the present invention are described with reference to the accompanying drawings.

The embodiments include Embodiment 1 through Embodiment 4. In summary, Embodiment 1 is to reduce the image signal component mixed in the generated analog signal by adjusting timing relations between the inphase signal component and the orthogonal signal component. Embodiment 2 is to obtain the same effects by adjusting the amplitudes of the inphase signal component and the orthogonal signal component. Embodiment 3 is to obtain the same effect by adjusting an orthogonality deflection (angular deflection) between the real axis and the imaginary axis. Embodiment 4 is to obtain the same effect by collectively adjusting the timing, amplitude, and angular deflection of the inphase signal component and the orthogonal signal component.

Embodiment 1

Figure 1:
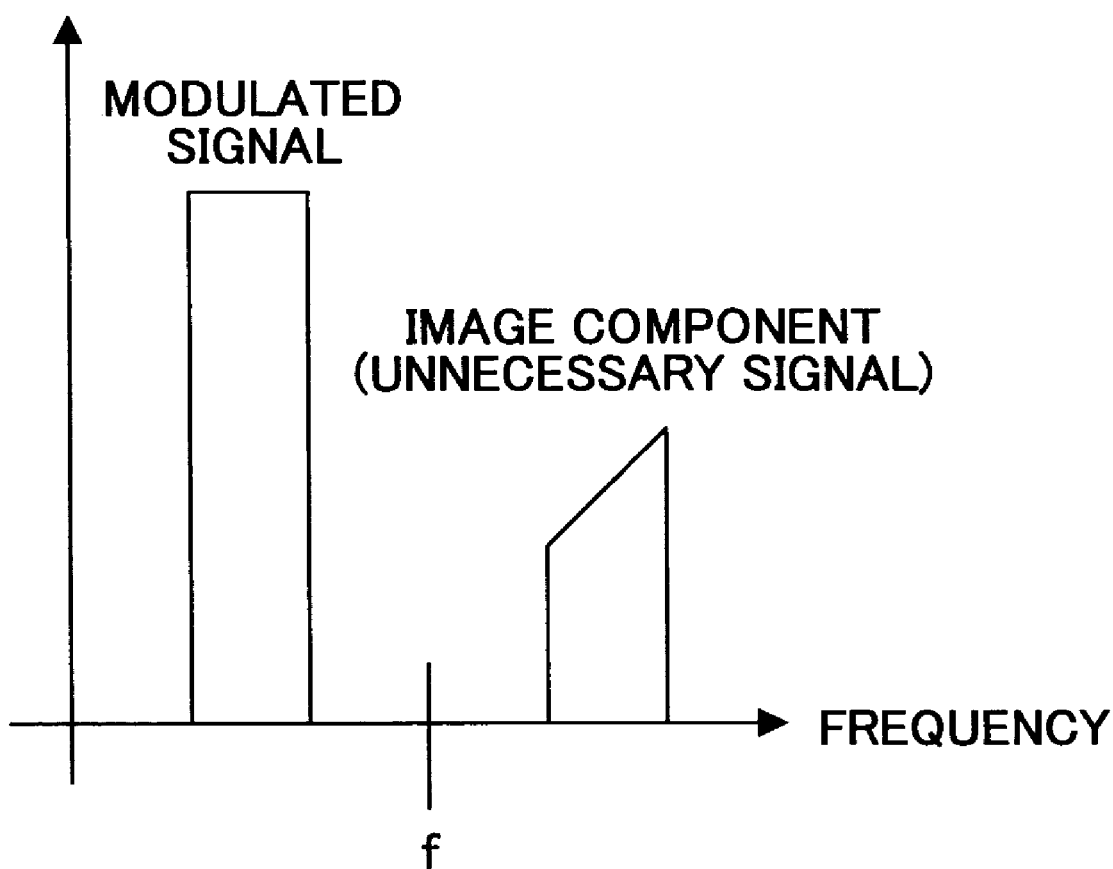
FIG. 1 is a graph showing a typical relation between a modulated signal and an image signal component (unnecessary signal)
Figure 2:
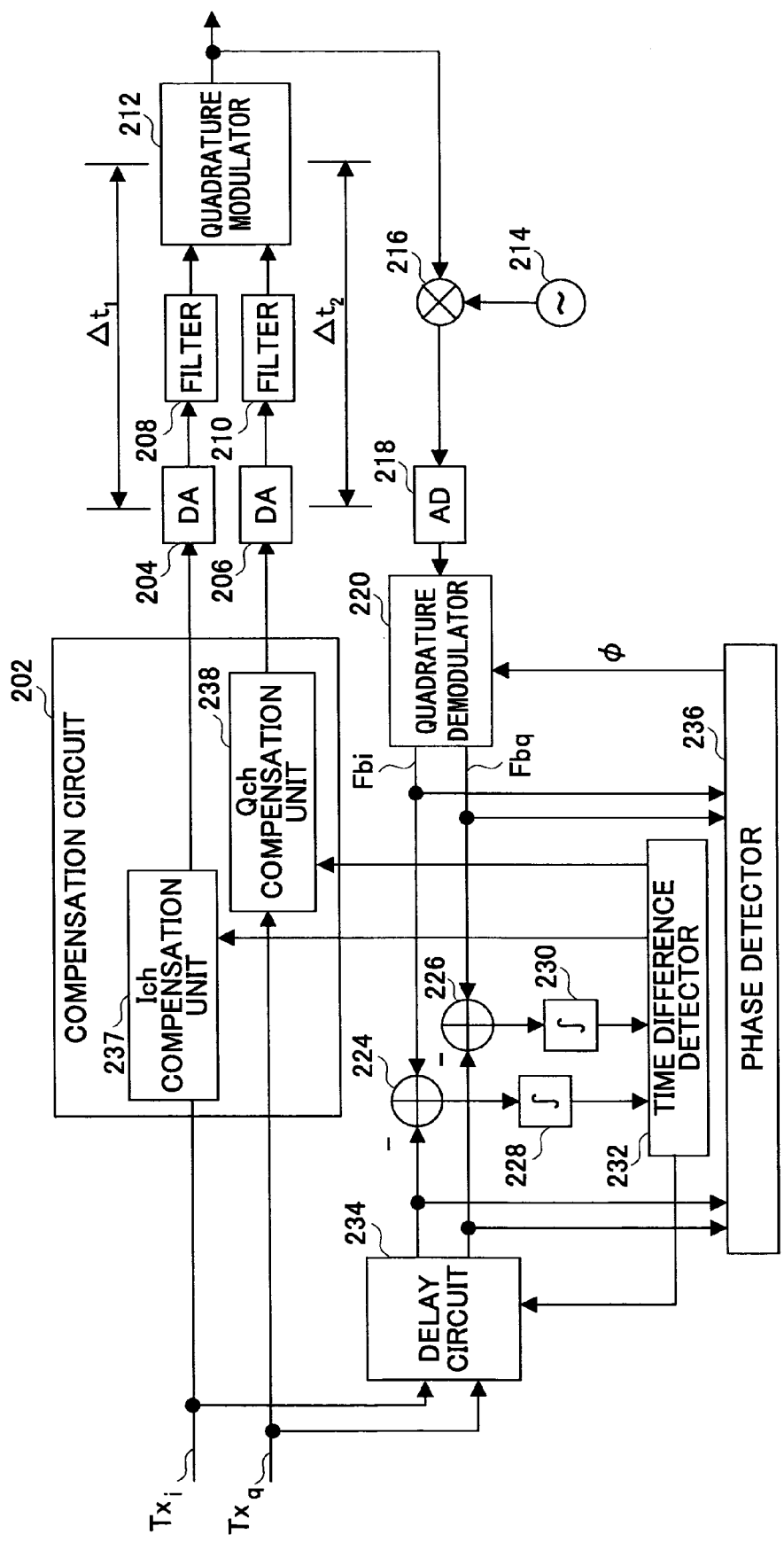
FIG. 2 is a block diagram of a quadrature modulation system according to an embodiment of the present invention.

FIG. 2 is a block diagram of the quadrature modulation system according to Embodiment 1 of the present invention. The quadrature modulation system carries out quadrature modulation of an inphase signal component $Tx_i$ (I channel) and an orthogonal signal component $Tx_q$ (Q channel) of a digital signal that represents contents to be transmitted, and outputs an output signal S that is an analog RF signal. The quadrature modulation system includes a compensation circuit 202 serving as an adjustment circuit, digital-to-analog converters 204 and 206, filters 208 and 210, and a quadrature modulator 212. The quadrature modulation system includes a multiplying unit 216, a local oscillator 214, an analog-to-digital converter 218, a quadrature demodulator 220, and a phase detector 236, constituting a feedback path. The quadrature modulation system includes adders 224 and 226 (in the illustrated example, they function as subtractors), integrators 228 and 230, a time difference detector 232, and a delay circuit 234, these serving as time difference detection means. The quadrature modulation system includes a compensation circuit 202 that further includes an $I_{ch}$ compensation unit 237 for the inphase signal component, and a $Qch$ compensation unit 238 for the orthogonal signal component.

The digital-to-analog converters 204 and 206 convert the inphase signal component and the orthogonal signal component, respectively, from digital to analog format.

The filters 208 and 210 are bandpass filters for the respective analog signals.

The quadrature modulator 212 combines the inphase signal component and the orthogonal signal component that are provided by the respective digital-to-analog converters, and outputs the output signal S. Ideally, the output signal S is expressed as follows.

$$S = y_i(n)\cos(\omega t) - y_q(n)\sin(\omega t)$$

Here, $y_i(n)$ represents the inphase signal component input into the quadrature modulator 212, which is an amount of the analog signal obtained by D-to-A conversion of the inphase signal component $Tx_i(n)$ that is in digital format. Similarly, $y_q(n)$ represents the orthogonal signal component input into the quadrature modulator 212, which is an amount of the analog signal obtained by D-to-A conversion of the orthogonal signal component $Tx_q(n)$ that is in digital format. Further, n represents a parameter that specifies a sample, and ω represents a carrier angular frequency.

The multiplying unit 216 multiplies the output signal S and a signal provided by the local oscillator 214 such that frequency conversion (down conversion) to low frequency from high frequency is carried out, providing an analog signal at a low frequency.

The analog-to-digital converter 218 is for converting the analog signal into a digital signal.

The quadrature demodulator 220 is for demodulating the output of the analog-to-digital converter 218, and outputs an inphase signal component $Fb_i$ and an orthogonal signal component $Fb_q$ of the feedback signal.

The adder 224 here functions as a subtractor, and is for obtaining the difference between the inphase signal component $Tx_i$ (before quadrature modulation), and the inphase signal component $Fb_i$ (of the feedback signal). The difference is totaled by the integrator 228, and a first accumulation value is calculated.

The adder 226 also functions as a subtractor, and is for obtaining the difference between the orthogonal signal component $Tx_q$ (before quadrature modulation), and the orthogonal signal component $Fb_q$ (of the feedback signal). The difference is totaled by the integrator 230, and a second accumulation value is calculated.

The time difference detector 232 obtains a time difference between the inphase signal component and the orthogonal signal component based on the first and the second accumulation values. The time difference is mainly generated while the signal components are being processed in the analog format. Especially, the time difference is mainly generated between the digital-to-analog converter 204 and the quadrature modulator 212, and between the digital-to-analog converter 206 and the quadrature modulator 212. Although a time difference may be generated for the feedback signal due to the analog signal process between the quadrature modulator 212 and the quadrature demodulator 220, the time difference generated in the feedback path is equally introduced to the inphase signal component and the orthogonal signal component. For this reason, the time difference generated in the feedback path does not contribute to the time difference between the inphase signal component and the orthogonal signal component.

The delay circuit 234 is for adjusting the timing of the signals $Tx_i$ and $Tx_q$ to be added by the adders 224 and 226, respectively (actually, subtraction takes place), and is additionally capable of setting up a time difference between the digital signals $Tx_i$ and $Tx_q$. Although the time difference can be set up by adjusting tap coefficients of a finite impulse response (FIR) filter, for example, the present invention is not limited to this.

The $I_{ch}$ compensation unit 237 and the $Q_{ch}$ compensation unit 238 in the compensation circuit 202 set up the amount of delay of respective signal components such that the time difference detected by the time difference detector 232 is compensated for.

The phase detector 236 compares the digital signal inphase component $Tx_i$ with the feedback signal inphase component $Fb_i$, both components being input to the adder 224. The phase detector 236 compares the digital signal orthogonal component $Tx_q$ with the feedback signal orthogonal component $Fb_q$, both components being input to the adder 226. Then, the phase detector 236 determines a phase rotation angle $\phi$ between the digital signal and the feedback signal. The information about the phase rotation angle $\phi$ is provided to the quadrature demodulator 220 such that the phase rotation between the signals before and after the quadrature modulation is compensated for.

Figure 3:
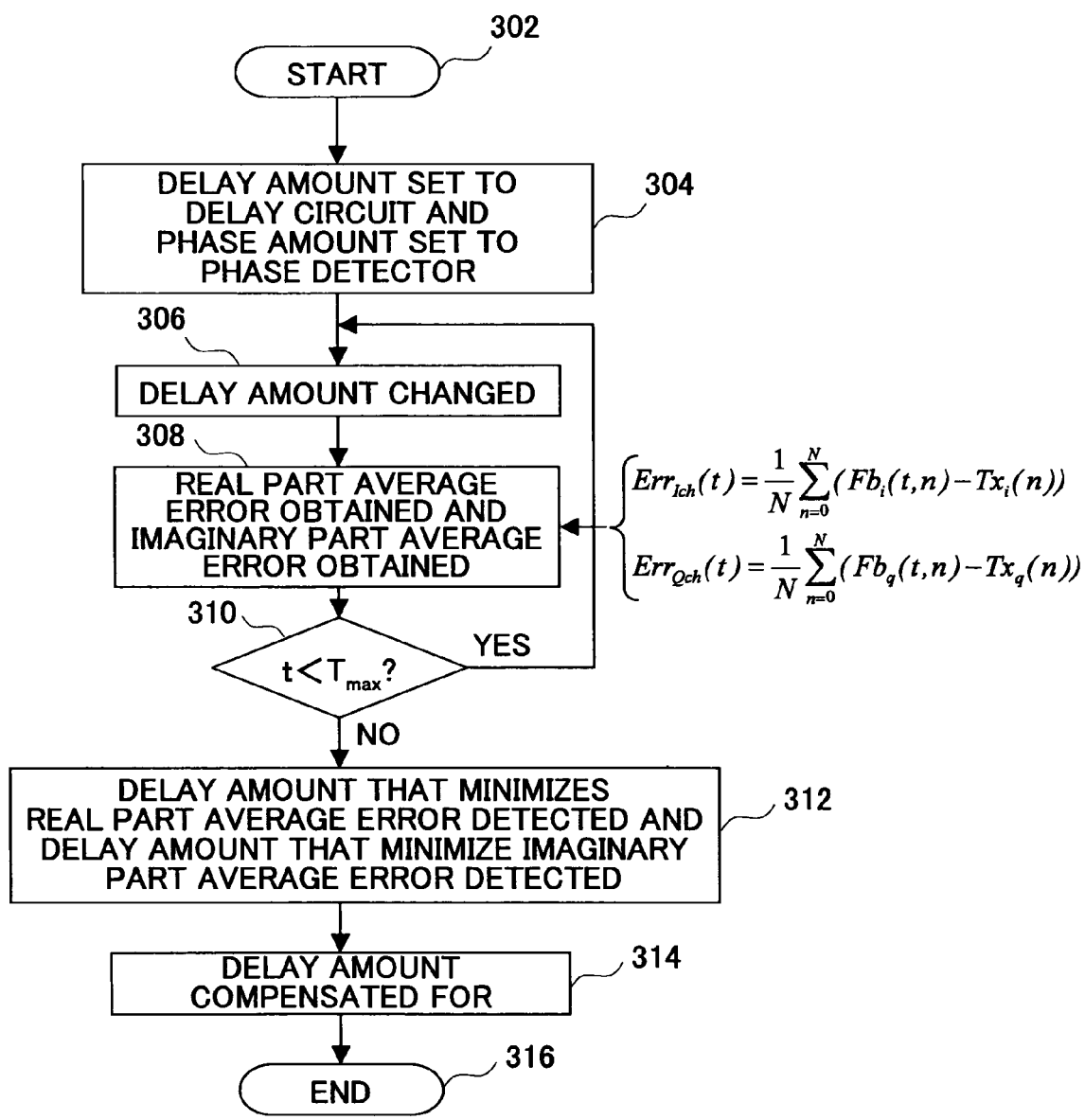
FIG. 3 is a flowchart for adjusting an amount of delay.

Next, operations of the present embodiment are explained, referring to FIG. 3.

FIG. 3 is a flowchart for adjusting the amount of the time difference. The flow starts at Step 302, and progresses to Step 304. At Step 304, a time difference t between the inphase signal component $Tx_i$ and the orthogonal signal component $T_q$ is set at an initial value (for example, t=0) by the delay circuit 234. Further, the phase rotation angle $\phi$ is obtained by the phase detector 236, and the phase rotation angle $\phi$ is compensated for by the quadrature demodulator 220.

The time difference t is updated at Step 306 (for example, t=t+Δt).

At Step 308, a real part error average $Err_{Ich}(t)$ serving as "the first cumulative total", and an imaginary part error average $Err_{Qch}(t)$ serving as "the second cumulative total" are obtained using the following formula (1).

[Equation 1]

$$Err_{Ich}(t) = \frac{1}{N}\sum_{n=0}^{N}(Fb_i(t,n) - Tx_i(n)) \quad (1)$$

$$Err_{Qch}(t) = \frac{1}{N}\sum_{n=0}^{N}(Fb_q(t,n) - Tx_q(n))$$

Here, n is a parameter for specifying a sample of the digital signal, and N represents the number of times each of the integrators 228 and 230 carries out totaling. As for operations here, the adder 224 and the integrator 228 carry out calculation of the real part error average, and the adder 226 and the integrator 230 carry out calculation of the imaginary part error average.

At Step 310, whether the first and second accumulative totals are obtained for all the time delay amounts t is determined. More specifically, whether the time delay t is increased from 0 to a predetermined maximum $T_{max}$ at increments of Δt is determined. If t has not reached the maximum $T_{max}$, the process returns to Step 306, where t is incremented by Δt, and the same process is performed. In this manner, the amount of time delay t is updated by changing the amount of delay set up by the delay circuit 234.

Figure 4:
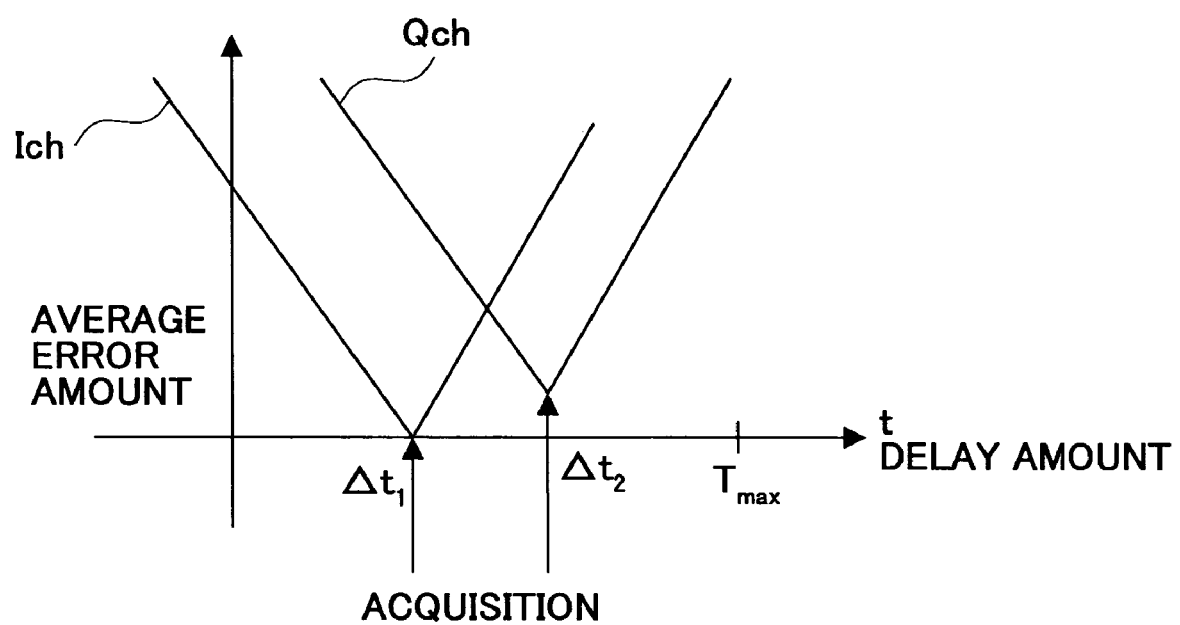
FIG. 4 graphs relations between the amount of delay and an average error value.

In the case that the amount of the time delay t reaches the maximum $T_{max}$, the process progresses to Step 312. By repeating Steps 306, 308, and 310, relations between the amount of time delay t and the first cumulative total (average error value about the inphase signal component), and between the amount of time delay t and the second cumulative total (average error value about the orthogonal signal component) as shown in FIG. 4 are acquired. The two graphs coincide if there is no time difference between the inphase signal component and the orthogonal signal component. At Step 312, an amount $\Delta t_1$ of time delay at which the real part error average becomes the smallest, and an amount $\Delta t_2$ of time delay at which the imaginary part error average serve becomes the smallest are obtained by the time difference detector 232.

At Step 314, suitable delay amounts based on $\Delta t_1$ and $\Delta t_2$ are provided to the compensation circuit 202 such that the time difference between the inphase signal component and the orthogonal signal component detected at Step 312 is compensated for. In this case, it is acceptable that one of the amounts of time delay of the inphase and the orthogonal signal components is made zero, and the other amount of time delay is positively set up. Alternatively, both amounts of time delay of the inphase and the orthogonal signal components are positively set up. This is because the timings of the inphase and the orthogonal signal components are to relatively agree. For example, it is possible to set the amount of time delay equal to $(\Delta t_1-\Delta t_2)/2$ to the $I_{ch}$ compensation unit 237 for the inphase signal component, and to set the amount of delay of $(\Delta t_2-\Delta t_1)/2$ to the $Q_{ch}$ compensation unit 238 for the orthogonal signal component. It is desirable, from viewpoints such as stabilization of control action, to carry out the compensation on both sides.

Then, the process proceeds to Step 316 for ending.

Figure 5:
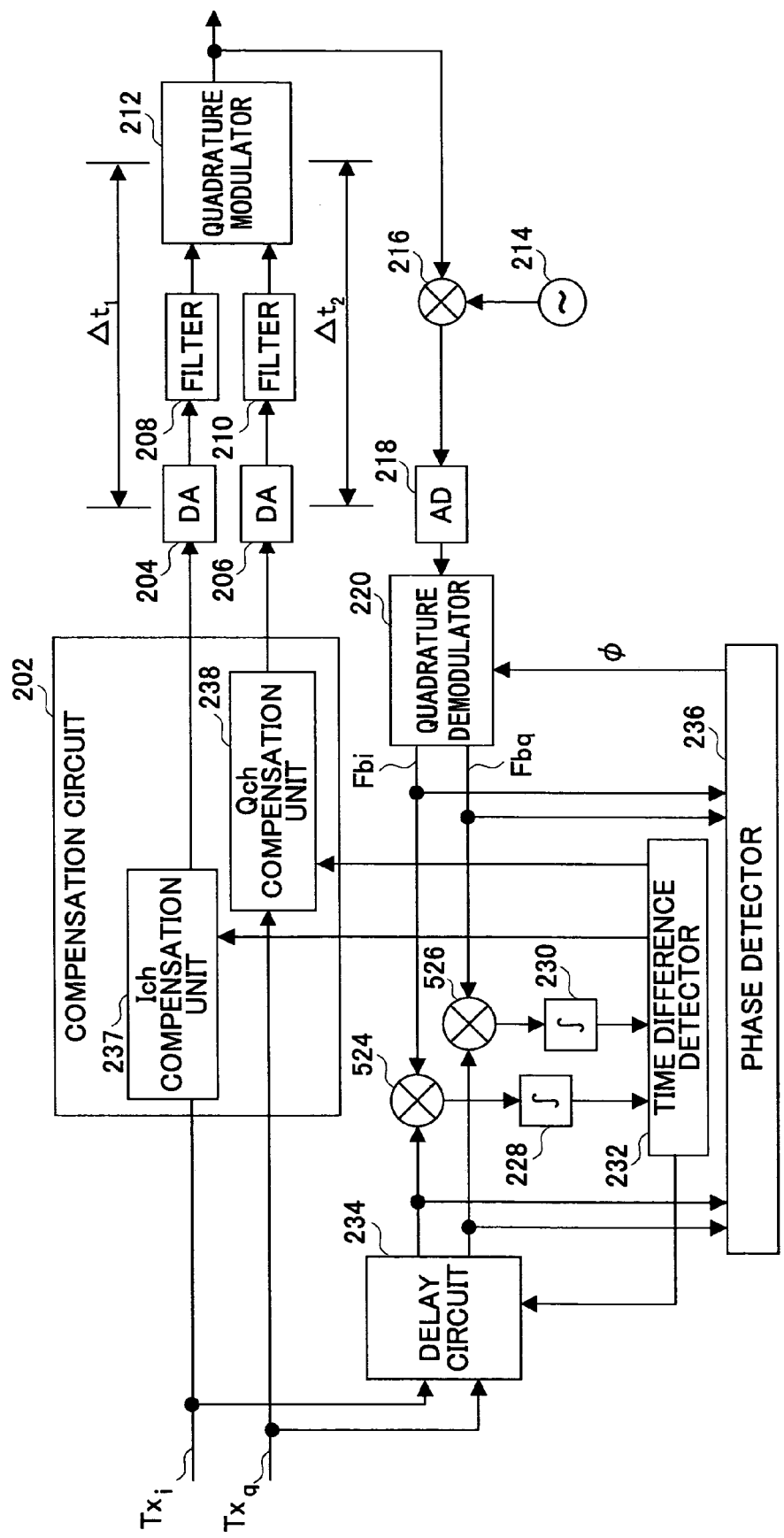
FIG. 5 is a block diagram of a variation to the quadrature modulation system.

In the example described above, although the first and the second cumulative totals are calculated by totaling the results of an operation (subtraction) by the adders 224 and 226, the present invention is not limited to such a form. For example, as shown in FIG. 5, the time difference can be obtained by calculating a product of the digital signal components $Tx_i$ and $Tx_q$ and a product of the feedback signal components $Fb_i$ and Fb$_q$ using the multiplying units 524 and 526, respectively, and by totaling the products (power) with the integrators 228 and 230, respectively.

Figure 6:
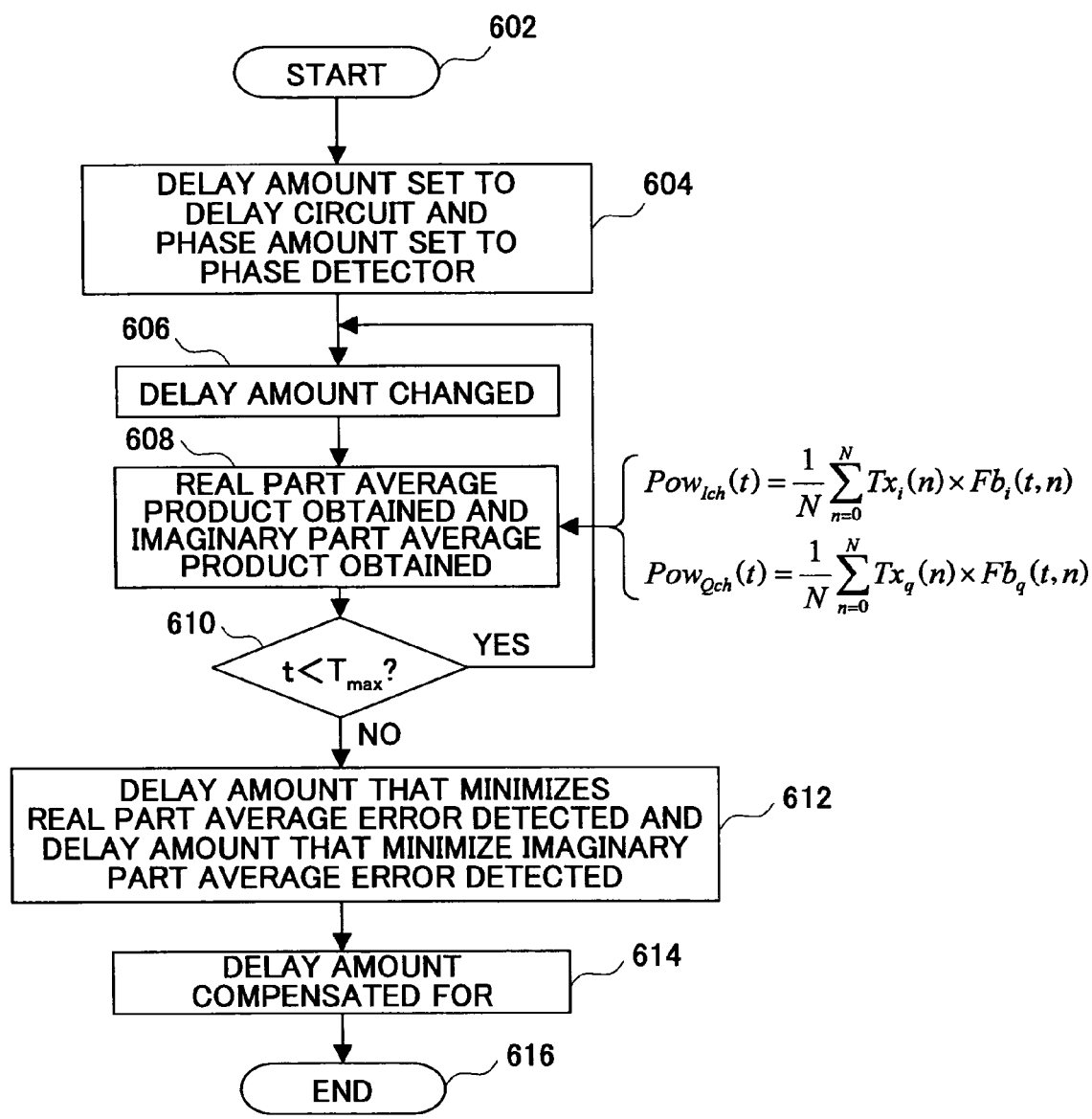
FIG. 6 is a flowchart showing a variation to the flowchart for adjusting the amount of delay.

FIG. 6 is a flowchart showing a process wherein the products are used as described above. The flow starts at Step 602, and progresses to Step 604. At Step 604, the time difference t between the inphase signal component Tx$_i$ and the orthogonal signal components Tx$_q$ is set at an initial value (for example, t=0). Further, the phase rotation angle φ is obtained by the phase detector 236, and the phase rotation angle φ is compensated for by the quadrature demodulator 220.

The amount of time delay t is incremented at Step 606 (for example, t=t+Δt).

At Step 608, a real part multiplication average PowIch(t), serving as the first cumulative total, and an imaginary part multiplication average PowQch(t), serving as the second cumulative total are calculated according to the following formula (2).

[Equation 2]

$$Pow_{Ich}(t) = \frac{1}{N}\sum_{n=0}^{N} Tx_i(n) \times Fb_i(t, n) \quad (2)$$

$$Pow_{Qch}(t) = \frac{1}{N}\sum_{n=0}^{N} Tx_q(n) \times Fb_q(t, n)$$

Here, n is a parameter for specifying a sample of the digital signal, and N represents the number of times each of the integrators 228 and 230 carries out totaling. The multiplying unit 524 and the integrator 228 carry out calculation of the real part multiplication average, and the multiplying unit 526 and the integrator 230 carry out calculation of the imaginary part multiplication average.

At Step 610, whether the first and the second cumulative totals are calculated for all the t values is determined. If t<T$_{max}$, the process returns to Step 606, and the same process is performed.

Figure 7:
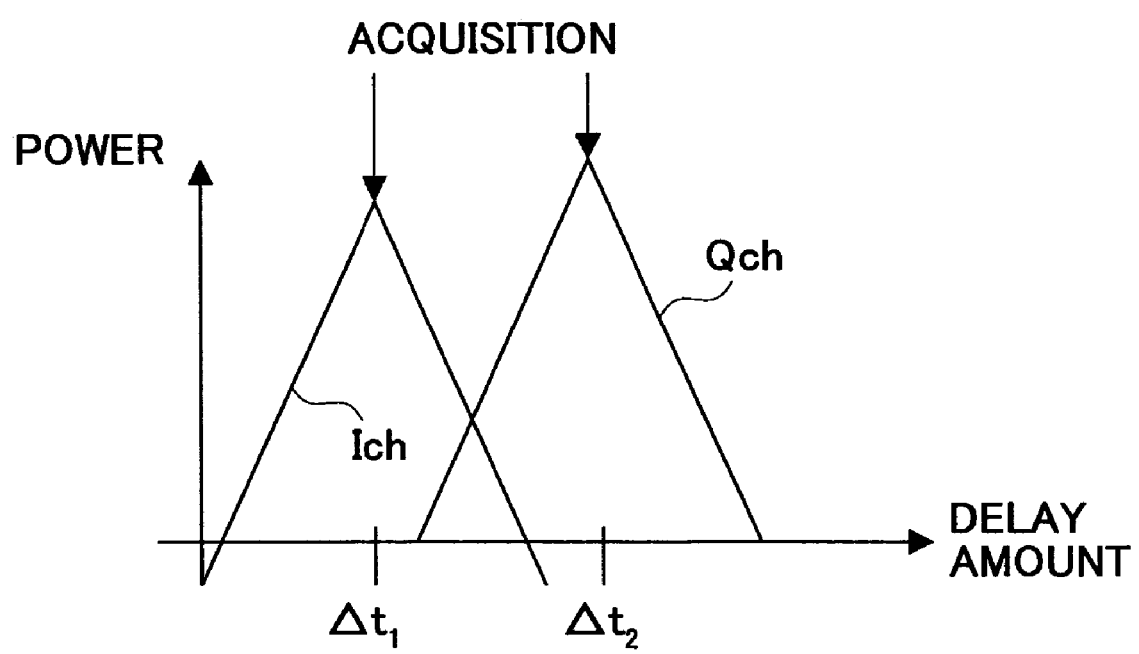
FIG. 7 graphs relations between the amount of delay and an average product value.

In the case that the amount of time delay t reaches T$_{max}$, the process progresses to Step 612. By repeating Steps 606, 608, and 610, relations between the amount of time delay t and the first cumulative total (average multiplication value about the inphase signal component), and between the amount of time delay t and the second cumulative total (average multiplication value about the orthogonal signal component) are acquired as shown in FIG. 7. The two graphs coincide if there is no time difference between the inphase signal component and the orthogonal signal component. At Step 612, the time difference detector 232 obtains a delay amount Δt$_1$ that provides the greatest real part multiplication average, and a delay amount Δt$_2$ that provides the greatest imaginary part multiplication average.

At Step 614, suitable delay amounts based on Δt$_1$, and Δt$_2$ are provided to the compensation circuit 202 such that the time difference between the inphase signal component and the orthogonal signal component detected at Step 612 is compensated for. Then, the process progressed to Step 616 for ending.

Figure 8:
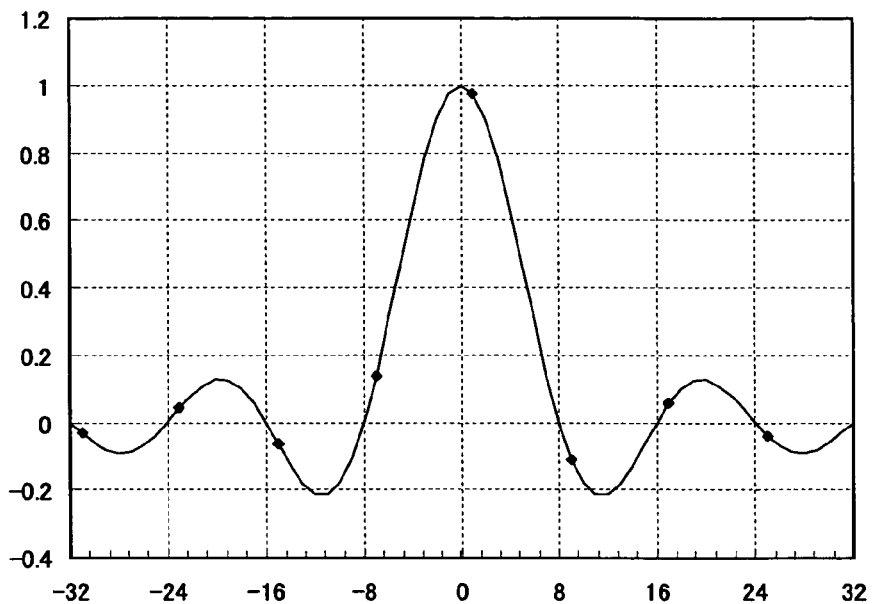
FIG. 8 graphs tap coefficients when a delay equal to ⅛ symbol is given.
Figure 9:
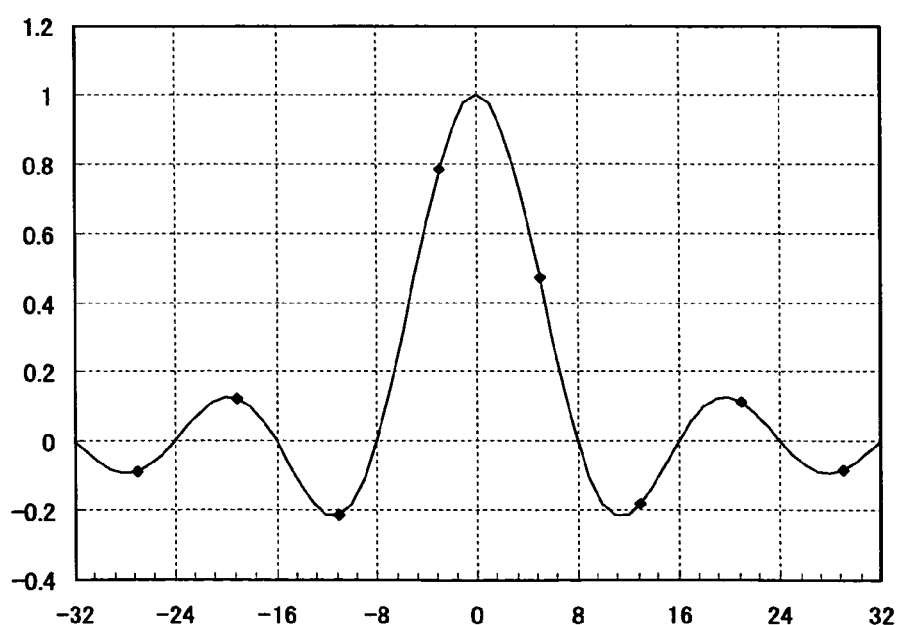
FIG. 9 graphs tap coefficients when a delay equal to ⅝ symbol is given.

Here, each of the compensation units 237 and 238 of the compensation circuit 202 for adjusting the timing of the inphase signal component and the orthogonal signal component, respectively, can be constituted by, for example, a finite impulse response filter (FIR filter). By properly setting up tap coefficients of the FIR filter, a desired amount of time delay can be provided to an input signal for outputting. For example, a time delay equivalent to ⅛ symbol can be provided by adopting values of eight points of the impulse response property of the FIR filter as shown by FIG. 8 as the tap coefficients. Further, a time delay equivalent to ⅝ symbol can be obtained by adopting the values of the eight points as shown in FIG. 9 as the tap coefficients.

Figure 10:
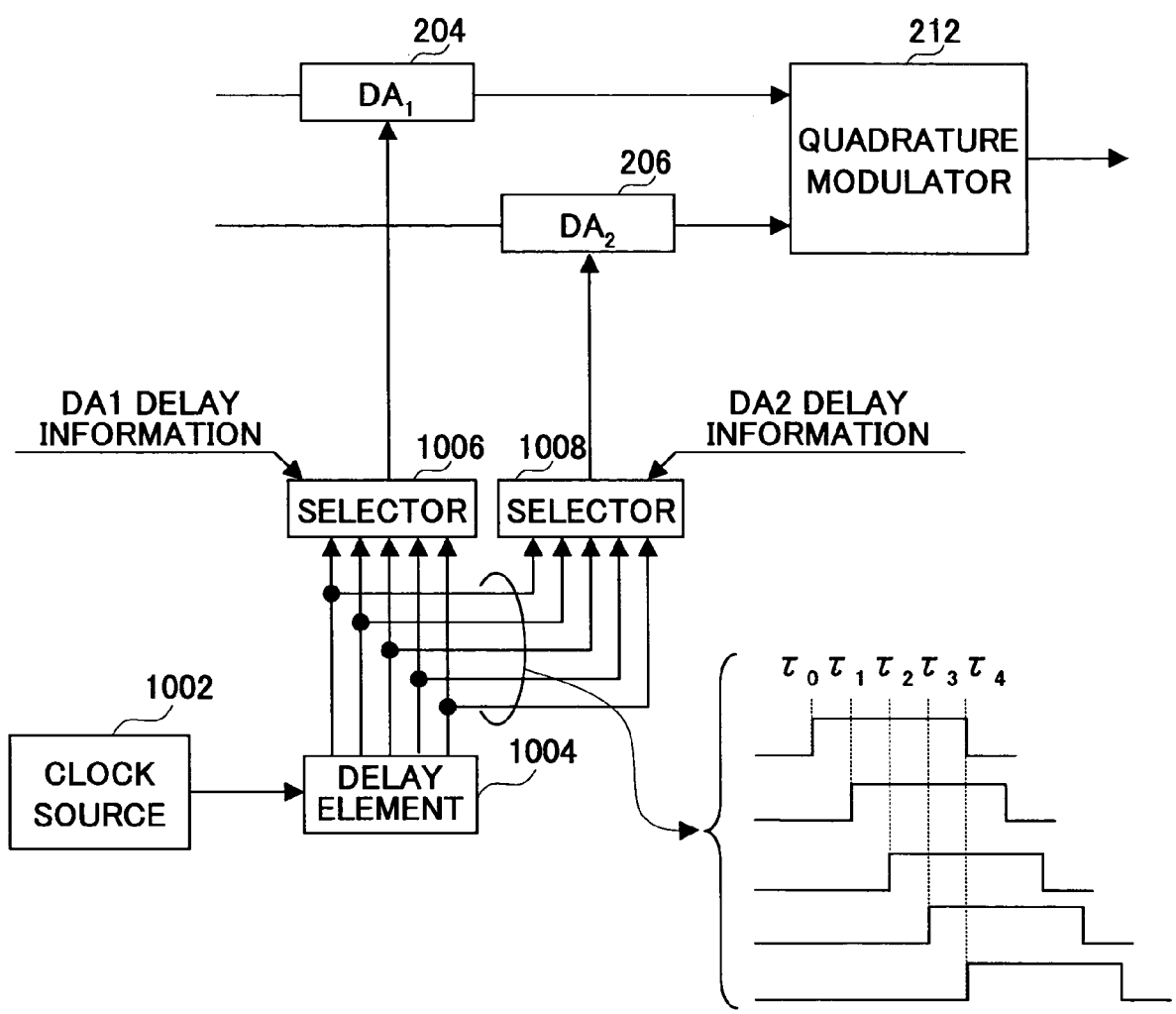
FIG. 10 is a block diagram showing a variation to a compensation circuit.

Further, as a variation of the compensation circuit 202, clock timing of each of the digital-to-analog converters 204 and 206 is made adjustable such that a desired amount of time delay is obtained. FIG. 10 is a block diagram showing the variation of the compensation circuit. The compensation circuit, according to this variation, includes a clock source 1002, a delay element 1004, and selectors 1006 and 1008. The clock source 1002 generates a clock signal for driving the digital-to-analog converters 204 (DA$_1$,) and 206 (DA$_2$). The delay element 1004 delays the timing of the clock signal provided by the clock source 1002 such that delayed clock signals having various delays τ$_n$ are output. In the example that is illustrated, five clock signals having delay times τ$_0$ through τ$_4$ are prepared. Selectors 1006 and 1008 are for selecting one of the clock signals with a delay time τ$_n$ based on the delay information provided by the time difference detector 232, and for supplying clock signals with selected time delays to the digital-to-analog converters 204 and 206, respectively.

Embodiment 2

Next, Embodiment 2 is explained, wherein the image signal component is reduced by adjusting the amplitudes of the inphase signal component and the orthogonal signal component. First, an outline is presented concerning the balance of the amplitudes of the inphase signal component and the orthogonal signal component.

Figure 11:
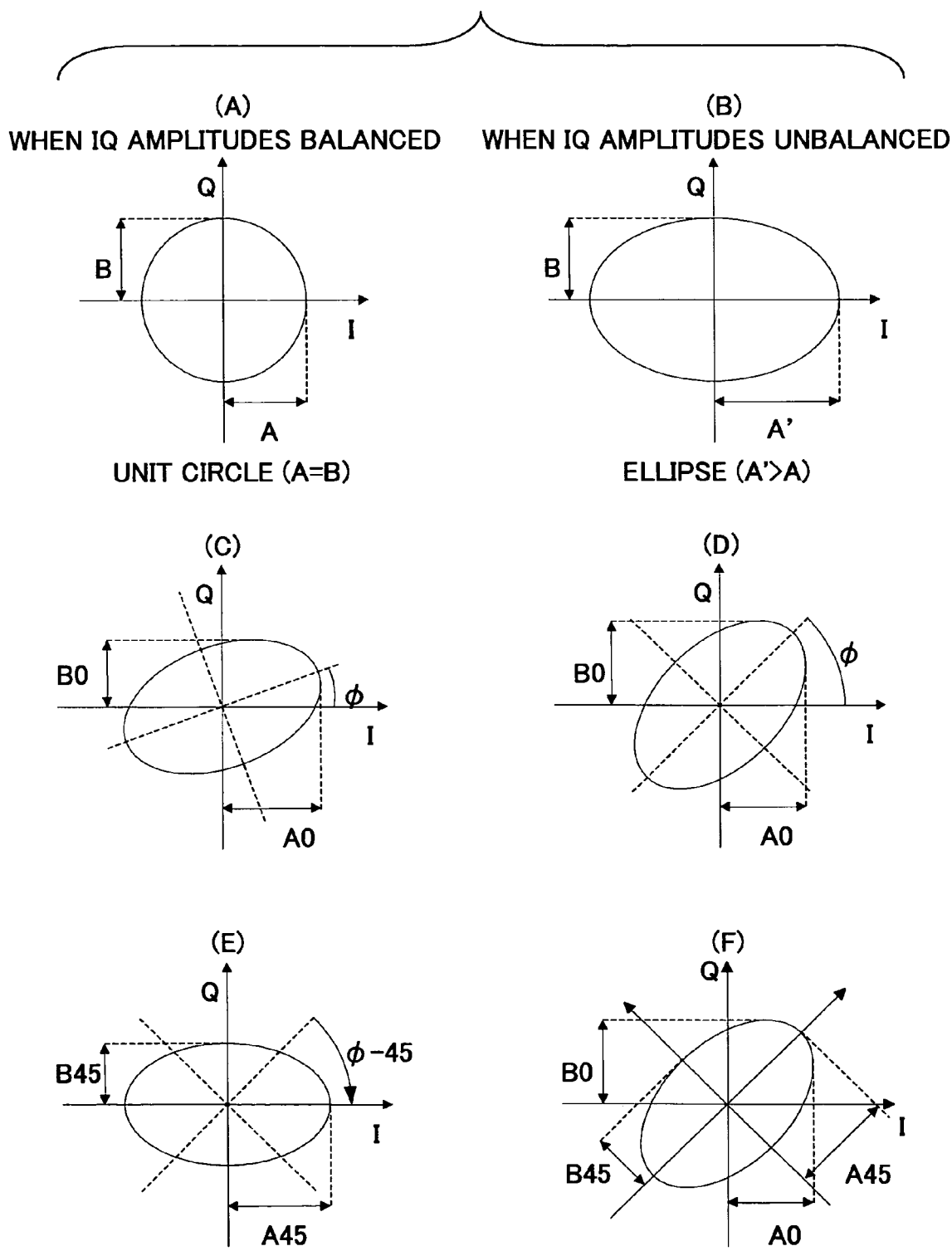
FIG. 11 graphs relations between amplitudes of an inphase signal component and an orthogonal signal component, and phase rotation angles where applicable.

FIG. 11 shows relations between the amplitudes of the inphase signal component and the orthogonal signal component, and a phase rotation angle where applicable. Each of the relations is drawn as a locus when an average of a signal point that is present in a minute unit angle on a signal point arrangement plan (constellation) is calculated for 0 through 360 degrees. When the inphase signal component and the orthogonal signal component are properly output, a circular locus is obtained as shown at (A) of FIG. 11. In contrast, when the amplitudes of the inphase signal component and the orthogonal signal component are not equal to each other, an elliptic locus is obtained as shown at (B) of FIG. 11. In this case, the amplitude of the inphase signal component and/or the orthogonal signal component is adjusted such that the elliptic locus turn into a circular locus, namely, such that the amplitude ratio of the real axis to the imaginary axis become 1, that is, the amplitude difference become zero.

In addition to the case wherein the amplitudes of the inphase signal component and the orthogonal signal component are imbalanced, there are cases wherein the feedback signal drawn from the output signal is rotated by a certain angle (phase rotation angle) φ as shown at (C) of FIG. 11. The phase rotation is often generated by the analog signal process in the feedback path, for example. When the amount of the phase rotation angle φ is relatively small, the amplitude balance can be obtained by adjusting the amplitudes of the inphase signal component and the orthogonal signal component. However, if the phase rotation angle φ becomes as great as 45 degrees (π/4 rad.) as shown at (D) of FIG. 11, an average amplitude A0 in the real axis (I) and an average amplitude B0 in the imaginary axis (Q) become equal, even if the locus is in the elliptic shape. That is, when the phase rotation angle φ is about 45 degrees, the amplitude difference cannot be properly detected, and it is difficult to compensate for the imbalance of the amplitudes.

In this view, according to the present embodiment, in addition to the average amplitudes A0 and B0 in the real axis and the imaginary axis, respectively, as shown in FIG. 11(C), average amplitudes A45 and B45 are measured. Here, A45 and B45 are amplitude values when the feedback signal is rotated by 45 degrees in the direction of the arrow (i.e., −45 degrees) as shown at (E) of FIG. 11. In this manner, two pairs of the inphase signal component and the orthogonal signal component are obtained. Namely, one is the pair of the average amplitude values A0 and B0 measured without rotating the feedback signal, and the other is the pair of the average amplitude values A45 and B45 measured when the feedback signal is rotated by 45 degrees, as shown at (F) of FIG. 11. The present embodiment is to obtain the amplitude balance based on the two pairs.

Figure 12:
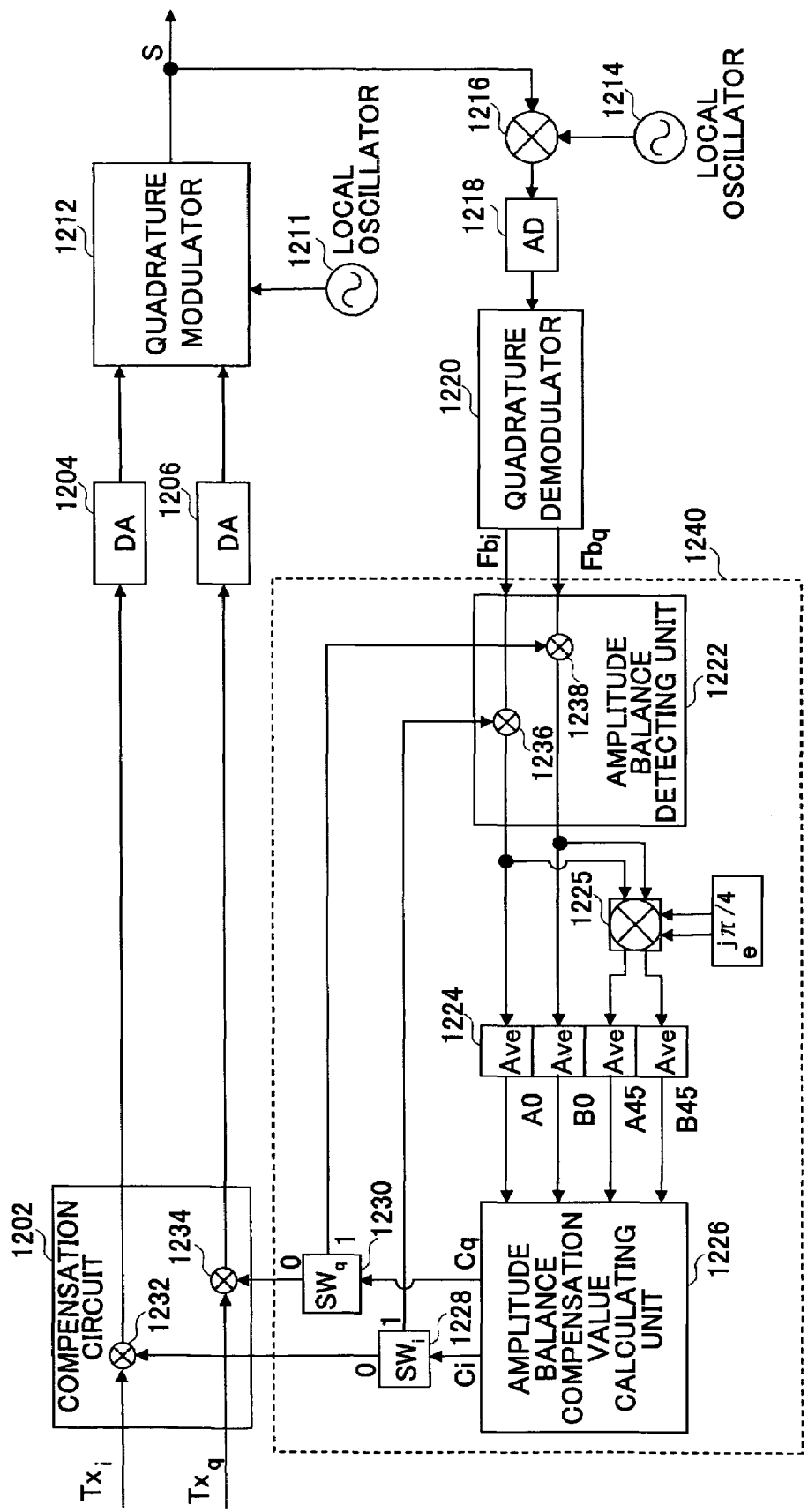
FIG. 12 is a block diagram of the quadrature modulation system according to an embodiment of the present invention.

FIG. 12 is a block diagram of the quadrature modulation system according to the embodiment of the present invention. The quadrature modulation system includes a compensation circuit 1202, digital-to-analog converters 1204 and 1206, a quadrature modulator 1212, and a local oscillator 1211. The quadrature modulation system includes a multiplying unit 1216 connected to another local oscillator 1214, an analog-to-digital converter 1218, and a quadrature demodulator 1220 in the feedback path. The quadrature modulation system includes an amplitude difference calculating unit 1240 that includes an amplitude balance detecting unit 1222, averaging units (Ave) 1224, a compound multiplier 1225, an amplitude balance compensation value calculating unit 1226, and switches 1228 and 1230. The compensation circuit 1202 includes multiplying units 1232 and 1234. The amplitude balance detecting unit 1222 includes multiplying units 1236 and 1238.

The digital-to-analog converters 1204 and 1206 convert the inphase signal component and the orthogonal signal component, respectively, from digital format to analog format. The quadrature modulator 1212 receives and combines the inphase signal component and the orthogonal signal component, and outputs the output signal S. The multiplying unit 1216 is for multiplying the output signal S and a signal from the local oscillator 1214, wherein down conversion is carried out. The analog-to-digital converter 1218 converts the down-converted signal, which is an analog signal, into a digital signal. The quadrature demodulator 1220 carries out the quadrature demodulation of the output from the analog-to-digital converter 1218, and outputs an inphase signal component $Fb_i$ and an orthogonal signal component $Fb_q$ of the feedback signal.

The multiplying units 1236 and 1238 of the amplitude balance detecting unit 1222 provisionally adjust the amplitudes of the inphase signal component $Fb_i$ and the orthogonal signal component $Fb_q$, respectively, of the feedback signal, and output $Fb_i$ and $Fb_q$ to the averaging units 1224 and the compound multiplier 1225.

The compound multiplier 1225 rotates the phase of the output feedback signal by 45 degrees, and outputs the rotated feedback signal.

The averaging units 1224 calculate averages of the respective signals that are input. Namely, according to this example, the averages A0 and B0 of the amplitudes measured without rotating the feedback signal, and the averages A45 and B45 of the amplitudes measured with rotating the feedback signal by 45 degrees are calculated.

The amplitude balance compensation value calculating unit 1226 calculates amplitude balance compensation values Ci and Cq based on the averages obtained by the averaging units 1224. Eventually (see below), the amplitude balance compensation values Ci and Cq are multiplied by the digital signals $Tx_i$ and $Tx_q$, respectively.

The switches 1228 and 1230 are turned to a side indicated by "1" (side "1") until the amplitude balance compensation values Ci and Cq converge, and the outputs from the amplitude balance compensation value calculating unit 1226 are directed to the side "1". When the amplitude balance compensation values Ci and Cq converge, the outputs from the amplitude balance compensation value calculating unit 1226 are directed to the side indicated by "0" (side "0").

Figure 13:
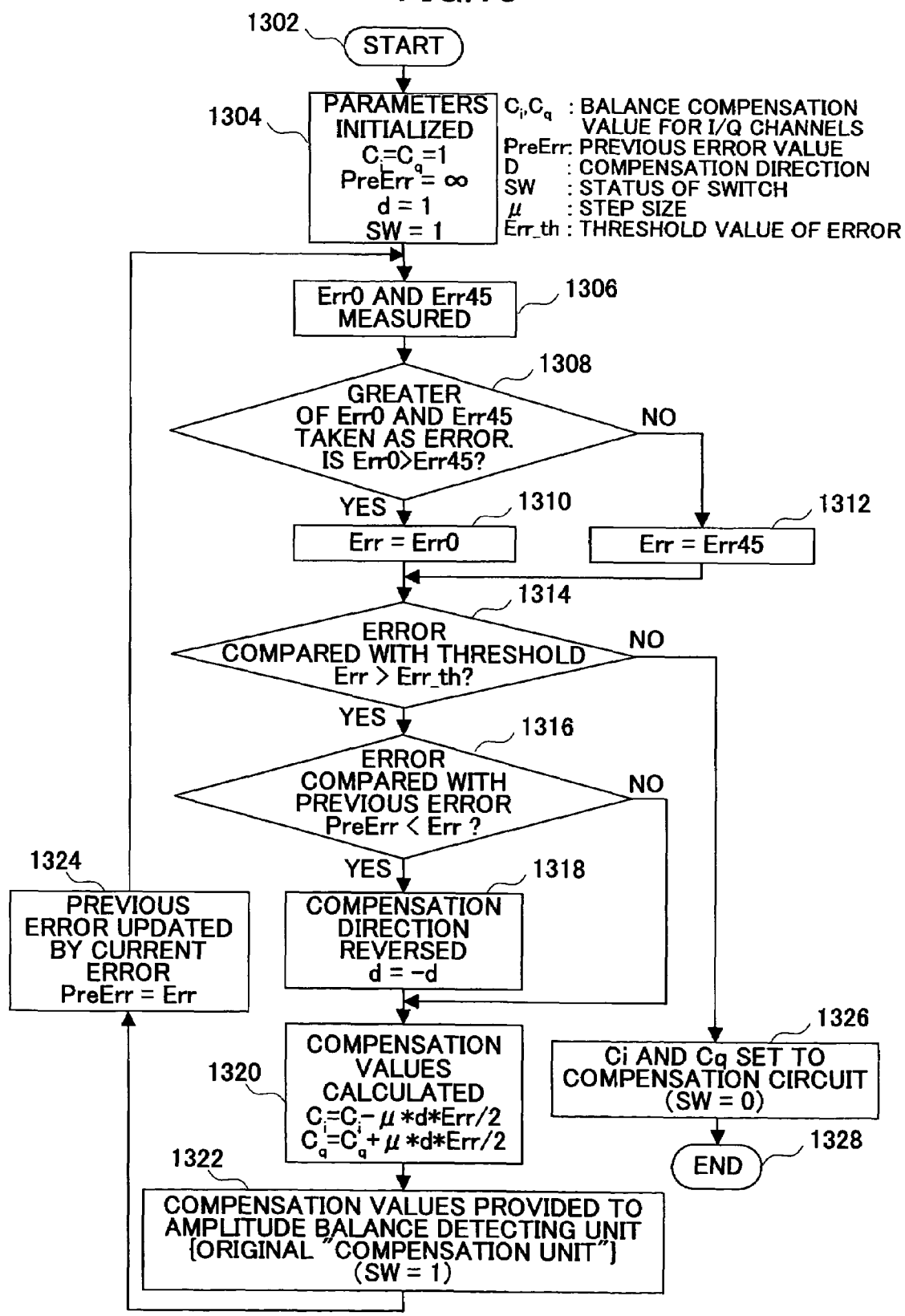
FIG. 13 is a flowchart for adjusting amplitude balance.

FIG. 13 is a flowchart for adjusting the amplitude balance. The process starts at Step 1302 and progresses to Step 1304. At Step 1304, various parameters such as a previous error amount PreErr, a direction d of compensation, a step size μ, and a threshold value for error Err_th are initialized. In the present example, the amplitude balance compensation values Ci and Cq for the inphase signal component and the orthogonal signal component, respectively, are set at 1. A great value is set to the previous error amount PreErr. The compensation direction d is set as +1. According to the present embodiment, if the compensation direction d is +1, Cq is increased while Ci is reduced; and if d is set as −1, Cq is reduced while Ci is increased.

At Step 1306, the average amplitude A0 of the inphase signal component and the average amplitude B0 of the orthogonal signal component of the feedback signal are measured without carrying out phase rotation, and an absolute value of the difference between A0 and B0 is obtained, which is called Err0.

Err0=Abs(*A*0−*B*0)

Further, the average amplitude A45 of the inphase signal component and the average amplitude B45 of the orthogonal signal component are measured with the phase of the feedback signal being rotated by 45 degrees, and an absolute value of the difference between A45 and B45 is obtained, which is called Err45.

Err45=Abs(*A*45−*B*45)

At Step 1308, the absolute values of Err0 and Err45 are compared, and the greater of the two (or Err45 if they are equal) is assigned as the value of an error Err, which is evaluated in operations afterwards, namely, at Steps 1310 and 1312.

Then, Step 1314 determines whether the error Err is greater than the threshold Err_th. If the determination is affirmative, the process progresses to Step 1316.

Then, Step 1316 determines whether the error Err is greater than or equal to the previous error amount PreErr. If the determination is affirmative, the process progresses to Step 1318, where the value of the compensation direction d is changed; otherwise, the process progresses to Step 1320.

At Step 1320, the amplitude balance compensation values Ci and Cq are updated. According to the present embodiment, the amplitude balance compensation values Ci and Cq are updated such that the difference between Ci and Cq is changed by an amount equal to μ·Err. Here, the parameter μ represents the step size for updating the compensation values. Here, updating is performed not by changing only one of Ci and Cq with the other being fixed, but rather by changing both Ci and Cq by the same amount in opposite directions. In this manner, the updating operation can be carried out, with the control action being stabilized.

At Step 1322, the updated amplitude balance compensation values Ci and Cq are provided to the amplitude balance detecting unit 1222.

At Step 1324, the previous error amount PreErr is assigned the value Err, the process returns to Step 1306, and the same operation as described above follows.

At Step 1314, if the error Err is determined to be less than or equal to the threshold Err_th, the process progresses to Step 1326.

At Step 1326, the switches 1228 and 1230 are turned to the side "0" such that the outputs from the amplitude balance compensation value calculating unit 1226 are directed to the compensation circuit 1202. Accordingly, the optimal amplitude balance compensation values Ci and Cq are provided to the multiplying units 1232 and 1234, respectively, of the compensation circuit 1202. Then, the process progresses to Step 1328 for ending. In this manner, the amplitude balance is adjusted.

FIG. 14 is a conceptual diagram for explaining another embodiment of the present invention. FIG. 14 shows relations between the orthogonality of the inphase signal component and the orthogonal signal component, and the average amplitude vector for every quadrant. Although a modulation technique like QPSK is assumed in this embodiment, naturally the embodiment is applicable to other modulation techniques. In the present embodiment, average amplitude vectors r1, r2, r3, and r4 are calculated for the corresponding quadrants. When the inphase signal component and the orthogonal signal component are properly output, average amplitude vectors taken from minute unit angles draw a circular locus on a signal point arrangement plan, i.e., a constellation chart, as shown at (A) of FIG. 14. In this case, the magnitude of the four average amplitude vectors r1, r2, r3, and r4 are equal to each other, and r1 and r2 are orthogonal, r1 and r4 are orthogonal; similarly, r3 and r2 are orthogonal, and r3 and r4 are orthogonal.

In contrast, when the amplitudes of the inphase signal component and the orthogonal signal component are not equal to each other, the following cases can be considered. The first of the cases is as shown at (B) of FIG. 14, wherein not all the magnitudes of the average amplitude vectors are the same, and the average amplitude vectors are not orthogonal. The second of the cases is as shown at (C) of FIG. 14, wherein not all the magnitudes of the average amplitude vectors are the same, although the average amplitude vectors are orthogonal to each other. The third case is as shown at (D) of FIG. 14, wherein although all the average amplitude vectors are of the same magnitude, they are not orthogonal. The present embodiment uses the relations between the average amplitude vectors for compensating for the imbalance of the amplitudes.

FIG. 15 is a block diagram of the quadrature modulation system according to the present embodiment. The quadrature modulation system includes a compensation circuit 1502, digital-to-analog converters 1504 and 1506, and a quadrature modulator 1512 connected to a local oscillator 1511. The quadrature modulation system includes a multiplying unit 1516 connected to the local oscillator 1514, an analog-to-digital converter 1518, and a quadrature demodulator 1520 in the feedback path. The quadrature modulation system includes an amplitude difference calculating unit 1540 that further includes an amplitude balance detecting unit 1522, an quadrant averaging unit 1524, an amplitude balance compensation value calculating unit 1526, and switches 1528 and 1530.

The digital-to-analog converters 1504 and 1506 convert the inphase signal component and the orthogonal signal component, respectively, from digital to analog format. The quadrature modulator 1512 combines the inphase signal component and the orthogonal signal component that are provided by the respective digital-to-analog converters, and outputs the output signal S. The multiplying unit 1516 multiplies the output signal S and the signal from the local oscillator 1514, wherein down conversion is carried out. The analog-to-digital converter 1518 converts the down-converted signal, which is an analog signal, into a digital signal. The quadrature demodulator 1520 carries out the quadrature demodulation of the output of the analog-to-digital converter 1518, and outputs the inphase signal component $Fb_i$ and the orthogonal signal component $Fb_q$ of the feedback signal.

The amplitude balance detecting unit 1522 provisionally adjusts the inphase signal component $Fb_i$ and the orthogonal signal component $Fb_q$ of the feedback signal, and outputs $Fb_i$ and $Fb_q$ to the quadrant averaging unit 1524.

The quadrant averaging unit 1524 averages amplitude vectors belonging to each of the four quadrants of the signal point arrangement plan (constellation). Furthermore, the averaging unit 1524 outputs first and second vectors R1 and R2 that are defined by predetermined combinations of the average amplitude vectors r1, r2, r3, and r4. Specifically, R1 and R2 are defined as follows.

$$R1=(r1-r3)/2$$

$$R2=(r2-r4)/2$$

R1 is equivalent to an average vector in one of main axis directions of the ellipse, and R2 is equivalent to an average vector in the other of the main axis directions of the ellipse. If the proper balance of the amplitudes is present, |R1| is equal to |R2|, and R1 and R2 orthogonally intersect.

The amplitude balance compensation value calculating unit 1526 calculates the amplitude balance compensation values Ci and Cq based on the averages obtained by the quadrant averaging unit 1524. Eventually the amplitude balance compensation values Ci and Cq are provided to the compensation circuit 1502, serving as the coefficients with which the digital signals Txi and Txq, respectively, are multiplied.

The switches 1528 and 1530 are turned to the side of "1" until the amplitude balance compensation values Ci and Cq converge such that the outputs from the amplitude balance compensation value calculating unit 1526 are directed to the compensation circuit 1502. When the amplitude balance compensation values Ci and Cq converge, the switches 1528 and 1530 are turned to the side "0".

Figure 16:
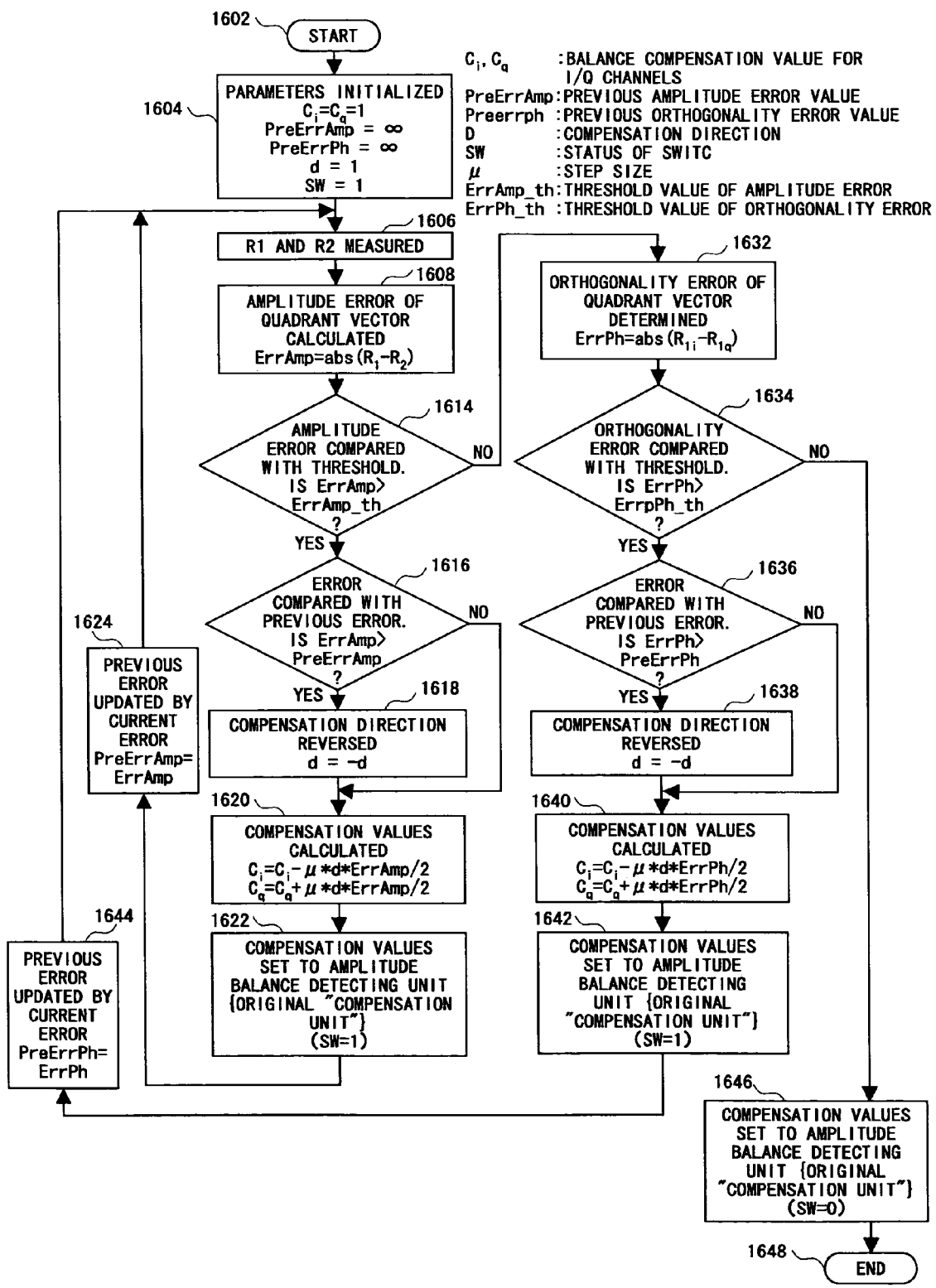
FIG. 16 is a flowchart for adjusting the amplitude balance.

FIG. 16 is a flowchart for adjusting the amplitude balance. The process starts at 1602 and progresses to Step 1604. At Step 1604, various parameters such as amplitude balance compensation values Ci and Cq, a switch position SW, a step size μ, a previous amplitude error value PreErrAmp, and a threshold value for average amplitude error Err_th are initialized. In the present example, the amplitude balance compensation values Ci and Cq for the inphase signal component and the orthogonal signal component, respectively, are set at 1. A great value is set to the previous amplitude error value PreErrAmp and the previous phase error value PreErrPh. The compensation direction d is set as +1, in which case, Ci is increased while Cq is reduced. When d is set as −1, Ci is reduced while Cq is increased.

At Step 1606, the average amplitude vectors r1, r2, r3, and r4 are calculated by the quadrant averaging unit 1524. Further, the first and second compounded vectors R1 and R2 are calculated according to the following formulas.

$$R1=(r1-r3)/2$$

$$R2=(r2-r4)/2$$

At Step 1608, ErrAmp is obtained as an absolute value of the amplitude difference between R1 and R2, i.e., ErrAmp=Abs(R1−R2), by the amplitude balance compensation value calculating unit 1526.

At Step 1614, whether the amplitude error ErrAmp is greater than a predetermined threshold ErrAmp_th is determined. If the determination is affirmative, the process progresses to Step 1616.

At Step 1616, whether the amplitude error ErrAmp is greater than or equal to the last error PreErrAmp is determined. If the determination is affirmative, the process progresses to Step 1618, where the value of the compensation direction d is changed, and the process progresses to Step 1620. If the determination at Step 1616 is negative, the process progresses to Step 1620.

At Step 1620, the amplitude balance compensation values Ci and Cq are updated. According to the present embodiment, the amplitude balance compensation values Ci and Cq are updated such that the difference between Ci and Cq is changed by an amount equal to $\mu \cdot$ErrAmp.

At Step 1622, the updated amplitude balance compensation values Ci and Cq are set to the amplitude balance detecting unit 1522.

At Step 1624, the amplitude error ErrAmp is set as the value of the previous amplitude error PreErrAmp, and the process returns to Step 1606. Henceforth, the same operation as described above follows.

At Step 1614, if the amplitude error ErrAmp is determined to be less than or equal to the predetermined threshold ErrAmp_th, the process progresses to Step 1632.

At Step 1632, an absolute value of a phase difference between $R1_i$ and $R1_q$ is calculated, and made a phase error ErrPh, namely, ErrPh=Abs($R1_i$−$R1_q$) by the amplitude balance compensation value calculating unit 1526. Here, $R1_i$ represents an inphase component and $R1_q$ represents an orthogonal component of the vector along one of the main axes of the ellipse. In the case such as shown at (D) of FIG. 14, the process comes to Step 1632.

At Step 1634, whether the phase error ErrPh is greater than a predetermined threshold ErrPh_th is determined. If the determination is affirmative, the process progresses to Step 1636.

At Step 1636, whether the phase error ErrPh is greater than or equal to the previous error PreErrPh is determined. If the determination is affirmative, the process progresses to Step 1638, where the value of the compensation direction d is changed, and the process progresses to Step 1640. If the determination at Step 1636 is negative, the process progresses directly to Step 1640.

At Step 1640, the amplitude balance compensation values Ci and Cq are updated. According to the present embodiment, the amplitude balance compensation values Ci and Cq are updated such that the difference between Ci and Cq become greater by an amount equal to $\mu \cdot$ErrPh.

At Step 1642, the updated amplitude balance compensation values Ci and Cq are set to the amplitude balance detecting unit 1522.

At Step 1644, the phase error ErrPh is set as the value of the previous phase error PreErrPh. The process returns to Step 1606, and henceforth the same operation as described above follows.

At Step 1634, if the phase error ErrPh is determined to be less than or equal to the predetermined threshold ErrPh_th, the process progresses to Step 1646.

At Step 1646, the switches 1528 and 1530 are turned to the side "0" such that the outputs of the amplitude balance compensation value calculating unit 1526 are provided to the compensation circuit 1502. Then, the process progresses to Step 1648, where the process for adjusting the amplitude balance ends.

According to the present embodiment, |R| and |R2| are made substantially equal to each other before R1 and R2 are orthogonally placed. The sequence is not essential to the present invention, and can be reversed.

Figure 17:
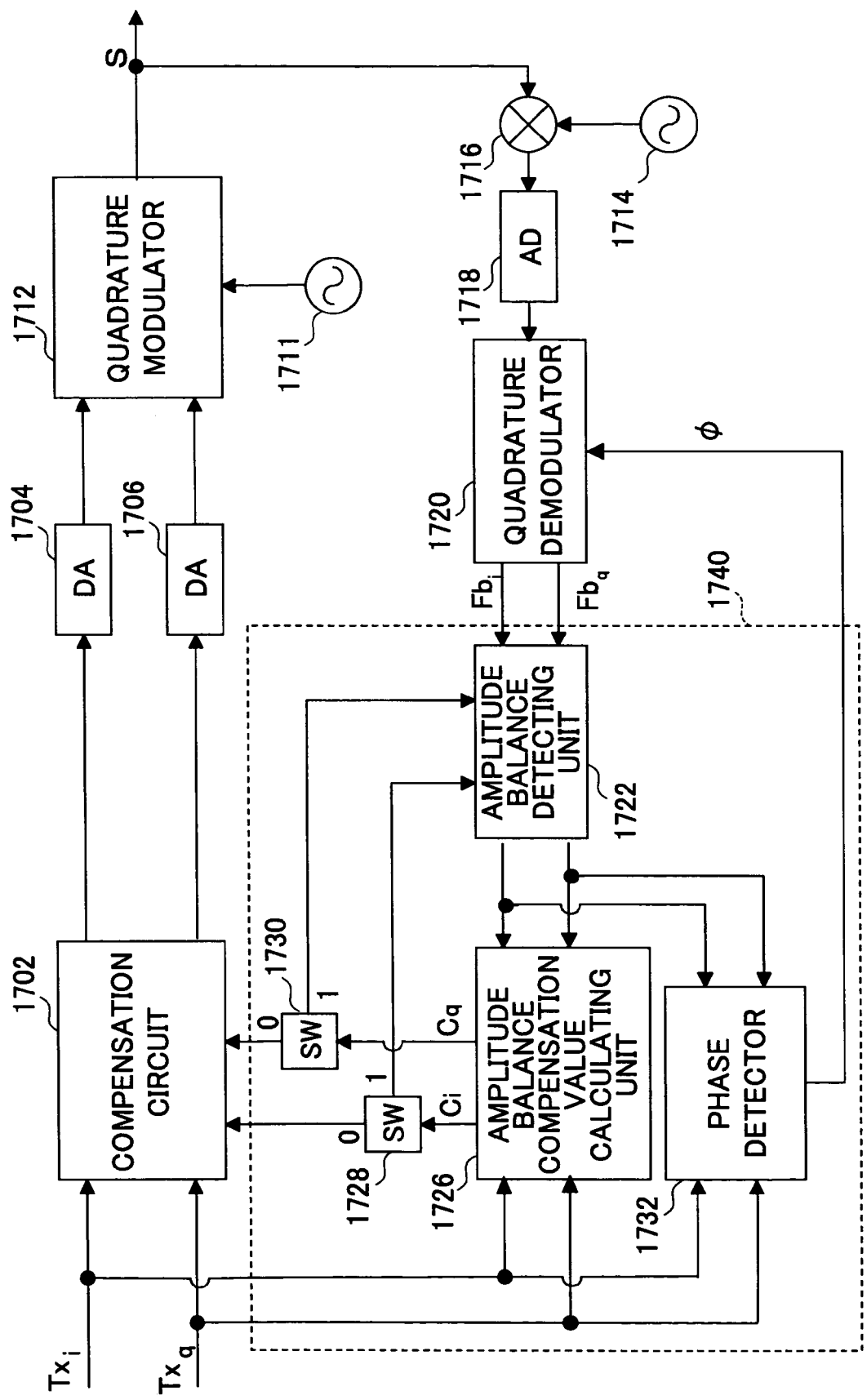
FIG. 17 is a block diagram of the quadrature modulation system according to an embodiment of the present invention.

FIG. 17 is a block diagram of the quadrature modulation system according to another embodiment of the present invention. The quadrature modulation system includes a compensation circuit 1702, digital-to-analog converters 1704 and 1706, and a quadrature modulator 1712 connected to a local oscillator 1711. The quadrature modulation system includes a multiplying unit 1716 connected to the local oscillator 1714, an analog-to-digital converter 1718, and a quadrature demodulator 1720 in the feedback path. The quadrature modulation system includes an amplitude difference calculating unit 1740 that further includes an amplitude balance detecting unit 1722, an amplitude balance compensation value calculating unit 1726, and switches 1728 and 1730. Furthermore, the quadrature modulation system includes a phase detector 1732.

The digital-to-analog converters 1704 and 1706 convert the inphase signal component and the orthogonal signal component, respectively, from digital to analog format. The quadrature modulator 1712 combines the inphase signal component and the orthogonal signal component that are provided by the respective digital-to-analog converters, and outputs the output signal S. The multiplying unit 1716 multiplies the output signal S and a signal from the local oscillator 1714, wherein down conversion is carried out. The analog-to-digital converter 1718 converts the down-converted signal, which is an analog signal, into a digital signal. The quadrature demodulator 1720 carries out the quadrature demodulation of the output of the analog-to-digital converter 1718, and outputs the inphase signal component $Fb_i$ and the orthogonal signal component $Fb_q$ of the feedback signal.

The amplitude balance detecting unit 1722 provisionally adjusts the amplitudes of the inphase signal component $Fb_i$ and the orthogonal signal component $Fb_q$ of the feedback signal, and outputs $Fb_i$ and $Fb_q$ to the amplitude balance compensation value calculating unit 1726.

The amplitude balance compensation value calculating unit 1726 calculates the amplitude balance compensation values Ci and Cq based on the output from the amplitude balance detecting unit 1722.

The switches 1728 and 1730 are turned to the side "1" until the amplitude balance compensation values Ci and Cq converge such that the outputs from the amplitude balance compensation value calculating unit 1726 are provided to the amplitude balance detecting unit 1722. When the amplitude balance compensation values Ci and Cq converge, the switches 1728 and 1730 are turned to the side "0" such that the outputs from the amplitude balance compensation value calculating unit 1726 are provided to the compensation circuit 1702.

The phase detector 1732 compares the digital signal components $Tx_i$ and $Tx_q$ with the feedback signal components $Fb_i$ and $Fb_q$, respectively, and obtains the phase rotation angle $\phi$ between the digital signal and the feedback signal. The information about the phase rotation angle $\phi$ is provided to the quadrature demodulator 1720 such that the phase rotation between both signals is compensated for.

Figure 18:
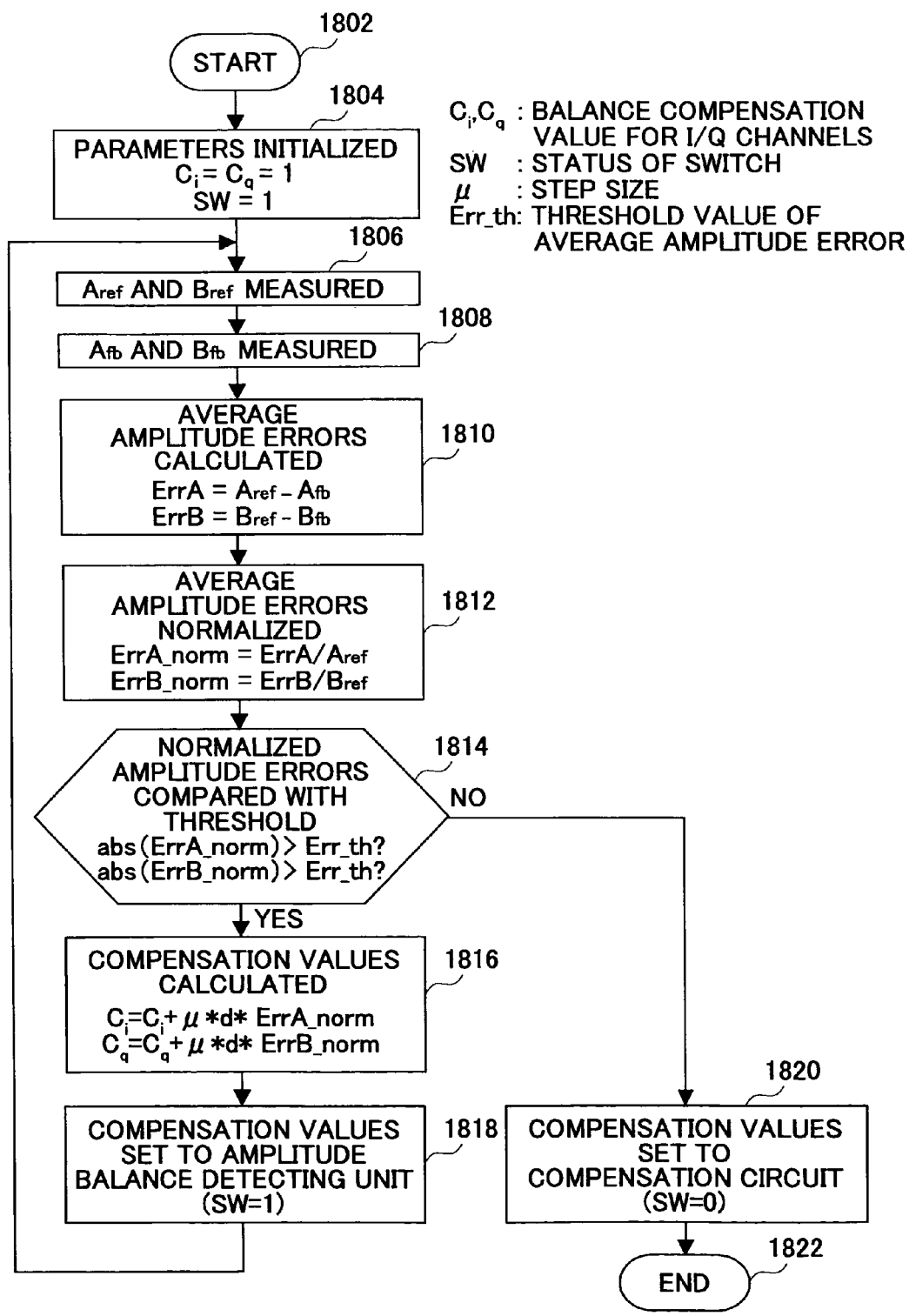
FIG. 18 is a flowchart for adjusting the amplitude balance.

FIG. 18 is a flowchart for adjusting the amplitude balance. The process starts at 1802 and progresses to Step 1804. At Step 1804, various parameters such as a switch position SW, a step size μ, and a threshold value for average amplitude error Err_th are initialized. In the present example, the amplitude balance compensation values Ci and Cq for the inphase signal component and the orthogonal signal component, respectively, are set at 1.

At Step 1806, the average amplitude of the inphase signal component $Tx_i$ and the orthogonal signal component $Tx_q$ before quadrature modulation are measured, serving as $A_{ref}$ and $B_{ref}$, respectively.

At Step 1808, the average amplitude of the inphase signal component $Fb_i$ and the orthogonal signal component $Fb_q$ of the feedback signal are measured, serving as $A_{fb}$ and $B_{fb}$, respectively.

At Step 1810, an average amplitude error $ErrA = A_{ref} - A_{fb}$ of the inphase signal components is calculated. Further, an average amplitude error $ErrB = B_{ref} - B_{fb}$ of the orthogonal signal component is also calculated.

At Step 1812, the average amplitude errors ErrA and ErrB are normalized based on the amplitude values $A_{ref}$ and $B_{ref}$, respectively. The normalized values are called ErrA_norm and ErrB_norm, respectively.

At Step 1814, whether the absolute value of the normalized amplitude error ErrA_norm is greater than a predetermined threshold Err_th is determined. Further, whether the absolute value of the normalized amplitude error ErrB_norm is greater than the predetermined threshold Err_th is determined. If at least one of the absolute values of the normalized amplitude error is determined to be greater than the threshold, the process progresses to Step 1816.

At Step 1816, the amplitude balance compensation values Ci and Cq are updated. According to the present embodiment, the amplitude balance compensation value Ci for the inphase signal component is changed by an amount equal to μ·ErrA_norm, and the amplitude balance compensation value Cq for the orthogonal signal component is changed by an amount equal to μ·ErrB. Nevertheless, it is also possible to update the amplitude balance compensation values by other methods.

At Step 1818, the updated amplitude balance compensation values Ci and Cq are set to the amplitude balance detecting unit 1722, and the process returns to Step 1806. Henceforth, the same operation as described above follows.

At Step 1814, if the normalized amplitude error is determined to be less than or equal to the predetermined threshold Err_th, the process progresses to Step 1820.

At Step 1820, the switches 1728 and 1730 are turned to the side "0" such that the outputs of the amplitude balance compensation value calculating unit 1726 are provided to the compensation circuit 1702. Then, the process progresses to Step 1822 for ending the amplitude balance adjustment.

Figure 19:
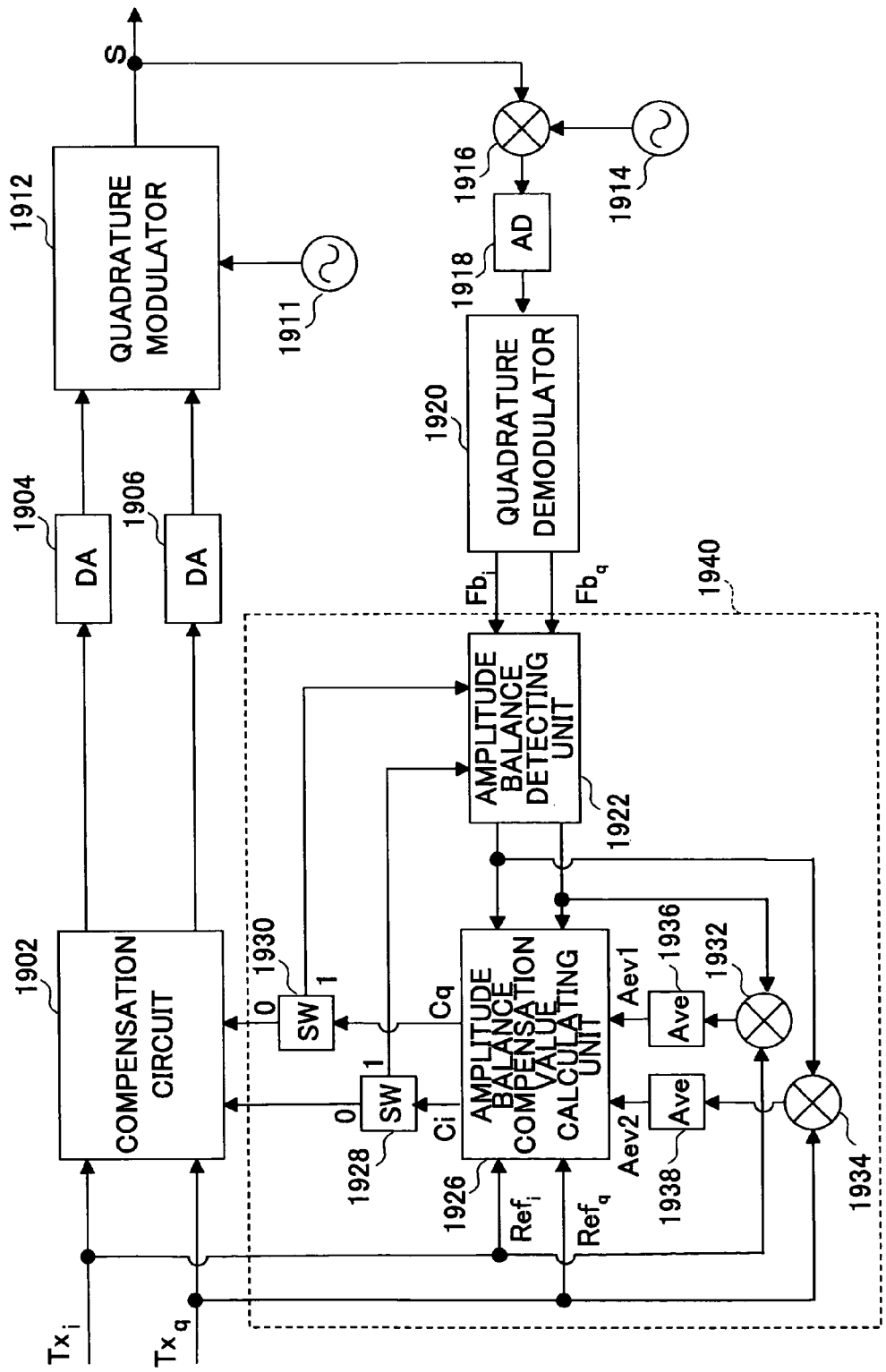
FIG. 19 is a block diagram of the quadrature modulation system according to an embodiment of the present invention.

FIG. 19 is a block diagram of the quadrature modulation system according to another embodiment of the present invention. The quadrature modulation system includes a compensation circuit 1902, digital-to-analog converters 1904 and 1906, and a quadrature modulator 1912 connected to a local oscillator 1911. The quadrature modulation system includes a multiplying unit 1916 connected to the local oscillator 1914, an analog-to-digital converter 1918, and a quadrature demodulator 1920. The quadrature modulation system includes an amplitude difference calculating unit 1940 that includes an amplitude balance detecting unit 1922, an amplitude balance compensation value calculating unit 1926, switches 1928 and 1930, multiplying units 1932 and 1934, and averaging units (Ave) 1936 and 1938.

The digital-to-analog converters 1904 and 1906 convert the inphase signal component and the orthogonal signal component, respectively, from digital to analog format. The quadrature modulator 1912 combines the inphase signal component and the orthogonal signal component that are provided by the respective digital-to-analog converters, and outputs the output signal S. The multiplying unit 1916 multiplies the output signal S and a signal from the local oscillator 1914, wherein down conversion is carried out. The analog-to-digital converter 1918 converts the down-converted signal, which is an analog signal, into a digital signal. The quadrature demodulator 1920 carries out the quadrature demodulation of the output of the analog-to-digital converter 1918, and outputs the inphase signal component $Fb_i$ and the orthogonal signal component $Fb_q$ of the feedback signal.

The amplitude balance detecting unit 1922 provisionally adjusts the amplitudes of the inphase signal component $Fb_i$ and the orthogonal signal component $Fb_q$ of the feedback signal, and outputs the signal components $Fb_i$ and $Fb_q$ to the amplitude balance compensation value calculating unit 1926.

The amplitude balance compensation value calculating unit 1926 calculates the amplitude balance compensation values Ci and Cq based on the outputs from the amplitude balance detecting unit 1922.

The switches 1928 and 1930 are turned to the side "1" until the amplitude balance compensation values Ci and Cq converge such that the outputs from the amplitude balance compensation value calculating unit 1926 are provided to the amplitude balance detecting unit 1922. When the amplitude balance compensation values Ci and Cq converge, the switches 1928 and 1930 are turned to the side "0" such that the outputs from the amplitude balance compensation value calculating unit 1926 are provided to the compensation circuit 1902.

The multiplying unit 1932 multiplies the inphase signal component $Tx_i$ before quadrature modulation as a reference signal $Ref_i$, and the orthogonal signal component $Fb_q$ of the feedback signal. The product is equalized by the averaging unit 1936, and is output as a first average Ave1.

The multiplying unit 1934 multiplies the orthogonal signal component $Tx_q$ before quadrature modulation as a reference signal $Ref_q$, and the inphase signal component $Fb_i$ of the feedback signal. The product is equalized by the averaging unit 1938, and is output as a second average Ave2.

Next, the principle of operation of the present embodiment is explained. The inphase component $Fb_i$ and the orthogonal component $Fb_q$ of a demodulated signal Fb in the baseband band obtained from the feedback signal are expressed by the following formula, where φ represents the phase rotation of the feedback signal.

$$Fb_i = A \cdot Ref_i \cdot \cos\phi + B \cdot Ref_q \cdot \sin\phi$$

$$Fb_q = A \cdot Ref_i \cdot \sin\phi - B \cdot Ref_q \cdot \cos\phi$$

Here, A and B represent the inphase signal component and the orthogonal signal component, respectively, of the measured amplitude values. If it is assumed that the inphase signal component and the orthogonal signal component are not correlating, the first average $Ave1 = E[Fb_q \cdot Ref_i]$ of the products of the orthogonal signal component $Fb_q$ of the feedback signal and the inphase signal component $Ref_i$ before the quadrature modulation can be approximated as follows. Here and elsewhere, E[ ] is an expression of equalization, and is obtained by dividing a value totaled by the integrator by a suitable factor.

$$Ave1 = E[Fb_q \cdot Ref_i]$$
$$= A \cdot E[Ref_i^2] \cdot \sin\phi - B \cdot E[Ref_i \cdot Ref_q] \cdot \cos\phi$$
$$\approx A \cdot P_{\text{ref\_i}} \cdot \sin\phi$$

Similarly, the second average $Ave2=E[Fb_i \cdot Ref_q]$ of the product of the inphase signal component $Fb_i$ of the feedback signal and the orthogonal signal component $Ref_q$ before the quadrature modulation can be approximated as follows.

$$Ave2=E[Fb_i \cdot Ref_q]=A \cdot E[Ref_i Ref_q] \cdot \cos\phi + B \cdot E[Ref_q^2] \cdot \sin\phi \approx B \cdot P_{\text{ref\_q}} \cdot \sin\phi$$

Here, $P_{ref\_i}$ and $P_{ref\_q}$ represent average power of the inphase and the orthogonal signal components, respectively, before quadrature modulation. Then, a ratio of $(Ave1 \cdot P_{ref\_q})/(Ave2 \cdot P_{ref\_i})$ is considered. The ratio is expressed as follows.

$$\frac{Ave1 * P_{\text{Ref\_q}}}{Ave2 * P_{\text{Ref\_i}}} = \frac{(A * P_{\text{Ref\_i}} * \sin\phi) * P_{\text{Ref\_q}}}{(B * P_{\text{Ref\_q}} * \sin\phi) * P_{\text{Ref\_i}}} = \frac{A}{B} \quad \text{[Equation 3]}$$

Namely, the ratio provides a measure of the amplitude balance. If the ratio is close to 1, the amplitude balance is proper, and as the ratio departs from 1, amplitude imbalance increases. In the present embodiment, the ratio is calculated, and the amplitudes of the inphase signal component and the orthogonal signal component are adjusted such that the ratio approach 1.

Figure 20:
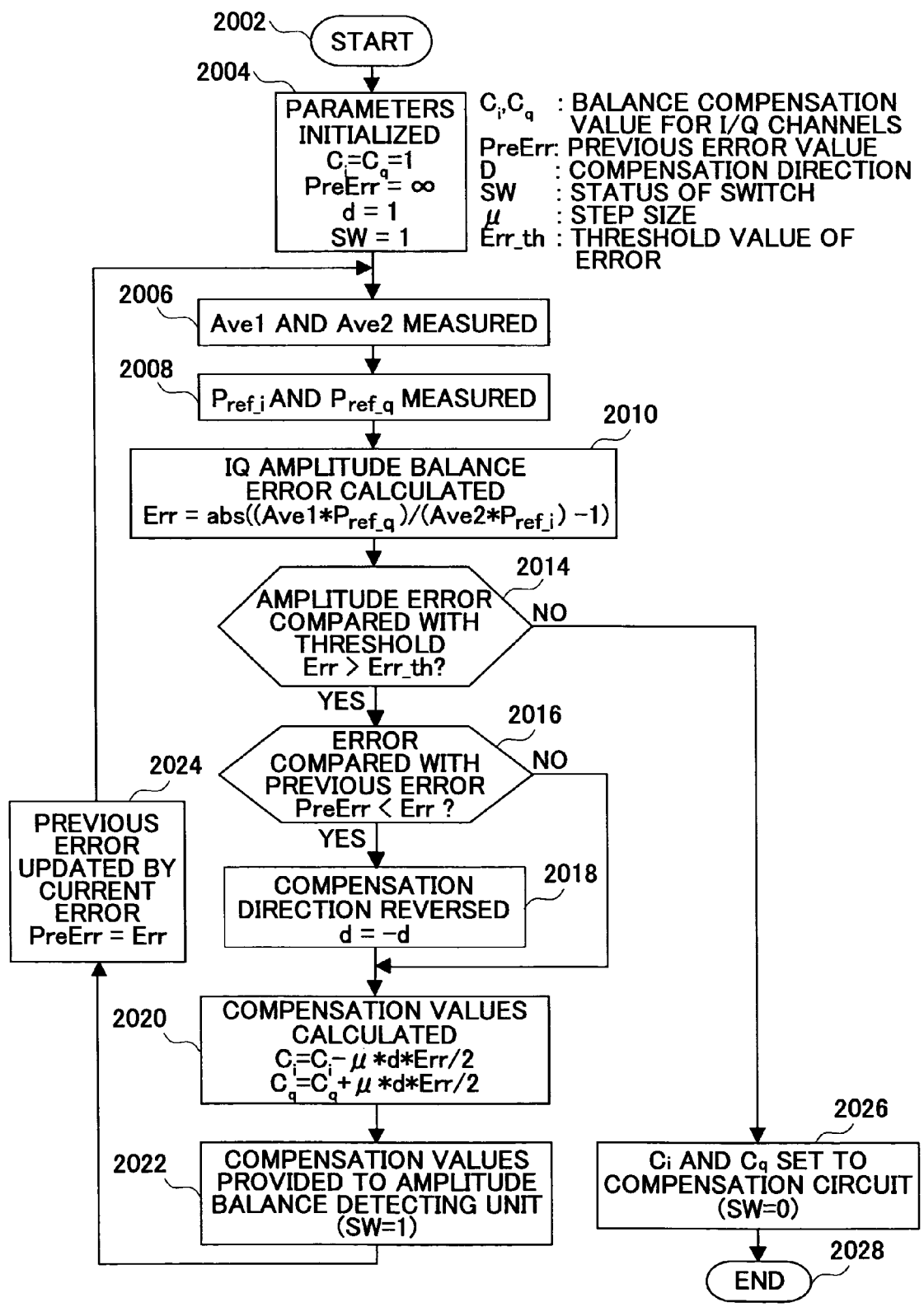
FIG. 20 is a flowchart for adjusting the amplitude balance.

FIG. 20 is a flowchart for adjusting the amplitude balance. The process starts at Step 2002, and progresses to Step 2004. At Step 2004, various parameters such as a previous balance error amount PreErr, a direction d of compensation, a step size μ, and a threshold value for the balance error Err_th are initialized. In the present example, the amplitude balance compensation values Ci and Cq of the inphase signal component and the orthogonal signal component, respectively, are set at 1. A great value is set to the previous error PreErr. The compensation direction d, which can take one of the values +1 and −1, is set at +1.

At Step 2006, the first average Ave1 and the second average Ave2 are calculated.

At Step 2008, the inphase average power $P_{ref\_i}$ and the orthogonal average power $P_{refq}$ before the quadrature modulation are measured.

At Step 2010, the error Err is calculated according to the following formula.

$$Err=Abs((Ave1 \cdot P_{ref\_q})/(Ave2 \cdot P_{ref\_i})-1)$$

At Step 2014, whether the error Err is greater than a predetermined threshold Err_th is determined. If the determination is affirmative, the process progresses to Step 2016.

At Step 2016, whether the error Err is greater than or equal to the previous error PreErr is determined. If the determination is affirmative, the process progresses to Step 2018, where the value of the compensation direction d is changed, and the process progresses to Step 2020. If the determination at Step 2016 is negative, the process progresses directly to Step 2020.

At Step 2020, the amplitude balance compensation values Ci and Cq are updated. In the present embodiment, the amplitude balance compensation values Ci and Cq are updated such that the difference between Ci and Cq is made greater by an amount equal to μ·Err.

At Step 2022, the updated amplitude balance compensation values Ci and Cq are set to the amplitude balance detecting unit 1922.

At Step 2024, the error Err is set as the value of the previous error PreErr, and the process returns to Step 2006. Henceforth, the same operation as described above follows.

At Step 2014, if the error Err is determined to be less than or equal to the predetermined threshold Err_th, the process progresses to Step 2026.

At Step 2026, the switches 1928 and 1930 are turned to the side "0" such that the outputs of the amplitude balance compensation value calculating unit 1926 are provided to the compensation circuit 1902. Then, the process progresses to Step 2028 for completing the amplitude balance adjustment.

Figure 21:
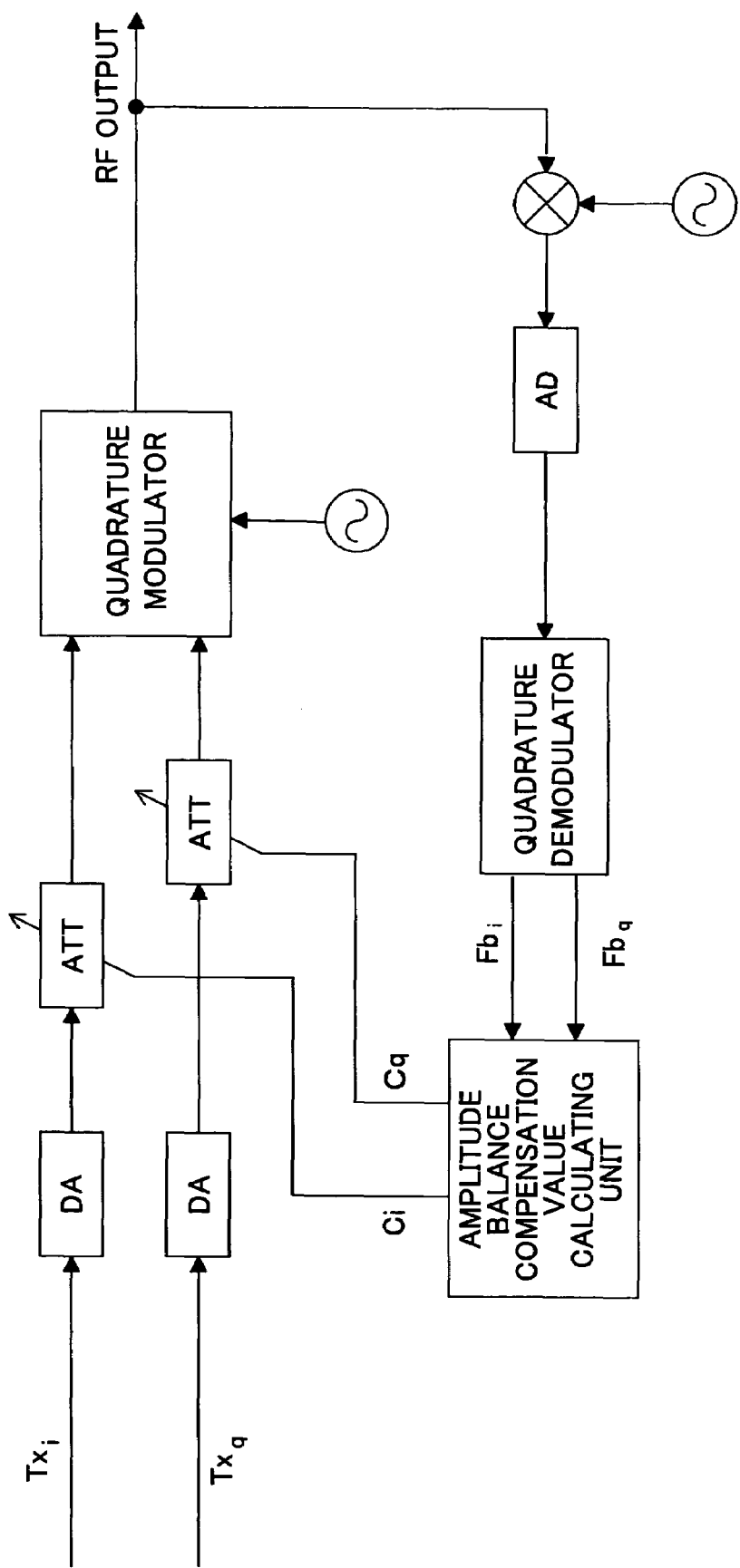
FIG. 21 is a block diagram of a variation to the compensation circuit.

Here, the amplitude balance compensation values Ci and Cq may be provided to the digital signals as shown by FIG. 12, or alternatively, to the analog signals as shown in FIG. 21.

Embodiment 3

Hereafter, Embodiment 3 is explained, wherein the image signal component is reduced by adjusting a deviance of the orthogonality relation between the real axis and the imaginary axis (angle deflection or orthogonality deflection). First, an outline about the orthogonality deflection is described.

At (A) of FIG. 22, a locus of the averages of the signal points that are present in minute unit angles of 0-360 degrees is shown, which represents the case wherein the inphase signal component and the orthogonal signal component are properly output. In this case, the real axis and the imaginary axis are in orthogonal relation. In contrast, at (B) of FIG. 22, the real axis Re and the imaginary axis Im cross at an angle different from 90 degrees by θ. In this case, the inphase signal component I and the orthogonal signal component Q are distorted, and are respectively expressed by the following formulas.

$$I'=I-Q \cdot \sin\theta$$

$$Q'=Q \cdot \cos\theta$$

Due to the distortion, the locus of the signal points on a signal point arrangement plan (constellation) forms an ellipse, and the output signal S is distorted. In addition, it should be noted that the phase rotation angle φ discussed in reference to FIGS. 2, 5, 11, 14, and 17 refers to the phase rotation around the origin of the feedback signal with the real axis and the imaginary axis being kept at 90 degrees.

Figure 23:
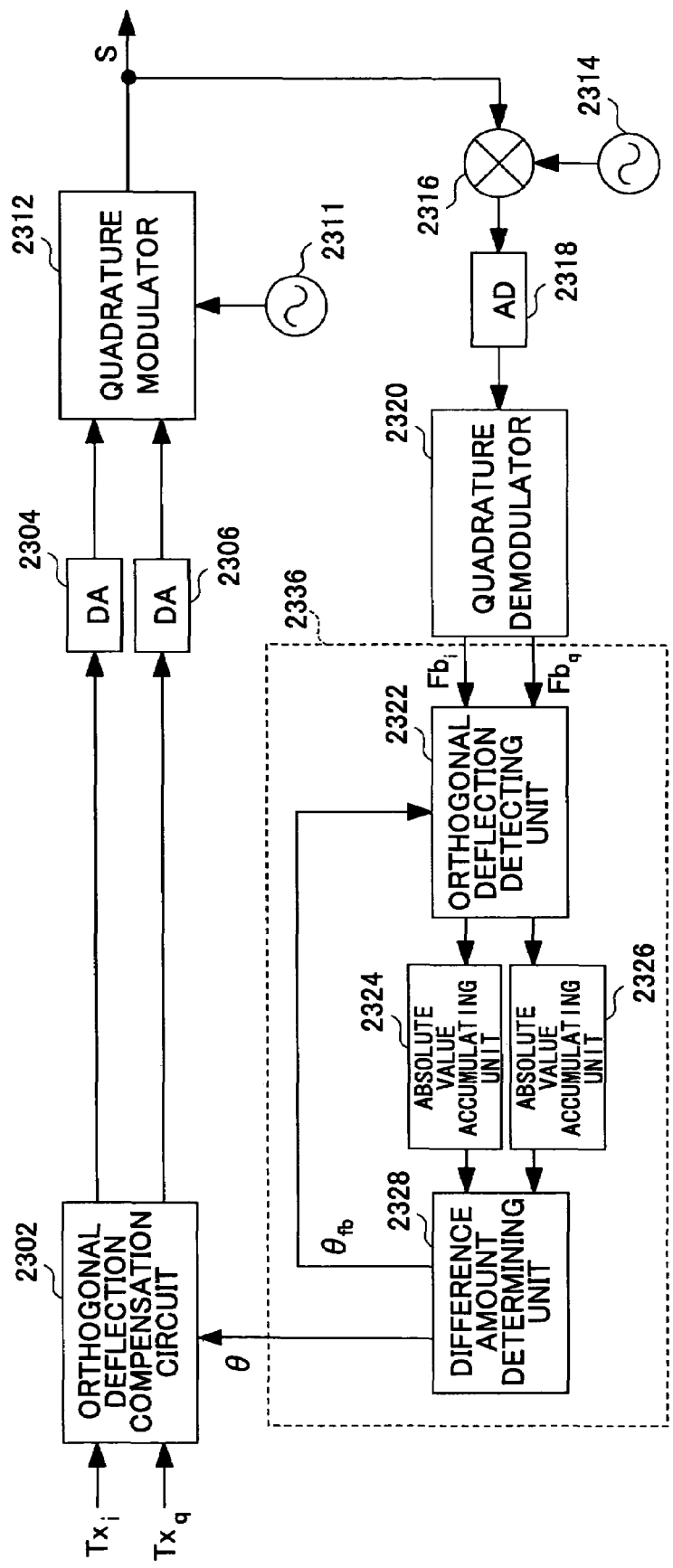
FIG. 23 is a block diagram of the quadrature modulation system according to an embodiment of the present invention.

FIG. 23 is a block diagram of the quadrature modulation system according to Embodiment 3. The quadrature modulation system includes an orthogonality deflection compensation circuit 2302, digital-to-analog converters 2304 and 2306, and a quadrature modulator 2312 connected to a local oscillator 2311. The quadrature modulation system includes a multiplying unit 2316 connected to the local oscillator 2314, an analog-to-digital converter 2318, and a quadrature demodulator 2320. The quadrature modulation system includes an angle deflection calculating unit 2336 that includes an orthogonality deflection detecting unit 2322, absolute value accumulating units 2324 and 2326, and an difference amount determining unit 2328.

The digital-to-analog converters 2304 and 2306 convert the inphase signal component and the orthogonal signal component, respectively, of a digital format into analog format. The quadrature modulator 2312 combines the inphase signal component and the orthogonal signal component that are provided by the respective digital-to-analog converters, and outputs the output signal S. The multiplying unit 2316 multiplies the output signal S and a signal from the local oscillator 2314, wherein down conversion is carried out. The analog-to-digital converter 2318 converts the down-converted signal, which is an analog signal, into a digital signal. The quadrature demodulator 2320 carries out the quadrature demodulation of the output of an analog-to-digital converter 2318, and outputs the inphase signal component $Fb_i$ and the orthogonal signal component $Fb_q$ of the feedback signal.

The orthogonality deflection detecting unit 2322 provisionally adjusts the angle deflection of the inphase signal component $Fb_i$ and the orthogonal signal component $Fb_q$ of the feedback signal components, and outputs the signal components to the absolute value accumulating unit 2324 and 2326, respectively.

The absolute value accumulating unit 2324 takes in and totals the absolute value of the inphase signal component $Fb_i$ of the feedback signal, and outputs the total as a first cumulative total. Further, the absolute value accumulating unit 2326 takes in and totals the absolute value of the orthogonal signal component $Fb_q$ of the feedback signal, and outputs the total as a second cumulative total.

The difference amount determining unit 2328 calculates an orthogonality deflection $\theta_{fb}$ based on the first and second cumulative totals obtained from the absolute value accumulating units 2324 and 2326. Eventually, the orthogonality deflection $\theta_{fb}$ becomes the orthogonality deflection $\theta$, which is provided to the orthogonality deflection compensation circuit 2302.

Figure 24:
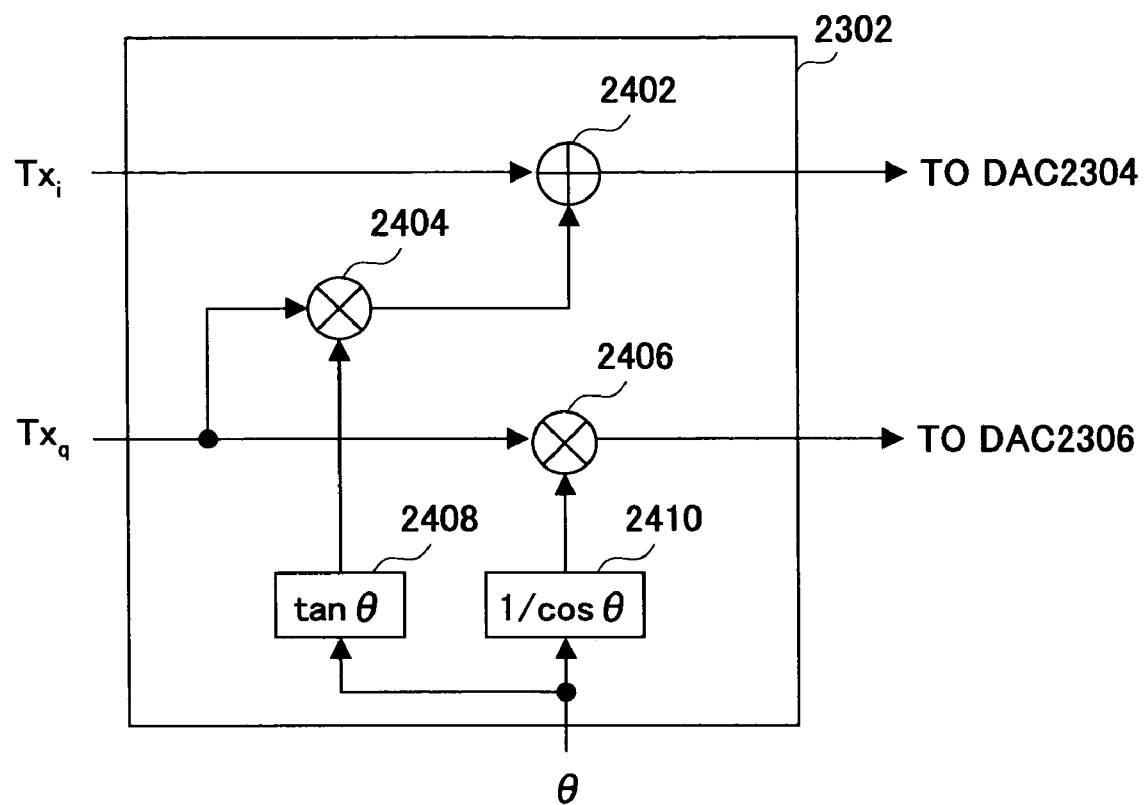
FIG. 24 is a block diagram showing an example of an orthogonality deflection compensation circuit.

FIG. 24 is a block diagram showing an example of the orthogonality deflection compensation circuit 2302. The orthogonality deflection compensation circuit 2302 includes an adder 2402, multiplying units 2404 and 2406, and coefficient multiplying units 2408 and 2410. The adder 2402 outputs a sum of the inphase signal component $Tx_i$ and the output of the multiplying unit 2404. The multiplying unit 2404 outputs a product of the orthogonal signal component $Tx_q$ and the output of the coefficient multiplying unit 2408. The multiplying unit 2406 outputs a product of the orthogonal signal component $Tx_q$ and the output of the coefficient multiplying unit 2410. The coefficient multiplying unit 2408 outputs $\tan \theta$ based on the angle deflection $\theta$ which is the output from the difference amount determining unit 2328. The coefficient multiplying unit 2410 outputs $1/\cos \theta$ based on the angle deflection $\theta$, which is the output from the difference amount determining unit 2328.

The output of the adder 2402 is equal to $Tx_i + Tx_q \cdot \tan \theta$, which is provided to the digital-to-analog converter 2304. The output of the multiplying unit 2406 is equal to $Tx_q/\cos \theta$, which is provided to the digital-to-analog converter 2306. These signals are subjected to the distortion as explained with reference to FIG. 22. The inphase signal component provided to the digital-to-analog converter 2304 is subjected to the distortion, and becomes as expressed by the following formula.

$$(Tx_i + Tx_q \cdot \tan\theta) - (Tx_q/\cos\theta) \cdot \sin\theta = Tx_i$$

That is, the orthogonality deflection is removed. The orthogonal signal component provided to the digital-to-analog converter 2306 receives the distortion, and becomes as expressed by the following formula.

$$(Tx_q/\cos\theta) \cdot \cos\theta = Tx_q$$

That is, the orthogonality deflection is removed.

In addition, although the real axis is fixed, and the imaginary axis is considered to be in error by $\theta$ in describing the present embodiment with reference to FIG. 22, the present invention is not limited to this, but a variation wherein the real axis is deflected is possible.

Figure 25:
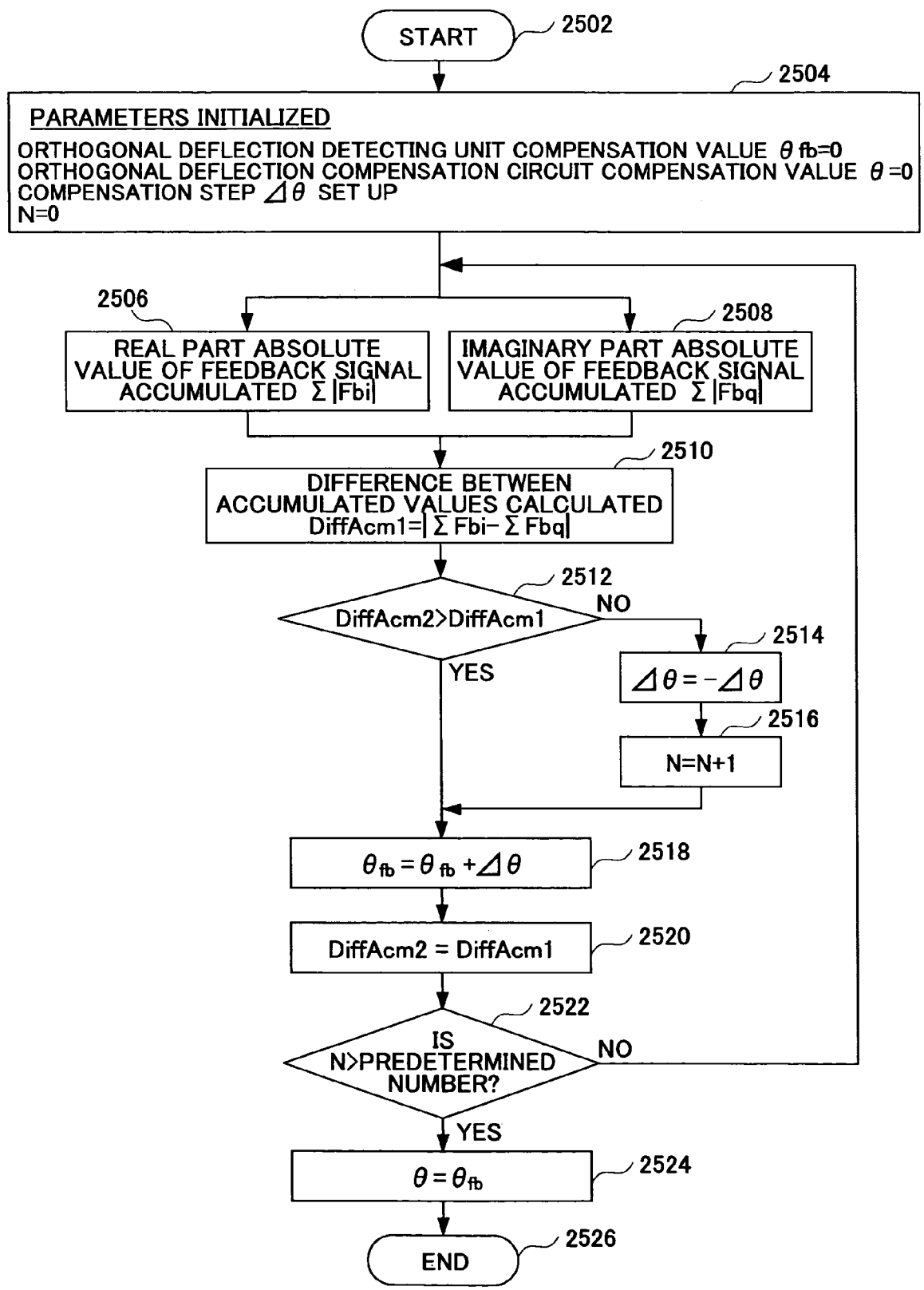
FIG. 25 a flowchart for adjusting an orthogonality deflection.

FIG. 25 is a flowchart for adjusting the angle deflection between the real axis and the imaginary axis. The process starts at Step 2502 and progresses to Step 2504. At Step 2504, various parameters are initialized. Namely, the compensation angle $\theta_{fb}$ for the orthogonality deflection detecting unit 2322, and the compensation angle $\theta$ for the orthogonality deflection compensation circuit 2302 are set at zero. A parameter N for determining convergence is set at zero. Further, an amount of change $\Delta\theta$ when updating the compensation angle is set at a suitable value.

At Step 2506, a cumulative total of the absolute value of the real part $Fb_i$ of the feedback signal is calculated as the first accumulation value.

At Step 2508, a cumulative total of the absolute value of the imaginary part $Fb_q$ of the feedback signal is calculated as the second accumulation value.

At Step 2510, an absolute value of the difference between the first cumulative total and the second cumulative total is calculated as an error DiffAcm1.

At Step 2512, whether the error DiffAcm1 is less than or equal to a previous error DiffAcm2 is determined. If the determination is affirmative, the process progresses to Step 2518. Otherwise, the process progresses to Step 2514.

At Step 2514, the direction (the sign) of the compensation angle $\theta_{fb}$ to be provided to the orthogonality deflection detecting unit 2322 is reversed.

At Step 2516, the value of the parameter N is incremented by 1.

At Step 2518, the compensation angle $\theta_{fb}$ is updated.

At Step 2520, the error DiffAcm1 is set to be the value of the previous error DiffAcm2.

At Step 2522, whether the parameter N is greater than a predetermined value is determined. If the determination is negative, the process returns to Steps 2506 and 2508, and the same process is repeated. If the determination is affirmative, that is, the parameter N is greater than the predetermined value, the process progresses to Step 2524.

At Step 2524, the compensation angle $\theta_{fb}$ provided to the orthogonality deflection detecting unit 2322 is provided as the value of the compensation angle $\theta$ to the orthogonality deflection compensation circuit 2302. The orthogonality deflection is compensated for by the orthogonality deflection compensation circuit 2302 using the compensation angle $\theta = \theta_{fb}$. Then, the process progresses to Step 2526 for ending.

Figure 26:
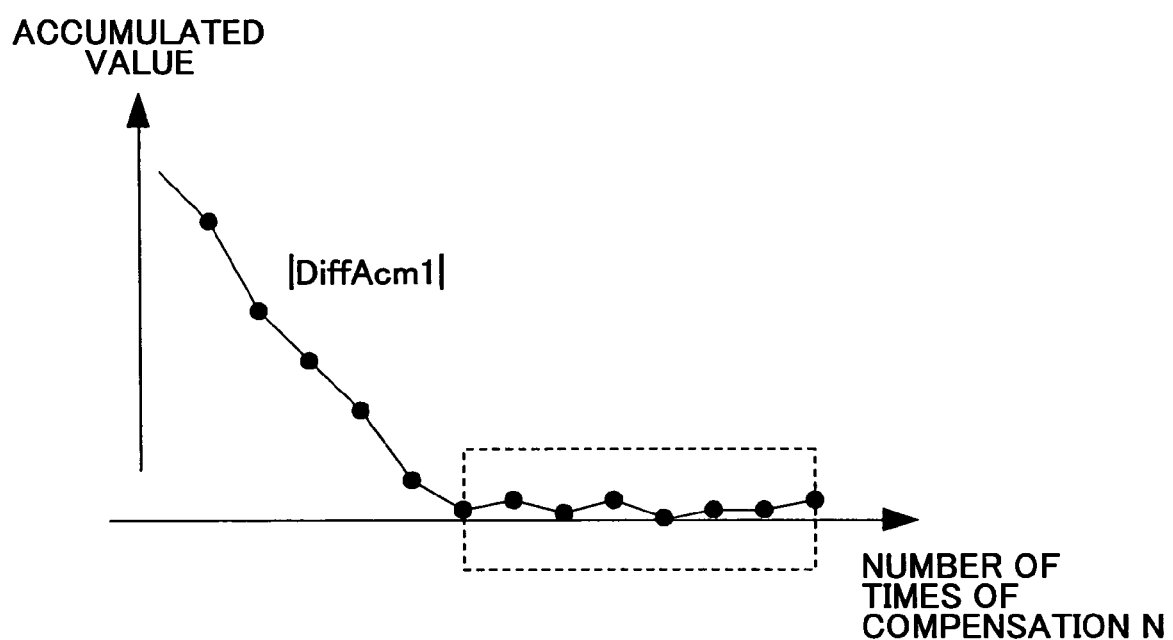
FIG. 26 graphs typical relations between the number of times N of compensation and an accumulative error |DiffAcm1|.

FIG. 26 shows typical relations between the absolute value of the error DiffAcm1 and the number of times N of updating the compensation value. When the absolute value of the error almost converges to a value, the magnitude relations between the absolute value of the error and the value of the previous error frequently change. Accordingly, it is possible to assume that the absolute value of the error is approaching a convergence value by monitoring the value of the parameter N.

Figure 27:
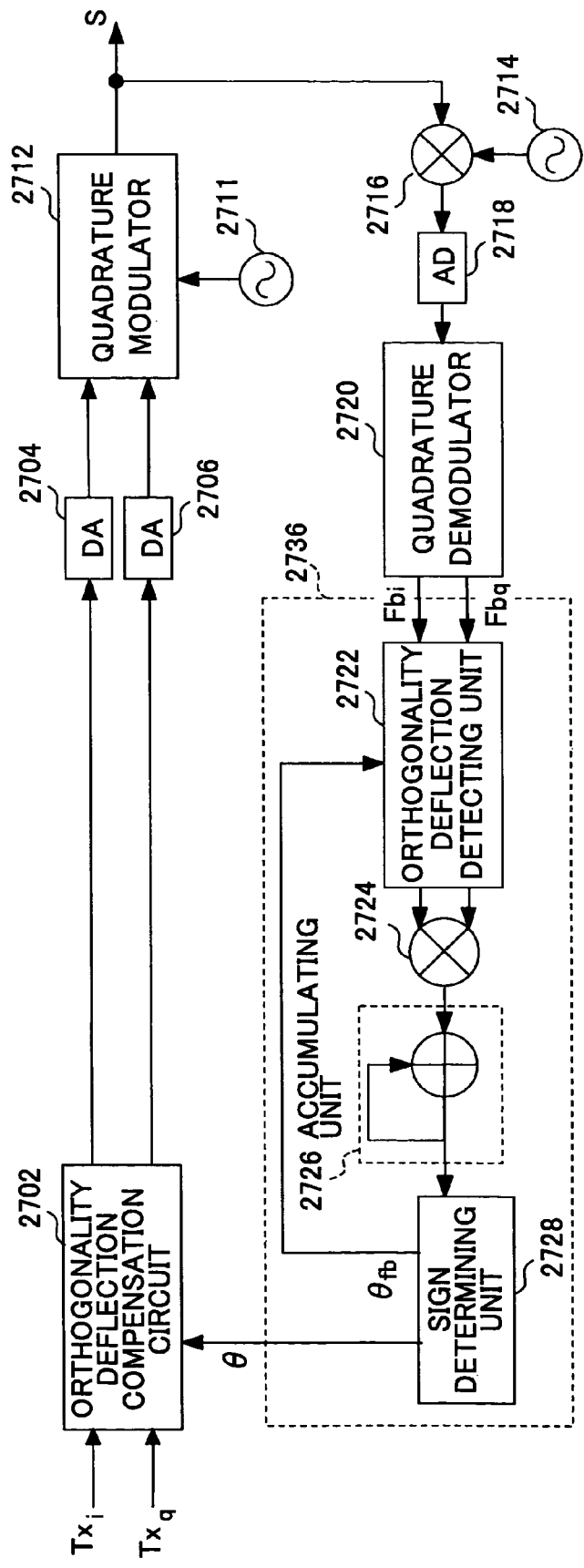
FIG. 27 is a block diagram of the quadrature modulation system according to an embodiment of the present invention.

FIG. 27 is a block diagram of the quadrature modulation system according to another embodiment of the present invention. The quadrature modulation system includes an orthogonality deflection compensation circuit 2702, digital-to-analog converters 2704 and 2706, and a quadrature modulator 2712 connected to a local oscillator 2711. The quadrature modulation system includes a multiplying unit 2716 connected to a local oscillator 2714, an analog-to-digital converter 2718, and a quadrature demodulator 2720. The quadrature modulation system includes an angle deflection calculating unit 2736 that includes an orthogonality deflection detecting unit 2722, a multiplying unit 2724, an accumulating unit 2726, and a sign determining unit 2728.

The digital-to-analog converters 2704 and 2706 convert the inphase signal component and the orthogonal signal component, respectively, from digital to analog format. The quadrature modulator 2712 combines the inphase signal component and the orthogonal signal component that are provided by the respective digital-to-analog converters, and outputs the output signal S. The multiplying unit 2716 multiplies the output signal S and a signal from the local oscillator 2714, wherein down conversion is carried out. The analog-to-digital converter 2718 converts the down-converted signal, which is an analog signal, to a digital signal. The quadrature demodulator 2720 carries out the orthogonal demodulation of the output of the analog-to-digital converter 2718, and outputs the inphase signal component $Fb_i$ and the orthogonal signal component $Fb_q$ of the feedback signal.

The orthogonality deflection detecting unit 2722 provisionally adjusts the angle deflection of the inphase signal component $Fb_i$ and the orthogonal signal component $Fb_q$ of the feedback signal, and provides $Fb_i$ and $Fb_q$ to the multiplying unit 2724.

The multiplying unit 2724 calculates a product of the inphase signal component $Fb_i$ and the orthogonal signal component $Fb_q$ of the feedback signal.

The accumulating unit 2726 totals the output products of the multiplying unit 2724.

The sign determining unit 2728 calculates orthogonality deflection $\theta_{fb}$ based on the accumulative total of the product of the inphase signal component $Fb_i$ and the orthogonal signal component $Fb_q$. Eventually, the orthogonality deflection $\theta_{fb}$ becomes the orthogonality deflection $\theta$ to be provided to the orthogonality deflection compensation circuit 2702.

Hereafter, the principle of operation of the present embodiment is explained. A demodulated baseband signal Fb is obtained from the feedback signal, and is expressed by the following formula.

$$Fb_i = Tx_i \cdot \cos\phi + Tx_q \cdot \sin(\theta - \phi)$$

$$Fb_q = Tx_i \cdot \sin\phi - Tx_q \cdot \cos(\theta - \phi)$$

Here, $\theta$ represents the orthogonality deflection between the real axis and the imaginary axis, and $\phi$ represents the phase rotation angle of the feedback signal. The product of the inphase signal component $Fb_i$ of a feedback signal and the orthogonal signal component $Fb_q$ is expressed by the following formula.

$$Fb_i \cdot Fb_q = Tx_i \cdot Tx_q \cdot \cos(2\phi - \theta) + (1/2)Tx_i^2 \cdot \sin 2\phi + (1/2)Tx_q^2 \cdot \sin(2\theta - 2\phi)$$

Figure 28:
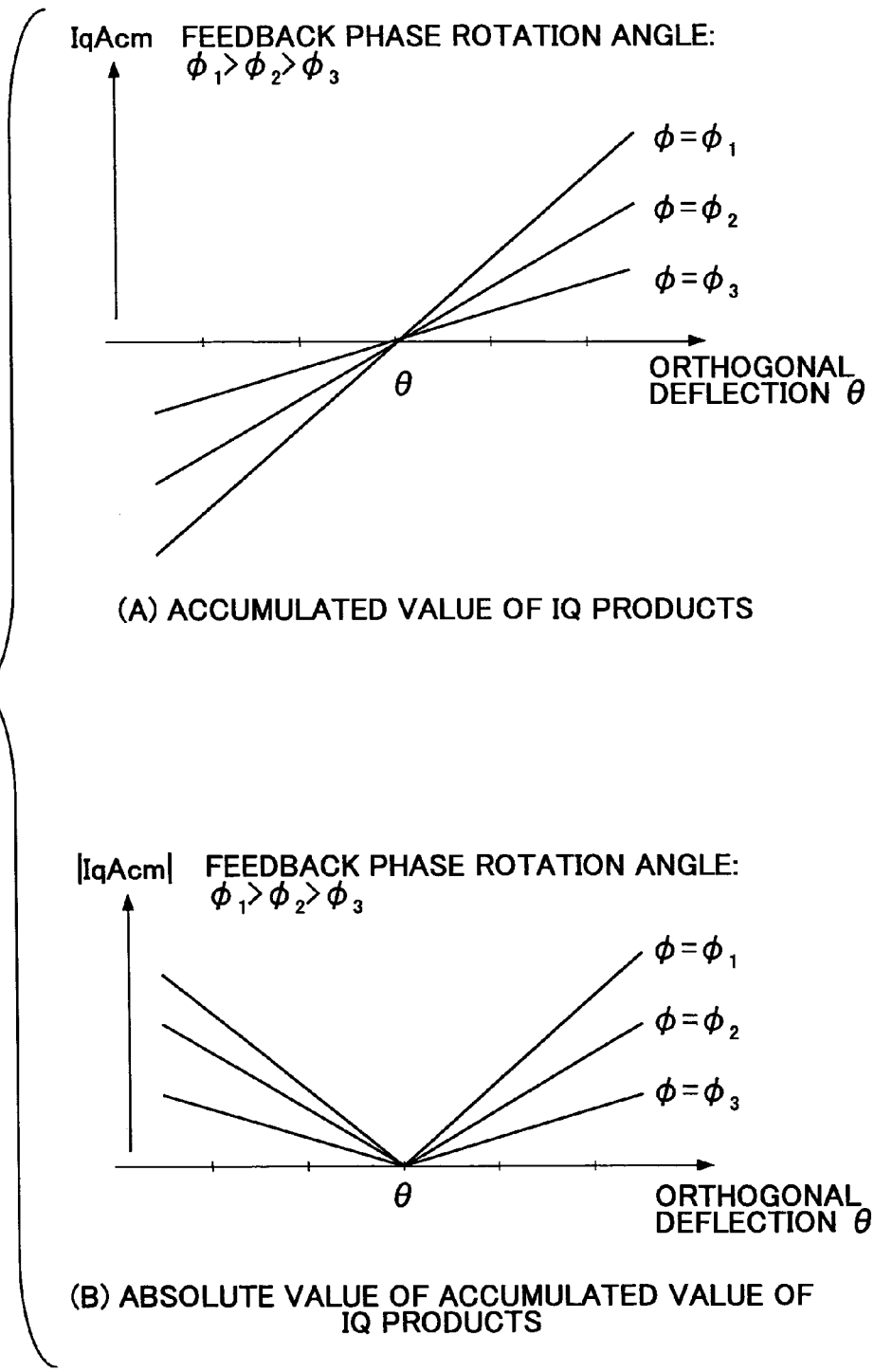
FIG. 28 graphs relations between the accumulative total of the product of the inphase and the orthogonal signal components, and the orthogonality deflection.

Supposing that the inphase signal component $Tx_i$ and the orthogonal signal component $Tx_q$ are not correlated, the first term of the right-hand side of the formula, $Tx_i \cdot Tx_q \cdot \cos(2\phi-\theta)$, becomes zero through accumulating the products by the accumulating unit 2726. The second term, $(1/2)Tx_i^2 \cdot \sin 2\phi$, is independent of the orthogonality deflection $\theta$. Therefore, only the third term, $(1/2)Tx_q^2 \cdot \sin(2\theta-2\phi)$, is dependent on the orthogonality deflection $\theta$. Further, if the inphase signal component $Tx_i$ and the orthogonal signal component $Tx_q$ are not correlated, the cumulative total of the products of the inphase signal component and the orthogonal signal component of the feedback signal becomes zero, and the average $E[Fb_i \cdot Fb_q]$ becomes zero. Accordingly, the cumulative total IqAcm of the products of the inphase signal component and the orthogonal signal component of the feedback signal Fb forms graphs as shown at (A) of FIG. 28. Therefore, an optimal compensation angle $\theta$ is obtained by monitoring the cumulative total IqAcm of the products while changing the compensation angle $\theta$, and by determining the optimal compensation angle $\theta$ that provides IqAcm=0.

Figure 29:
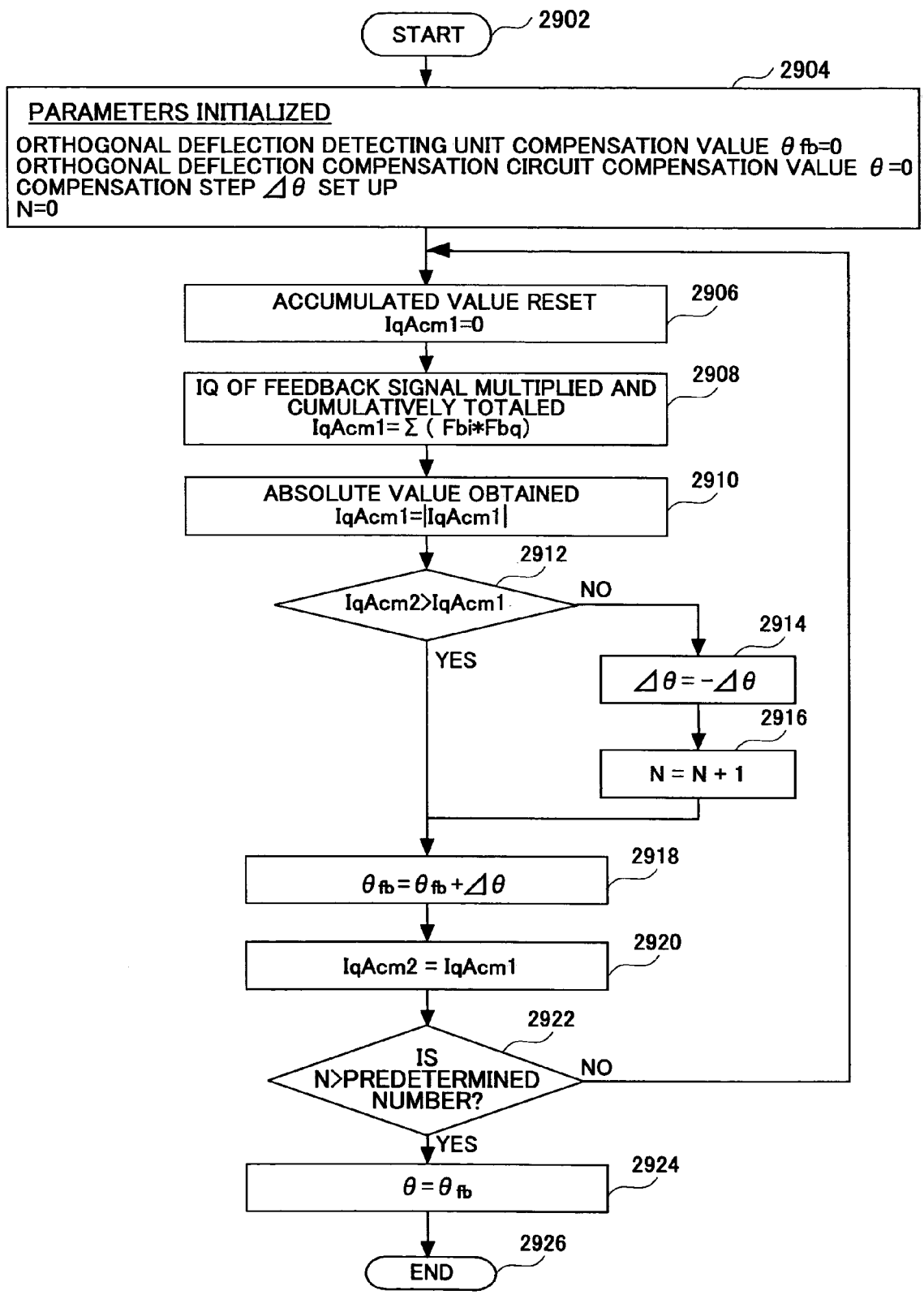
FIG. 29 is a flowchart for adjusting the orthogonality deflection.

FIG. 29 is a flowchart for adjusting the angle deflection between the real axis and the imaginary axis. The process starts at Step 2902 and progresses to Step 2904. At Step 2904, various parameters are initialized.

At Step 2906, the present cumulative total IqAcm1 is reset to 0.

At Step 2908, the cumulative total IqAcm1 of the product of the real part $Fb_i$ and the imaginary part $Fb_q$ of the feedback signal is calculated.

At Step 2910, the cumulative total is changed into an absolute value. Although this step is dispensable, it is desirable to provide this step for the following reason. Namely, if the conversion into the absolute value is not performed, the optimal compensation angle is determined only by one criterion that is to obtain a compensation angle that provides the null point of the cumulative total as shown at (A) of FIG. 28. On the other hand, if the absolute value of the cumulative total is prepared as shown at (B) of FIG. 28, another criterion is available, namely, a point where the change rate of the cumulative total changes can be determined to provide the optimal compensation angle. The change rate changes before and behind the compensation angle $\theta$, because the sign of the slope changes. For this reason, according to the latter method, the precision in determining the optimal compensation angle is raised.

At Step 2912, whether IqAcm1, which represents the latest and current cumulative total, is less than or equal to IqAcm2, which represents the previous cumulative total, is determined. If the determination is affirmative, the process progresses to Step 2918. Otherwise, the process progresses to Step 2914.

At Step 2914, the direction (the sign) of the compensation angle $\theta_{fb}$ to be provided to the orthogonality deflection detecting unit 2722 is reversed.

At Step 2916, the value of the parameter N is incremented by 1.

At Step 2918, the compensation angle $\theta_{fb}$ is updated.

At Step 2920, the latest and current cumulative total IqAcm1 is set as the value of the previous accumulative total IqAcm2.

At Step 2922, whether the parameter N is greater than a predetermined value is determined. If the determination is negative, the process returns to Step 2906 for repeating the same process. If the determination is affirmative, the process progresses to Step 2924.

At Step 2924, the compensation angle $\theta$ to be provided to the orthogonality deflection compensation circuit 2902 is set at the compensation angle $\theta_{fb}$ provided to the orthogonality deflection detecting unit 2922. The orthogonality deflection compensation circuit 2702 compensates for the orthogonality deflection using the compensation angle $\theta=\theta_{fb}$. Then, the process progresses to Step 2926 for ending.

Figure 30:
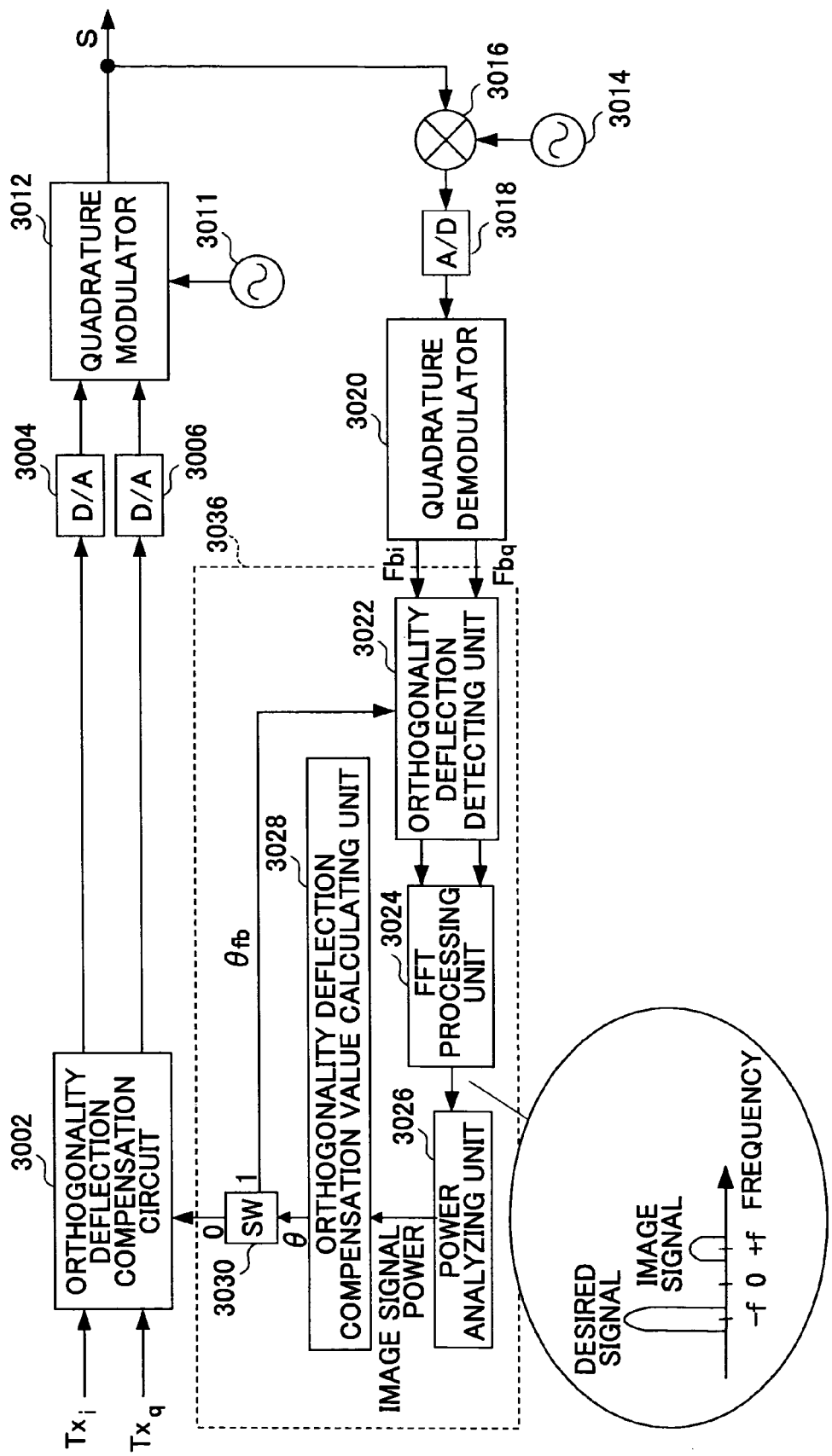
FIG. 30 is a block diagram of the quadrature modulation system according to an embodiment of the present invention.

FIG. 30 is a block diagram of the quadrature modulation system according to another embodiment of the present invention. The quadrature modulation system includes an orthogonality deflection compensation circuit 3002, digital-to-analog converters 3004 and 3006, and a quadrature modulator 3612 connected to a local oscillator 3011. The quadrature modulation system includes a multiplying unit 3016 connected to a local oscillator 3014, an analog-to-digital converter 3018, and a quadrature demodulator 3020. The quadrature modulation system includes an angle deflection calculating unit 3036 that includes an orthogonality deflection detecting unit 3022, a fast-Fourier-transform (FFT) processing unit 3024, a power analyzing unit 3026, an orthogonality deflection compensation value calculation unit 3028, and a switch 3030.

The digital-to-analog converters 3004 and 3006 convert the inphase signal component and the orthogonal signal component, respectively, from digital to analog format. The quadrature modulator 3012 combines the inphase signal component and the orthogonal signal component that are provided by the respective digital-to-analog converters, and outputs the output signal S. The multiplying unit 3016 multiplies the output signal S and a signal from the local oscillator 3014, wherein down conversion is carried out. The analog-to-digital converter 3018 converts the down-converted signal, which is an analog signal, into a digital signal. The quadrature demodulator 3020 carries out the quadrature demodulation of the output of the analog-to-digital converter 3018, and outputs the inphase signal component $Fb_i$ and the orthogonal signal component $Fb_q$ of the feedback signal to the orthogonality deflection detecting unit 3022.

The orthogonality deflection detecting unit 3022 provisionally adjusts the angle deflection of the inphase signal component $Fb_i$ and the orthogonal signal component $Fb_q$ of the feedback signal, and provides $Fb_i$ and $Fb_q$ to the FFT processing unit 3024.

The FFT processing unit 3024 outputs a signal that represents the frequency component contained in the feedback signal.

The power analyzing unit 3026 analyzes the signal from the FFT processing unit 3024, monitors an unnecessary signal (image signal frequency), and outputs a monitoring result.

The orthogonality deflection compensation value calculation unit 3028 calculates and outputs the compensation value θ for rectifying the orthogonality deflection based on the monitoring result provided by the power analyzing unit 3026.

Until the compensation value θ converges, the switch 3030 is turned to the side "1" such that the compensation value θ is provided to the orthogonality deflection detecting unit 3022, the compensation value θ serving as $θ_{fb}$. When the compensation value θ converges to an appropriate value, the switch 3030 is turned to the side "0" such that the compensation value θ is provided to the orthogonality deflection compensation circuit 3002.

In the present embodiment, the orthogonality deflection $θ_{fb}$ is gradually changed, an unnecessary signal (image signal) is monitored, and an orthogonality deflection $θ_{fb}$ that minimizes the unnecessary signal is determined and provided to the orthogonality deflection compensation circuit 3002.

Figure 36:
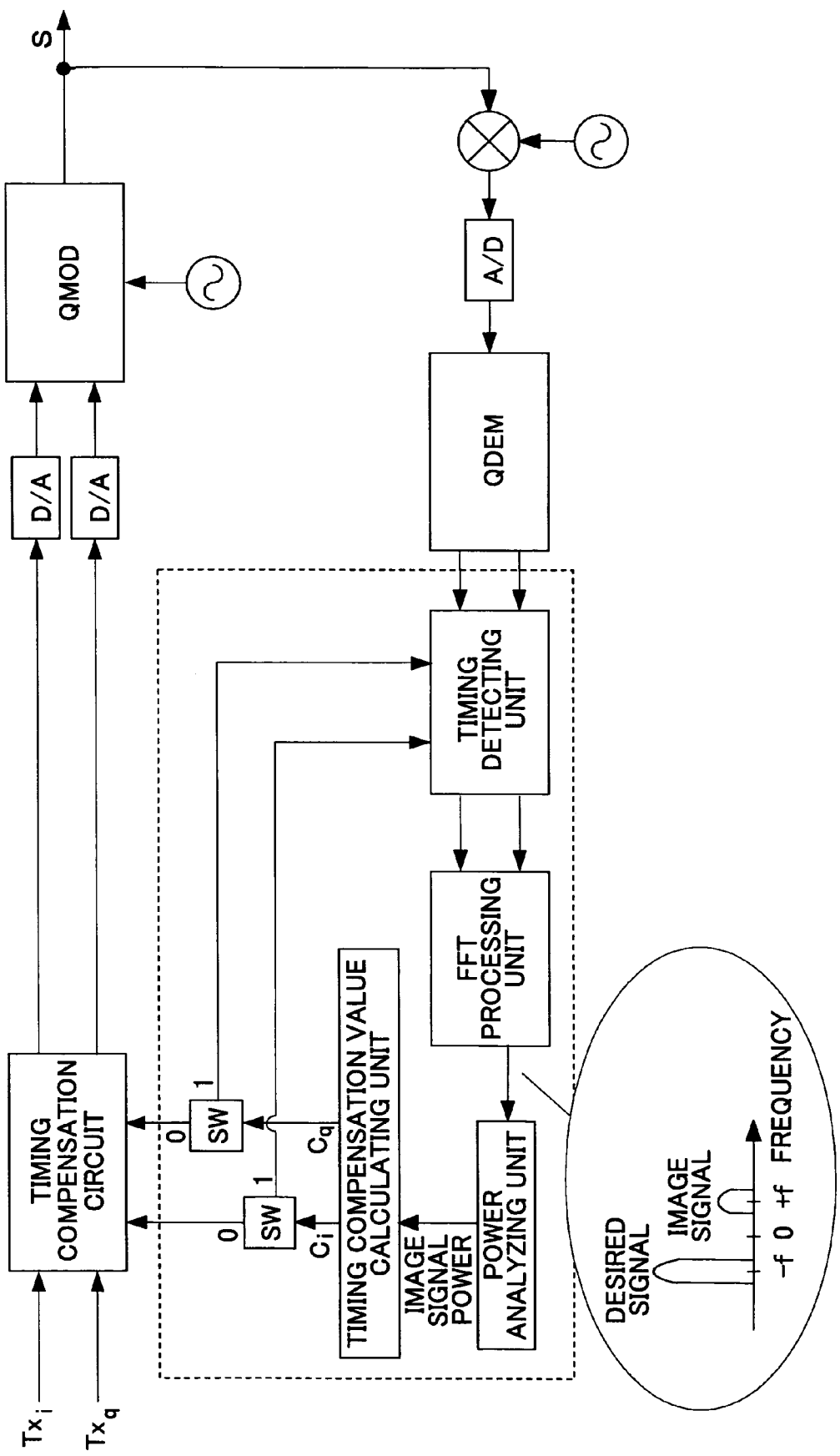
FIG. 36 is a block diagram of the quadrature modulation system according to an embodiment of the present invention.
Figure 37:
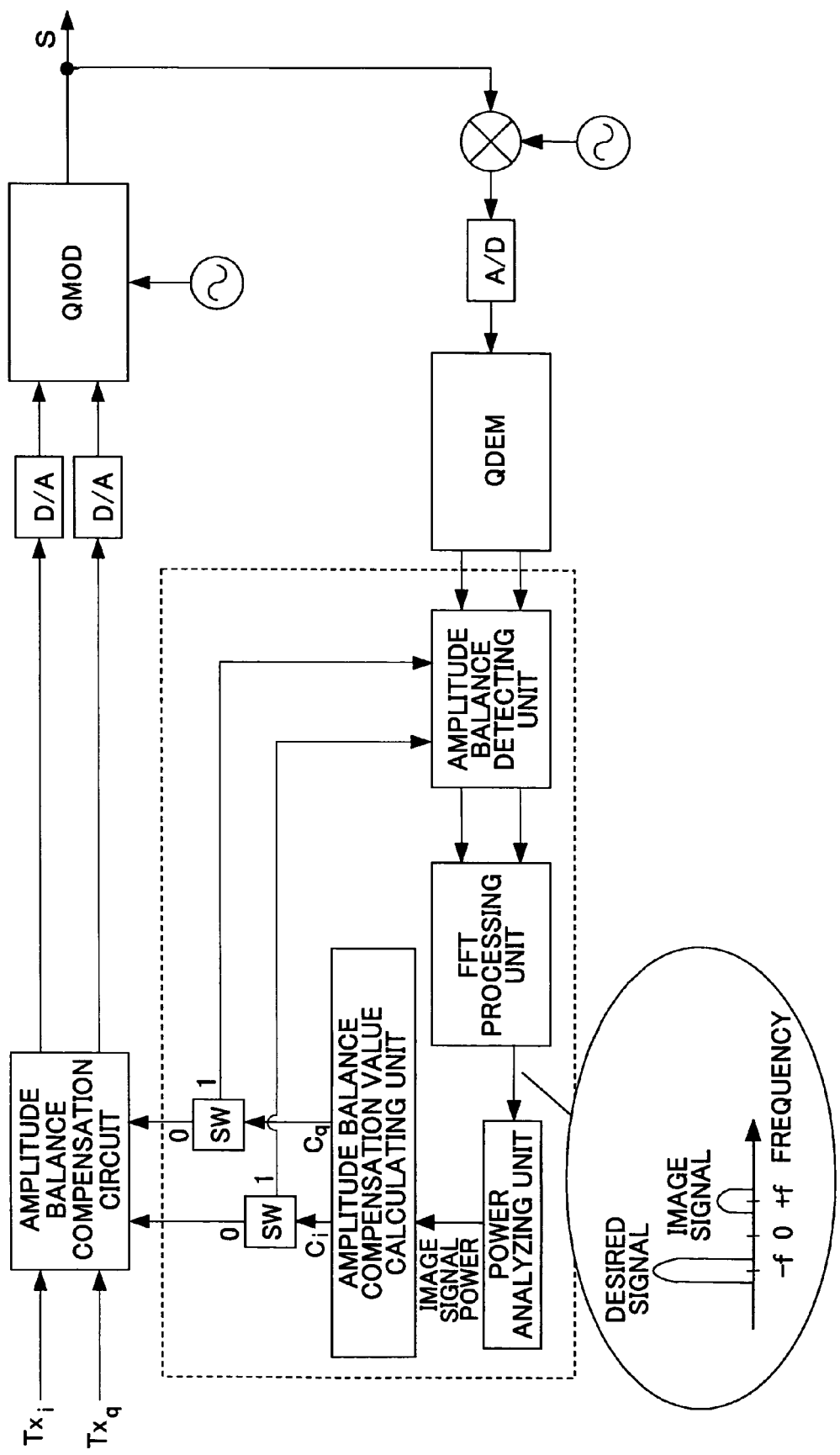
FIG. 37 is a block diagram of the quadrature modulation system according to an embodiment of the present invention.

In addition, although the orthogonality deflection that minimizes the unnecessary signal is obtained in the present embodiment, the timing difference between I and Q, and the amplitude imbalance can be compensated for using this technique. When compensating for the IQ timing difference, as shown in FIG. 36, based on the inphase signal component $Fb_i$ and the orthogonal signal component $Fb_q$ of the feedback signal, a signal representing the time difference between the inphase and the orthogonal signal component is obtained by a timing detecting unit. The signal representing the time difference is converted into a signal in the frequency domain by the FFT processing unit, and the power analyzing unit monitors the frequency component. The monitoring result is provided to a timing compensation value calculation unit, where the compensation values Ci and Cq for compensating timing difference are calculated. The compensation values Ci and Cq are provided to the timing detecting unit until the compensation values Ci and Cq converge, and the compensation values Ci and Cq are provided to the timing compensation circuit when the compensation values Ci and Cq converge such that the timing difference is compensated for. In the case of compensating for the amplitude imbalance, as shown in FIG. 37, based on the inphase signal component $Fb_i$ and the orthogonal signal component $Fb_q$ of the feedback signal, a signal representing the amplitude imbalance between the inphase and the orthogonal signal components is obtained by an amplitude balance detecting unit. This signal is converted into a signal in the frequency domain by the FFT processing unit, and the power analyzing unit monitors the frequency component. The monitoring result is provided to an amplitude balance compensation value calculation unit, wherein the compensation values Ci and Cq for compensating the amplitude balance are calculated. The compensation values Ci and Cq are provided to the amplitude balance detecting unit until the compensation values Ci and Cq converge, and are provided to an amplitude balance compensation circuit when the compensation values Ci and Cq converge such that the amplitude balance is obtained.

Figure 31:
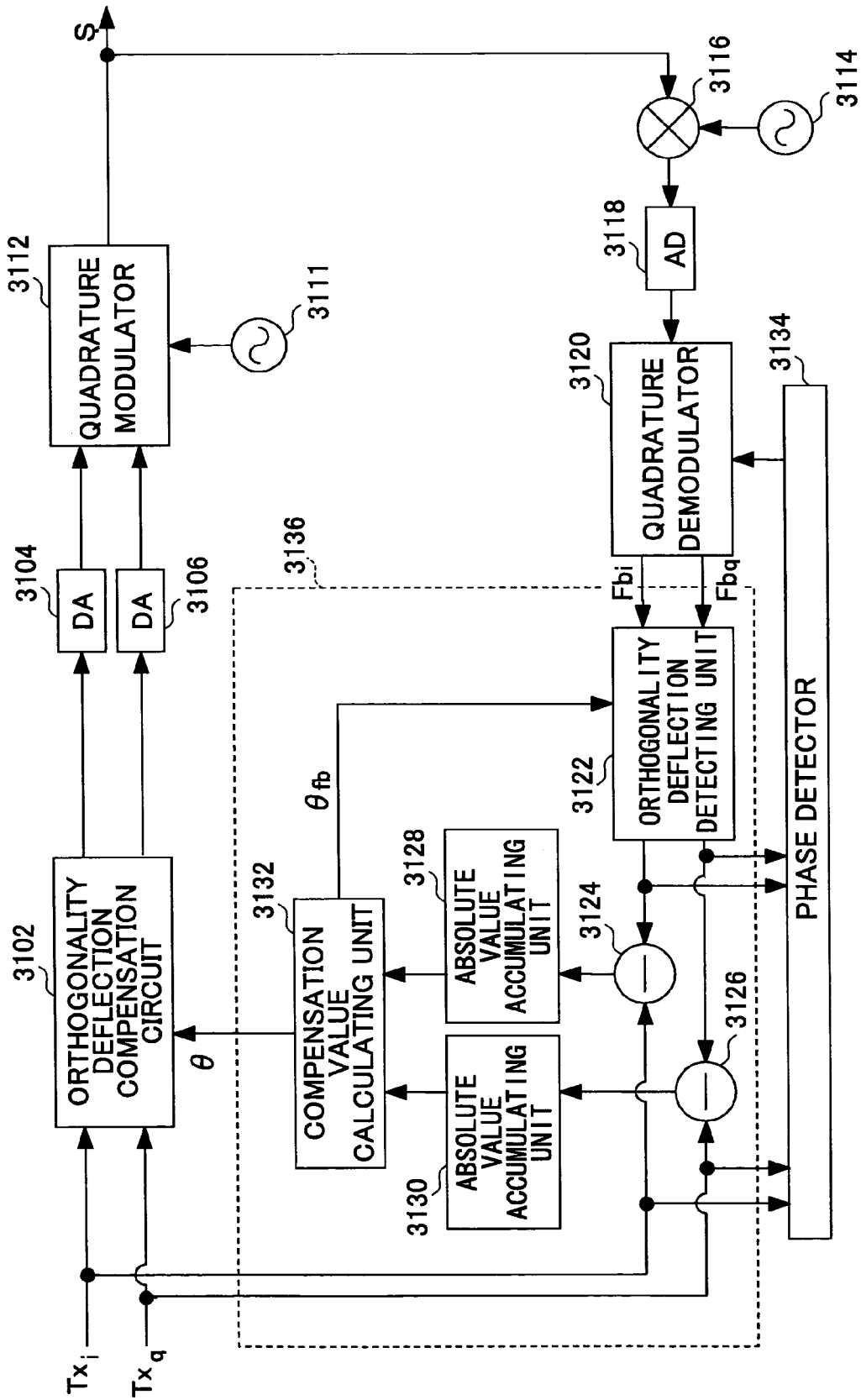
FIG. 31 is a block diagram of the quadrature modulation system according to an embodiment of the present invention.

FIG. 31 is a block diagram of the quadrature modulation system according to another embodiment of the present invention. The quadrature modulation system includes an orthogonality deflection compensation circuit 3102, digital-to-analog converters 3104 and 3106, and a quadrature modulator 3112 connected to a local oscillator 3111. The quadrature modulation system includes a multiplying unit 3116 connected to a local oscillator 3114, an analog-to-digital converter 3118, and a quadrature demodulator 3120. The quadrature modulation system includes an angle deflection calculating unit 3136 that includes an orthogonality deflection detecting unit 3122, subtraction units 3124 and 3126, absolute value accumulating units 3128 and 3130, and a compensation value operating unit 3132. Further, the quadrature modulation system includes a phase detector 3134.

The digital-to-analog converters 3104 and 3106 convert the inphase signal component and the orthogonal signal component, respectively, from digital to analog format. The quadrature modulator 3112 combines the inphase signal component and the orthogonal signal component that are provided by the respective digital-to-analog converters, and outputs the output signal S. The multiplying unit 3116 multiplies the output signal S and a signal from the local oscillator 3114, wherein down conversion is carried out. The analog-to-digital converter 3118 converts the down-converted signal, which is an analog signal, into a digital signal. The quadrature demodulator 3120 carries out the quadrature demodulation of the output of the analog-to-digital converter 3118, and outputs the inphase signal component $Fb_i$ and the orthogonal signal component $Fb_q$ of the feedback signal.

The orthogonality deflection detecting unit 3122 provisionally adjusts the angle deflection of the inphase signal component $Fb_i$ and the orthogonal signal component $Fb_q$ of the feedback signal, and provides $Fb_i$ and $Fb_q$ to the subtractor 3124.

The subtractor 3124 outputs the difference between the inphase signal component $Tx_i$ before quadrature modulation, and the inphase signal component $Fb_i$ of the feedback signal. The difference is cumulatively totaled by the absolute value accumulating unit 3128, and is output as the first cumulative total.

The subtractor 3126 outputs the difference between the orthogonal signal component $Tx_q$ before quadrature modulation, and the orthogonal signal component $Fb_q$ of the feedback signal. The difference is cumulatively totaled by the absolute value accumulating unit 3130, and is output as the second cumulative total.

The compensation value operating unit 3132 calculates an orthogonality deflection $\theta_{fb}$ that minimizes the first and the second cumulative totals.

The phase detector 3134 compares the digital signal before quadrature modulation with the feedback signal, and the phase rotation angle $\phi$ of the feedback signal is obtained. The phase rotation angle $\phi$ is compensated for by the quadrature demodulator 3120.

In the present embodiment, the first and the second cumulative totals are monitored while the orthogonality deflection $\theta_{fb}$ is gradually changed, and an orthogonality deflection $\theta_{fb}$ that minimizes the first and the second cumulative totals is provided to the orthogonality deflection compensation circuit 3102.

Figure 32:
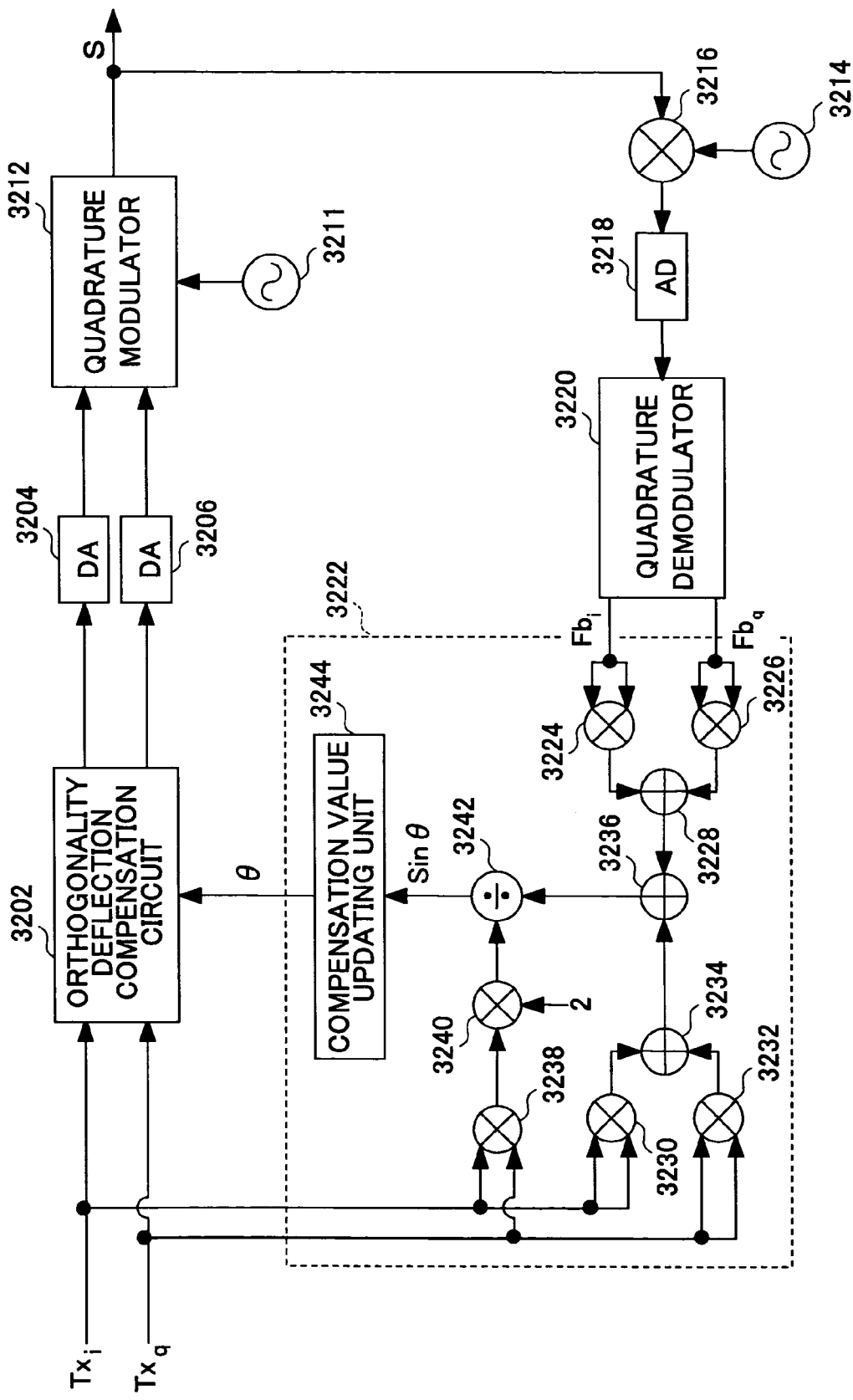
FIG. 32 is a block diagram of the quadrature modulation system according to an embodiment of the present invention.

FIG. 32 is a block diagram of the quadrature modulation system according to another embodiment of the present invention. The quadrature modulation system includes an orthogonality deflection compensation circuit 3202, digital-to-analog converters 3204 and 3206, and a quadrature modulator 3212 connected to a local oscillator 3211. The quadrature modulation system includes a multiplying unit 3216 connected to a local oscillator 3214, an analog-to-digital converter 3218, a quadrature demodulator 3220, and an angle deflection calculating unit 3222.

The digital-to-analog converters 3204 and 3206 convert the inphase signal component and the orthogonal signal component, respectively, from digital to analog format. The quadrature modulator 3212 combines the inphase signal component and the orthogonal signal component that are provided by the respective digital-to-analog converters, and outputs the output signal S. The multiplying unit 3216 multiplies the output signal S and a signal from the local oscillator 3214, wherein down conversion is carried out. The analog-to-digital converter 3218 converts the down-converted signal, which is an analog signal, into a digital signal. The quadrature demodulator 3220 carries out the quadrature demodulation of the output of the analog-to-digital converter 3218, and outputs the inphase signal component $Fb_i$ and the orthogonal signal component $Fb_q$ of the feedback signal.

The angle deflection calculating unit 3222 calculates the orthogonality deflection $\theta$ based on the digital signals before quadrature modulation and the feedback signal. The orthogonality deflection $\theta$ is provided to the orthogonality deflection compensation circuit 3202. The angle deflection calculating unit 3222 includes multiplying units 3230 and 3232 and an adder 3234 for obtaining a square of the magnitude of the digital signals before quadrature modulation, namely, $Pow_{ref}=Tx_i^2+Tx_q^2$. The angle deflection calculating unit 3222 includes multiplying units 3224 and 3226 and an adder 3228 for obtaining a square of the magnitude of the feedback signal, namely, $Pow_{back}=Fb_i^2+Fb_q^2$. The angle deflection calculating unit 3222 includes an adder 3236 for outputting the difference between the squares of the magnitudes of the digital signal and the feedback signal, namely, $Pow_{back}-Pow_{ref}$. The angle deflection calculating unit 3222 includes multiplying units 3238 and 3240 for obtaining twice the product of the inphase signal component and the orthogonal signal component before quadrature modulation, namely, $2 \cdot Tx_i \cdot Tx_q$. The angle deflection calculating unit 3222 includes a divider 3242 for obtaining a ratio of the output of the multiplying unit 3240 to the output of the adder 3236. Further, the angle deflection calculating unit 3222 includes a compensation value updating unit 3244 for obtaining the orthogonality deflection $\theta$ based on the output of the divider 3242.

Power of the digital signal $Pow_{ref}$ before quadrature modulation is represented by a square of the magnitude, namely, $Pow_{ref}=Tx_i^2+Tx_q^2$ Power $Pow_{back}$ of the feedback signal Fb is expressed as $$\begin{aligned}Pow_{back} &= Fb_i^2 + Fb_q^2 \\ &= (Tx_i \cdot \cos\phi + Tx_q \cdot \sin(\theta - \phi))^2 + \\ &\quad (Tx_i \cdot \sin\phi - Tx_q \cdot \cos(\theta - \phi))^2 \\ &= Tx_i^2 + Tx_q^2 + 2Tx_i \cdot Tx_q \cdot \sin\theta\end{aligned}$$

Accordingly, the orthogonality deflection $\theta$ is obtained by the following formula.

$$\theta = \sin^{-1}\left(\frac{pow_{back} - pow_{ref}}{2Tx_iTx_q}\right) \qquad \text{[Equation 4]}$$

The method of calculating the orthogonality deflection $\theta$ is not limited to this, but other methods are possible (the configuration of the angle deflection calculating unit 3222 is changed according to an operation algorithm as required). For example, it is possible to obtain the orthogonality deflection using a signal at a certain point in time and another signal at another point in time as described below.

Figure 33:
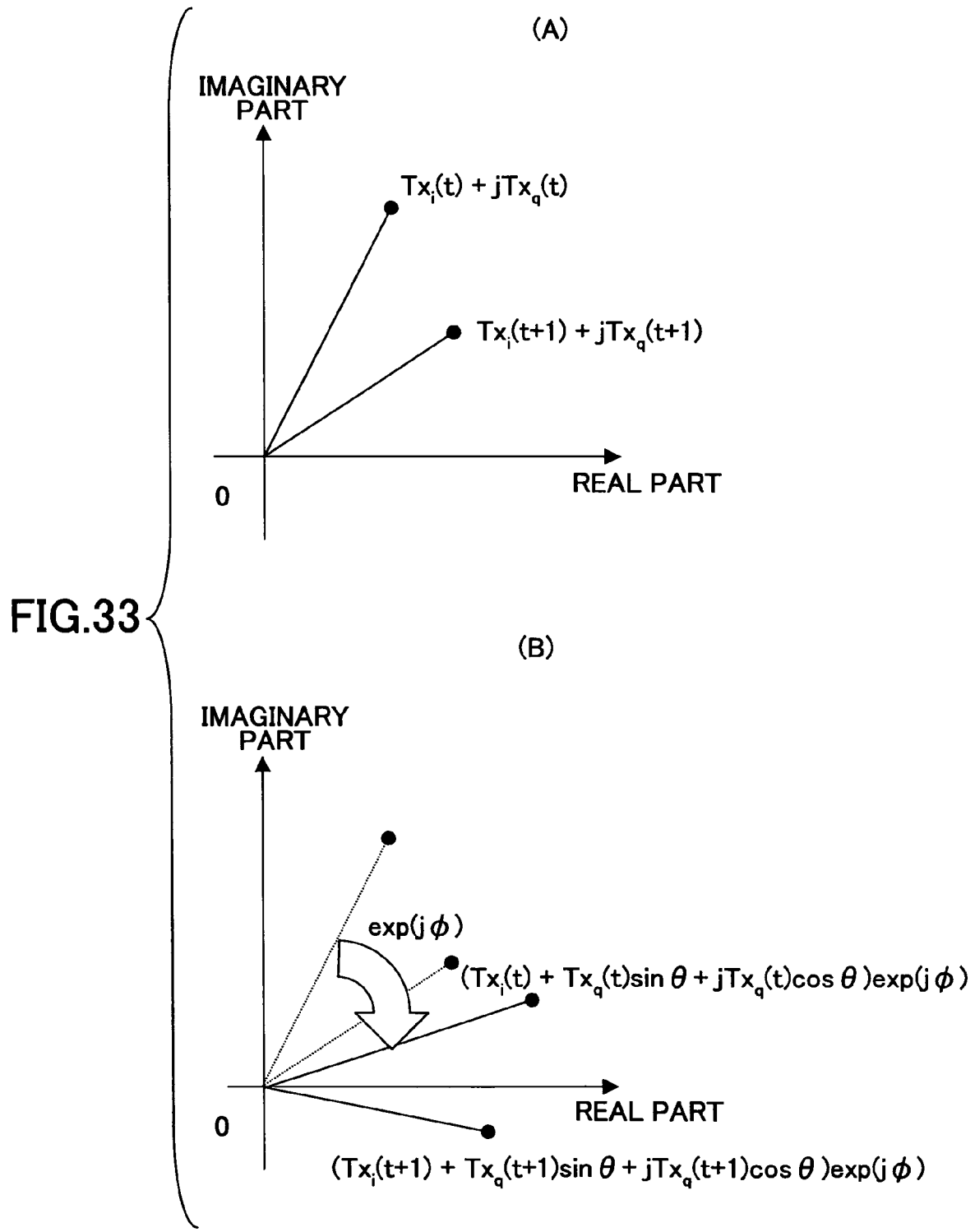
FIG. 33 graphs a generated signal and a feedback signal at different times.

FIG. 33 shows an example. At (A) of FIG. 33, a digital signal before quadrature modulation at a certain time, namely, $Tx(t)=Tx_i(t)+jTx_q(t)$, and a digital signal at the next point in time, namely, $Tx(t+1)=Tx_i(t+1)+jTx_q(t+1)$ are shown. At (B) of FIG. 33, feedback signals corresponding to the digital signals $Tx(t)$ and $Tx(t+1)$ are shown. The influence of the orthogonality deflection $\theta$ and the influence of the phase rotation $\phi$ are reflected in the feedback signals. In this case, the imaginary part of an inner product of the digital signals $Tx(t)$ and $Tx(t+1)$ is expressed as follow.

$Im[(Tx_i(t)+jTx_q(t))\cdot(Tx_i(t+1)+jTx_q(t+1))^*]=Tx_q(t)Tx_i(t+1)-Tx_i(t)Tx_q(t+1)$.

Here, the asterisk "*" means a complex conjugate, and $Im[\ ]$ means the imaginary part of the argument. On the other hand, the imaginary part of the inner product of the feedback signal corresponding to the digital signals $Tx(t)$ and $Tx(t+1)$ is expressed as follows.

$Im[\{(Tx_i(t)+Tx_q(t)\sin\theta+jTx_q(t)\cos\theta)\exp(j\phi)\}\cdot\{(Tx_i(t+1)+Tx_q(t+1)\sin\theta+jTx_q(t+1)\cos\theta)\exp(j\phi)\}^*]=\cos\theta(Tx_q(t)Tx_i(t+1)-Tx_i(t)Tx_q(t+1))$ Accordingly, the orthogonality deflection $\theta$ is obtained by the following formula.

$\theta=\cos^{-1}(Im[\text{inner product of the feedback signal}]/Im[\text{inner product of the signals before quadrature modulation}])$.

Embodiment 4

Hereafter, Embodiment 4 is described, wherein the timing, amplitude, and angle deflection of the inphase signal component and the orthogonal signal component are collectively adjusted.

Figure 34:
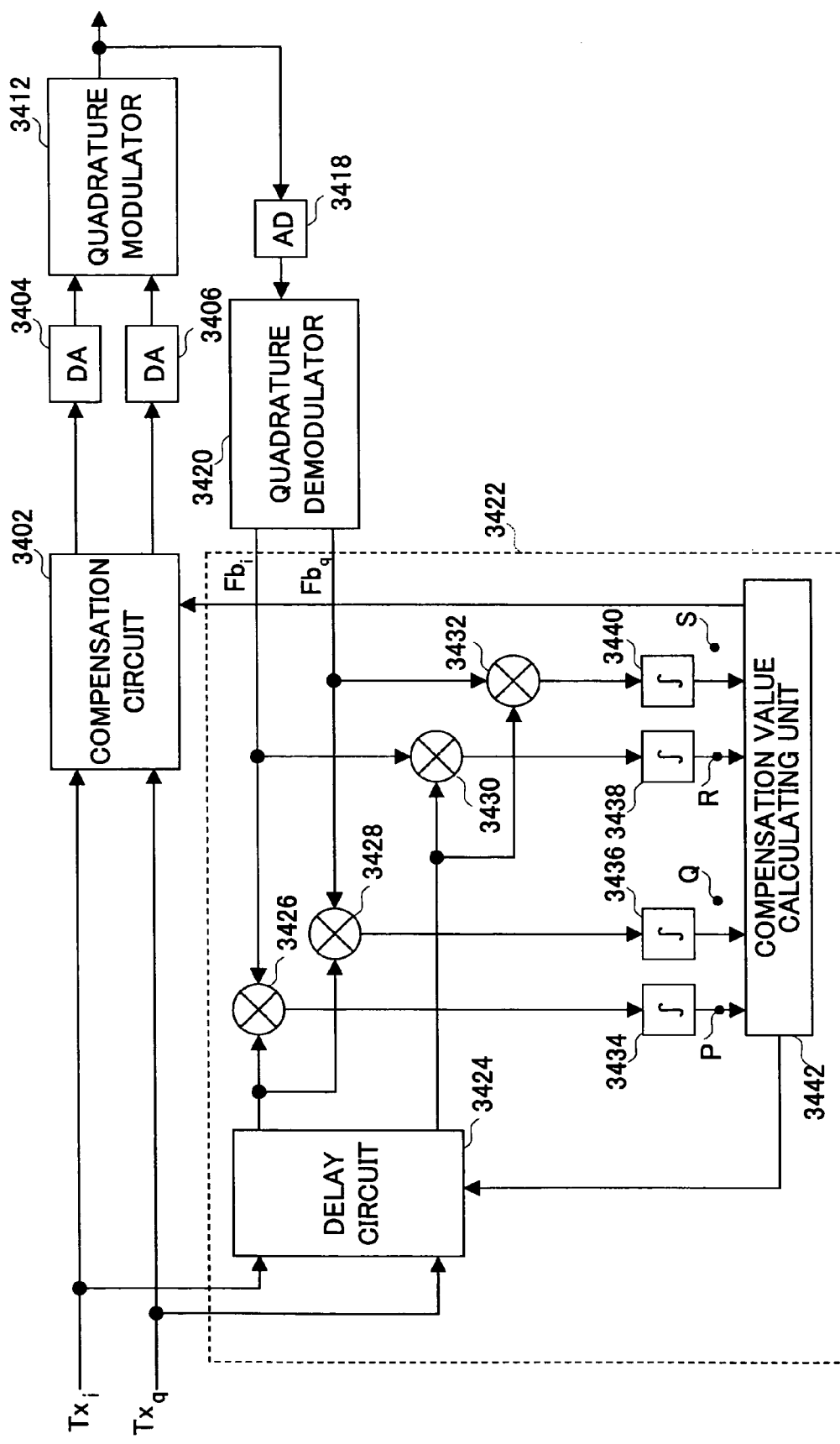
FIG. 34 is a block diagram of the quadrature modulation system according to an embodiment of the present invention.

FIG. 34 is a block diagram of the quadrature modulation system according to Embodiment 4 of the present invention. The quadrature modulation system includes a compensation circuit 3402, digital-to-analog converters 3404 and 3406, and a quadrature modulator 3412. The quadrature modulation system includes an analog-to-digital converter 3418, a quadrature demodulator 3420, and a mismatching amount calculation unit 3422.

The digital-to-analog converters 3404 and 3406 convert the inphase signal component and the orthogonal signal component, respectively, from digital to analog format. The quadrature modulator 3412 combines the inphase signal component and the orthogonal signal component that are provided by the respective digital-to-analog converters, and outputs an output signal. The analog-to-digital converter 3418 converts the output signal, which is an analog signal, into a digital signal. The quadrature demodulator 3420 carries out the quadrature demodulation of the output of the analog-to-digital converter 3418, and outputs the inphase signal component $Fb_i$ and the orthogonal signal component $Fb_q$ of the feedback signal.

The mismatching amount calculation unit 3422 calculates amounts of mismatching (differences) between the inphase signal component and the orthogonal signal component, namely, timing difference, orthogonality deflection, and amplitude difference based on the digital signal Tx before quadrature modulation and the feedback signal Fb. The amounts of mismatching are provided to the compensation circuit 3402 such that the mismatching is compensated for. The mismatching amount calculation unit 3422 includes a delay circuit 3424, multiplying units 3426, 3428, 3430, and 3432, integrators 3434, 3436, 3438, and 3440, and a compensation value calculation circuit 3442.

The integrator 3434 outputs $E[Tx_i(t)\, Fb_i(t)]$ as an output P. Here and elsewhere, E[ ] is an expression of equalization, and is obtained by dividing a value totaled by the integrator by a suitable factor. Assuming that the inphase and the orthogonal signal components are not correlated to each other, the output P is approximated as follows.

$$P = E[Tx_i(t) \cdot Fb_i(t)]$$
$$= E[Tx_i(t) \cdot (ATx_i(t)\cos\phi + BTx_q(t+\Delta t)\sin(\phi - \theta))]$$
$$\approx A\cos\phi E[Tx_i^2(t)]$$

Here, $\Delta t$ represents the timing difference between the inphase and the orthogonal signal components, $\phi$ represents a phase rotation angle, and $\theta$ represents an orthogonality deflection of the real axis and the imaginary axis.

Similarly, the integrator 3436 outputs an output Q, which is equal to $E[Tx_i(t)\cdot Fb_q(t)]$, the integrator 3438 outputs an output R, which is equal to $E[Tx_q(t)\cdot Fb_i(t)]$, and the integrator 3440 outputs an output S, which is equal to $E[Tx_q(t)\cdot Fb_q(t)]$. Q, R, and S are approximated as follows.

$$Q = E[Tx_i(t) \cdot Fb_q(t)]$$
$$= E[Tx_i(t) \cdot (ATx_i(t)\sin\phi - BTx_q(t+\Delta t)\cos(\phi - \theta))]$$
$$\approx A\sin\phi E[Tx_i^2(t)]$$
$$R = E[Tx_q(t) \cdot Fb_i(t)]$$
$$= E[Tx_q(t) \cdot (ATx_i(t)\cos\phi + BTx_q(t+\Delta t)\sin(\phi - \theta))]$$
$$\approx B\sin(\phi - \theta) \cdot E[Tx_q(t)Tx_q(t+\Delta t)]$$
$$\approx B\sin(\phi - \theta) \cdot E[Tx_q(t)^2](\Delta t = 0)$$
$$S = E[Tx_q(t) \cdot Fb_q(t)]$$

-continued
$$= E[Tx_q(t) \cdot (ATx_i(t)\sin\phi - BTx_q(t+\Delta t)\cos(\phi - \theta))]$$
$$\approx -B\cos(\phi - \theta) \cdot E[Tx_q(t)Txq(t+\Delta t)]$$
$$\approx -B\cos(\phi - \theta) \cdot E[Tx_q(t)^2](\Delta t = 0)$$

Next, $P^2+Q^2$ and $R^2+S^2$ are calculated by the compensation value calculation circuit 3442, which are expressed as follows.

$$P^2 + Q^2 = E[Tx_i(t) \cdot Fb_i(t)]^2 + E[Tx_i(t) \cdot Fb_q(t)]^2$$
$$= A^2 E[Tx_i^2(t)]^2$$
$$R^2 + S^2 = E[Tx_q(t) \cdot Fb_i(t)]^2 + E[Tx_q(t) \cdot Fb_q(t)]^2$$
$$= B^2 E[Tx_q^2(t)]^2$$

Here, $P^2+Q^2$ and $R^2+S^2$ are not dependent on the phase rotation angle $\phi$, nor the orthogonality deflection $\theta$. Therefore, it becomes possible to calculate an optimal amount of delay by monitoring and comparing these values, with the delay circuit 3424 gradually changing the amount of the delay.

Next, the amplitude difference is determined. In the present embodiment, the following formulas are used, for example.

$$E[Tx_i^2(t)]/(P^2+Q^2)^{1/2}=1/A \text{ and}$$

$$E[Tx_q^2(t)]/(R^2+S^2)^{1/2}=1/B$$

The amplitude difference can be determined by other methods such as determining the difference between the amplitudes (|A−B|), and determining a ratio of the amplitudes (A/B or B/A).

Next, the phase rotation angle $\phi$ sand the orthogonality deflection $\theta$ are determined using the following formulas.

$$Q/P=\tan\phi$$

$$-R/S=\tan(\phi-\theta)$$

The time difference, the amplitude difference, and the orthogonality deflection that are obtained by the compensation value calculation circuit 3422 are provided to the compensation circuit 3422 such that the differences are compensated for.

Figure 35:
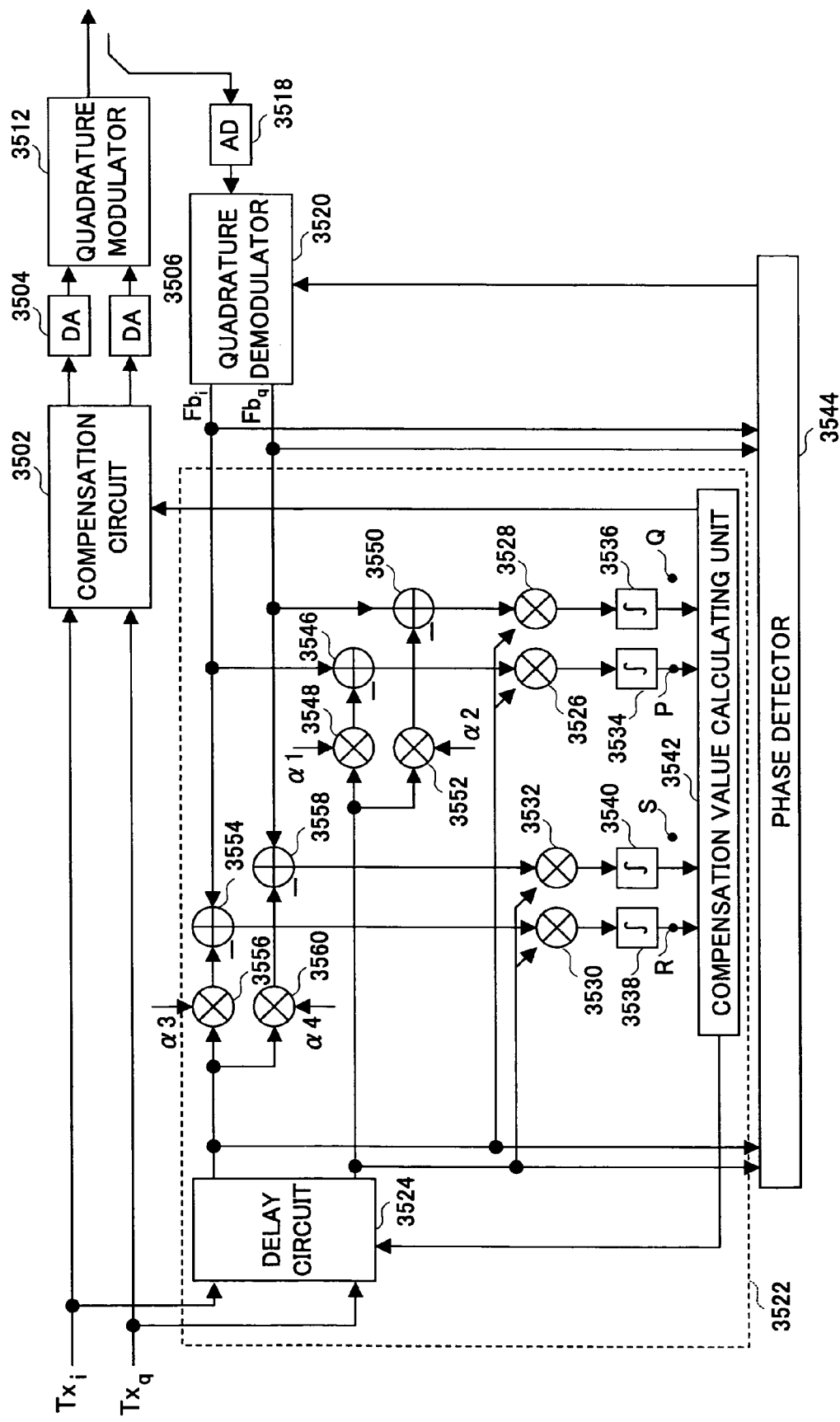
FIG. 35 is a block diagram of the quadrature modulation system according to an embodiment of the present invention.

FIG. 35 is a block diagram of the quadrature modulation system according to another embodiment of the present invention. The quadrature modulation system includes a compensation circuit 3502, digital-to-analog converters 3504 and 3506, and a quadrature modulator 3512. The quadrature modulation system includes an analog-to-digital converter 3518, a quadrature demodulator 3520, a mismatching amount calculation unit 3522, and a phase detector 3544.

The digital-to-analog converters 3504 and 3506 convert the inphase signal component and the orthogonal signal component, respectively, from digital to analog format. The quadrature modulator 3512 combines the inphase signal component and the orthogonal signal component that are provided by the respective digital-to-analog converters, and outputs an output signal. The analog-to-digital converter 3518 converts the down-converted signal, which is an analog signal, into a digital signal. The quadrature demodulator 3520 carries out the quadrature demodulation of the output of the analog-to-digital converter 3518, and outputs the inphase signal component $Fb_i$ and the orthogonal signal component $Fb_q$ of the feedback signal.

The mismatching amount calculation unit 3522 calculates the amounts of mismatching between the inphase signal component and the orthogonal signal component, namely, the timing difference, orthogonality deflection, and amplitude difference, based on the digital signal Tx before quadrature modulation and the feedback signal Fb. The amounts of mismatching are provided to the compensation circuit 3502 such that the mismatching is compensated for. The mismatching amount calculation unit 3522 includes a delay circuit 3524, multiplying units 3526, 3528, 3530, and 3532, integrators 3534, 3536, 3538, and 3540, and a compensation value calculation circuit 3542. Further, the mismatching amount calculation unit 3522 includes subtractors 3546, 3550, 3554, and 3558. Further, the mismatching amount calculation unit 3522 includes multiplying units 3548, 3552, 3556, and 3560 for inserting weights $\alpha$, $\alpha_2$, $\alpha_3$, and $\alpha_4$.

In the example shown in FIG. 34, when the phase rotation angle $\phi$ is small, the output Q and output R are also small, and an accurate result may not be obtained. In the example shown in FIG. 35, the value of the phase rotation angle $\phi$ is intentionally set up at a relatively great value, and the axis of coordinates is rotated by 45 degrees, for example. Then, the outputs P, Q, R, and S are measured. In this manner, the possible degradation of calculation accuracy is reduced. For this purpose, the mismatching amount calculation unit 3522 includes the multiplying units 3548, 3552, 3556, and 3560 for introducing the weights $\alpha$, $\alpha_2$, $\alpha_3$, and $\alpha_4$, and the phase detector 3544. Specifically, P, Q, R, and S in the case shown by FIG. 34 are as follows.

$$P = E[Tx_i(t) \cdot Fb_i(t)]$$

$$Q = E[Tx_i(t) \cdot Fb_q(t)]$$

$$R = E[Tx_q(t) \cdot Fb_i(t)]$$

$$S = E[Tx_q(t) \cdot Fb_q(t)]$$

Coordinate transform is carried out to the four values as follows.

$$P = E[Tx_i(t) \cdot \{Fb_i(t) - \alpha_1 Tx_q\}]$$

$$Q = E[Tx_i(t) \cdot \{Fb_q(t) - \alpha_2 Tx_q\}]$$

$$R = E[Tx_q(t) \cdot \{Fb_i(t) - \alpha_3 Tx_i\}]$$

$$S = E[Tx_q(t) \cdot \{Fb_q(t) - \alpha_4 Tx_i\}]$$

If the coordination transform is to be carried out for 45 degrees, for example, the weights take the following value.

$$\alpha_1 = \alpha_2 = \alpha_3 = \alpha_4 = (1/2)^{1/2}$$

Different weight values provide different degrees for the coordination transform.

Further, the present invention is not limited to these embodiments, but various variations and modifications may be made without departing from the scope of the present invention.

The present application is based on Japanese Priority Application No. 2004-125849 filed on Apr. 21, 2004, with the Japanese Patent Office, the entire contents of which are hereby incorporated by reference.

What is claimed is:

1. A quadrature modulation system wherein a first inphase signal component and a first orthogonal signal component are input, and are provided to a quadrature modulator for outputting an output signal that is quadrature modulated by the quadrature modulator, a part of said output signal serving as a feedback signal consisting of a second inphase signal component and a second orthogonal signal component, comprising:

time difference calculating means for
obtaining a first cumulative total of results of calculation based on the first inphase signal component and the second inphase signal component,
obtaining a second cumulative total of results of calculation based on the first orthogonal signal component and the second orthogonal signal component, and
obtaining a time difference between the first inphase signal component and the second inphase signal component, and a time difference between the first orthogonal signal component and the second orthogonal signal component based on said first cumulative total and said second cumulative total, respectively; and delay adjustment means for adjusting the first inphase signal component and the first orthogonal signal component that are provided to the quadrature modulator such that said time differences are compensated for.

2. The quadrature modulation system as claimed in claim 1, further comprising:

means for comparing the first inphase signal component and the first orthogonal signal component with the second inphase signal component and the second orthogonal signal component, respectively, and for obtaining a rotation angle of the real axis and the imaginary axis of a signal point arrangement.

3. The quadrature modulation system as claimed in claim 1, wherein said delay adjustment means comprises:

a finite impulse response filter, a tap coefficient of which is changeable according to said time difference.

4. The quadrature modulation system as claimed in claim 1, wherein said delay adjustment means carries forward or delays a clock signal according to said time difference, the clock signal being provided to at least one of digital-to-analog converters for converting the first inphase signal component and the first orthogonal signal component into respective analog signal components.

5. The quadrature modulation system as claimed claim 1, wherein the first inphase signal component and the first orthogonal signal component, amplitudes of which components are adjusted by the adjustment means are in one of digital format and analog format.

6. A transmitter comprising the quadrature modulation system as claimed in claim 1.

7. A quadrature modulation system wherein a first inphase signal component and a first orthogonal signal component are input, and are provided to a quadrature modulator for outputting an output signal that is quadrature modulated by the quadrature modulator, a part of said output signal serving as a feedback signal consisting of a second inphase signal component and a second orthogonal signal component, comprising:

time difference calculating means for
obtaining a first cumulative total of results of calculation based on the first inphase signal component and the second inphase signal component,
obtaining a second cumulative total of results of calculation based on the first orthogonal signal component and the second orthogonal signal component, and
obtaining a time difference between the first inphase signal component and the second inphase signal component, and a time difference between the first orthogonal signal component and the second orthogonal signal component based on said first cumulative total and said second cumulative total, respectively; and delay adjustment means for adjusting the first inphase signal component and the first orthogonal signal component that are provided to the ciuadrature modulator such that said time differences are compensated for, wherein said calculation calculates one of a difference between and a product of the first inphase signal component and the second inphase signal component, and one of a difference between and a product of the first orthogonal signal component and the second orthogonal signal component.

8. A quadrature modulation system wherein a first inphase signal component and a first orthogonal signal component are input, and are provided to a quadrature modulator for outputting an output signal that is quadrature modulated by the quadrature modulator, a part of said output signal serving as a feedback signal consisting of a second inphase signal component and a second orthogonal signal component, comprising:

amplitude difference calculation means for
obtaining a first error that is a difference between average amplitudes of the second inphase signal component and the second orthogonal signal component,
obtaining a second error that is a difference between average amplitudes of the second inphase signal component and the second orthogonal signal component when the real axis and the imaginary axis of a signal point arrangement are rotated by a predetermined angle amount, and
for obtaining an amount of amplitude difference between the first inphase signal component and the first orthogonal signal component based on said first error and said second error; and amplitude adjustment means for adjusting the amplitudes of the first inphase signal component and the first orthogonal signal component such that the amplitude difference is compensated for.

9. The quadrature modulation system as claimed in claim 8, further comprising:
means for comparing the magnitude of said first error with the magnitude of said second error.

10. The quadrature modulation system as claimed in claim 8, wherein said predetermined angle amount is substantially equal to 45 degrees.

11. A quadrature modulation system wherein a first inphase signal component and a first orthogonal signal component are input, and are provided to a quadrature modulator for outputting an output signal that is quadrature modulated by the quadrature modulator, a part of said output signal serving as a feedback signal consisting of a second inphase signal component and a second orthogonal signal component, comprising:

amplitude difference calculation means for
obtaining a first error that is a difference between an average amplitude of the first inphase signal component and an average amplitude of the second inphase signal component,
obtaining a second error that is a difference between an average amplitude of the first orthogonal signal component and an average amplitude of the second orthogonal signal component, and
obtaining an amount of difference between the amplitude of the first inphase signal component and the amplitude of the first orthogonal signal component based on said first error and said second error, respectively; and amplitude adjustment means for adjusting the amplitudes of the first inphase signal component and the first orthogonal signal component such that the differences of said amplitudes are compensated for.

12. The quadrature modulation system as claimed in claim 11, further comprising:
means for comparing the first inphase signal component and the first orthogonal signal component with the second inphase signal component and the second orthogonal signal component, respectively, and for obtaining a rotation angle of the real axis and the imaginary axis of a signal point arrangement.

13. A quadrature modulation system wherein a first inphase signal component and a first orthogonal signal component are input, and are provided to a quadrature modulator for outputting an output signal that is quadrature modulated by the quadrature modulator, a part of said output signal sewing as a feedback signal consisting of a second inphase signal component and a second orthogonal signal component, comprising:

amplitude difference calculation means for
obtaining a first average that is an average of products of the first inphase signal component and the second orthogonal signal component,
obtaining a second average that is an average of products of the first orthogonal signal component provided and the second inphase signal component, and
obtaining a value that is proportional to a ratio of the first average to the second average; and amplitude adjustment means for adjusting the first inphase signal component and the first orthogonal signal component such that the value that is proportional to said ratio approaches a desired value.

14. A quadrature modulation system wherein a first inphase signal component and a first orthogonal signal component are input, and are provided to a quadrature modulator for outputting an output signal that is quadrature modulated by the quadrature modulator, a part of said output signal serving as a feedback signal consisting of a second inphase signal component and a second orthogonal signal component, comprising:

angle deflection calculation means for
obtaining an amount of difference between a cumulative total of the second inphase signal component and a cumulative total of the second orthogonal signal component, and
calculating an amount of angle deflection between the real axis and the imaginary axis of a signal point arrangement based on said amount of difference; and adjustment means for adjusting the first inphase signal component and the first orthogonal signal component such that said angle deflection is compensated for.

15. A quadrature modulation system wherein a first inphase signal component and a first orthogonal signal component are input, and are provided to a quadrature modulator for outputting an output signal that is quadrature modulated by the quadrature modulator, a part of said output signal sewing as a feedback signal consisting of a second inphase signal component and a second orthogonal signal component, comprising:

angle deflection calculation means for
obtaining a power difference that is a difference between power of a signal provided to said quadrature modulator and power of the feedback signal,
obtaining a signal product that is a product of the first inphase signal component and the first orthogonal signal component of the signal provided to said quadrature modulator, and obtaining an amount of the angle deflection between the real axis and the imaginary axis of a signal point arrangement based on a ratio of said power difference to said signal product; and adjustment means for adjusting the first inphase signal component and the first orthogonal signal component such that said angle deflection is compensated for.

16. The quadrature modulation system as claimed in claim 15, wherein said angle deflection calculation means obtains said angle deflection by using an arc-sine function, to the argument of which the ratio of said power difference to said signal product is substituted.

17. A quadrature modulation system wherein a first inphase signal component and a first orthogonal signal component are input, and are provided to a quadrature modulator for outputting an output signal that is quadrature modulated by the quadrature modulator, a part of said output signal serving as a feedback signal consisting of a second inphase signal component and a second orthogonal signal component, comprising:

angle deflection calculation means for obtaining a first value that expresses the imaginary part of an inner product of a first signal at a first point in time and a second signal at a second point in time, the first and second signals being provided to said quadrature modulator, obtaining a second value that expresses the imaginary part of an inner product of the feedback signals corresponding to said first signal and second signal, and obtaining an amount of the angle deflection between the real axis and the imaginary axis in a signal point arrangement based on a ratio of the first value to the second quantity; and adjustment means for adjusting the first inphase signal component and the first orthogonal signal component that such that said angle deflection is compensated for.

18. The quadrature modulation system as claimed in claim 17, wherein said angle deflection calculation means obtains said angle deflection by using an arc-cosine function, to the argument of which the ratio of the first value to the second value is substituted.

19. A quadrature modulation system wherein a first inphase signal component and a first orthogonal signal component are input, and are provided to a quadrature modulator for outputting an output signal that is quadrature modulated by the quadrature modulator, a part of said output signal serving as a feedback signal consisting of a second inphase signal component and a second orthogonal signal component, comprising:

mismatch amount calculation means for carrying out Fourier transformation of the feedback signal, detecting an unnecessary signal component contained in said feedback signal, and calculating at least one mismatch amount of a time difference between the first inphase signal component and the first orthogonal signal component, an amount of amplitude difference between the first inphase signal component and the first orthogonal signal component, and an angle deflection between the real axis and the imaginary axis of a signal point arrangement based on said unnecessary signal component; and adjustment means for adjusting the first inphase signal component and the first orthogonal signal component such that said amount of mismatching is compensated for.

20. A quadrature modulation system wherein a first inphase signal component and a first orthogonal signal component are input, and are provided to a quadrature modulator for outputting an output signal that is quadrature modulated by the quadrature modulator, a part of said output signal serving as a feedback signal consisting of a second inphase signal component and a second orthogonal signal component, comprising:

means for calculating a first average that is an average of products of the first inphase signal component and the second inphase signal component;

means for calculating a second average that is an average of products of the first inphase signal component and the second orthogonal signal component;

means for calculating a third average that is an average of products of the first orthogonal signal component and the second inphase signal component;

means for calculating a fourth average that is an average of products of the first orthogonal signal component and the second orthogonal signal component;

mismatch amount calculation means for obtaining at least one of mismatch amounts of a time difference between the first inphase signal component and the first orthogonal signal component, an amount of amplitude difference between the first inphase signal component and the first orthogonal signal component, and an angle deflection between the real axis and the imaginary axis of a signal point arrangement based on the first average, the second average, the third average, and the fourth average; and adjustment means for adjusting the first inphase signal component and the first orthogonal signal component such that said amount of mismatching is compensated for.

21. The quadrature modulation system as claimed in claim 20, wherein said mismatch amount calculation means comprises:

time difference calculating means for obtaining the time difference between the first inphase signal component and the first orthogonal signal component based on comparison of a sum of a square of the first average and a square of the second average, and a sum of a square of the third average and a square of the fourth average, respectively;

amplitude difference calculation means for obtaining a first ratio that is a ratio of a mean-square value of the first inphase signal component to a square root of a sum of a square of the first average and a square of the second average, obtaining a second ratio that is a ratio of the mean-square value of the first orthogonal signal component to a square root of a sum of a square of the third average and a square of the fourth average, and obtaining an amount of the amplitude difference between the first inphase signal component and the first orthogonal signal component based on the first and the second ratios; and angle deflection calculation means for obtaining the angle deflection between the real axis and the imaginary axis of the signal point arrangement based on a ratio of the first average and the second average, and a ratio of the third average and the fourth average.

22. The quadrature modulation system as claimed in claim 20, wherein the first, the second, the third, and the fourth averages of the feedback signal are obtained with the real axis and the imaginary axis of the signal point arrangement being rotated by a predetermined angle.

* * * * *